US006452837B2

(12) United States Patent
Mori et al.

(10) Patent No.: US 6,452,837 B2
(45) Date of Patent: Sep. 17, 2002

(54) NONVOLATILE SEMICONDUCTOR MEMORY AND THRESHOLD VOLTAGE CONTROL METHOD THEREFOR

(75) Inventors: Seiichi Mori, Tokyo; Hiroyuki Sasaki, Yokkaichi; Hideo Kato, Kawasaki; Hidetoshi Saito, Yokohama, all of (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/745,802

(22) Filed: Dec. 26, 2000

(30) Foreign Application Priority Data

Dec. 27, 1999 (JP) ............................................. 11-369758

(51) Int. Cl.[7] .............................................. G11C 16/04
(52) U.S. Cl. ............................ 365/185.24; 365/185.23; 365/185.3
(58) Field of Search ....................... 365/185.23, 185.24, 365/185.22, 189.2, 185.29, 185.3, 189.19

(56) References Cited

U.S. PATENT DOCUMENTS

| 5,438,544 A | * | 8/1995 | Makino ..................... 365/185.3 |
| 5,568,419 A | | 10/1996 | Atsumi et al. ................ 365/185 |
| 5,602,789 A | * | 2/1997 | Endoh et al. ................ 365/201 |
| 6,240,019 B1 | * | 5/2001 | Shiga et al. ............ 365/185.22 |

FOREIGN PATENT DOCUMENTS

| JP | 8-106793 | 4/1996 |
| JP | 10-241376 | 9/1998 |

OTHER PUBLICATIONS

K. Oyama, et al., "A Novel Erasing Technology For 3.3V Flash Memory with 64Mb Capacity and Beyond," International Electron Device Meeting, 1992, pp. 607–610.

Hitoshi Shiga, et al., "A Sampling Weak–Program Method to Tighten Vth–Distribution of 0.5V for Low–Voltage Flash Memories," Symposium on VLSI Circuits Digest of Technical Papers, 1999, pp. 33–36.

Seiji Yamada, et al., "A Self–Convergence Erasing Scheme for a Simple Stacked Gate Flash EEPROM," IEDM Digest of Technical Papers, 1991, pp. 307–310.

* cited by examiner

Primary Examiner—David Nelms
Assistant Examiner—Gene N. Auduong
(74) Attorney, Agent, or Firm—Oblon, Spivak, McClelland, Maier & Neustadt, P.C.

(57) ABSTRACT

This invention discloses a memory cell threshold voltage shift method effective for the erase or write sequence of a nonvolatile semiconductor memory. First, the threshold voltages $V_{TH}$ of a plurality of memory cells are shifted at once to a range whose upper limit is set to an erase verify voltage $V_{EV}$. After this, the lower limit of the threshold voltages $V_{TH}$ shifted at once to the range is shifted to a first overerase verify voltage $V_{OEV1}$ close to the erase verify voltage $V_{EV}$. Then, the lower limit of the threshold voltages $V_{TH}$ shifted to the first overerase verify voltage $V_{OEV1}$ to a second overerase verify voltage $V_{OEV2}$ closer to the erase verify voltage $V_{EV}$.

21 Claims, 37 Drawing Sheets

SELF-CONVERGENCE
OPERATION

WEAK-PROGRAM
OPERATION (SELECTED)

WORD LINE ⎫
BIT LINE  ⎭ ··· SELECTED

WEAK-PROGRAM
OPERATION (UNSELECTED)

WORD LINE ··· UNSELECTED
BIT LINE ··· SELECTED

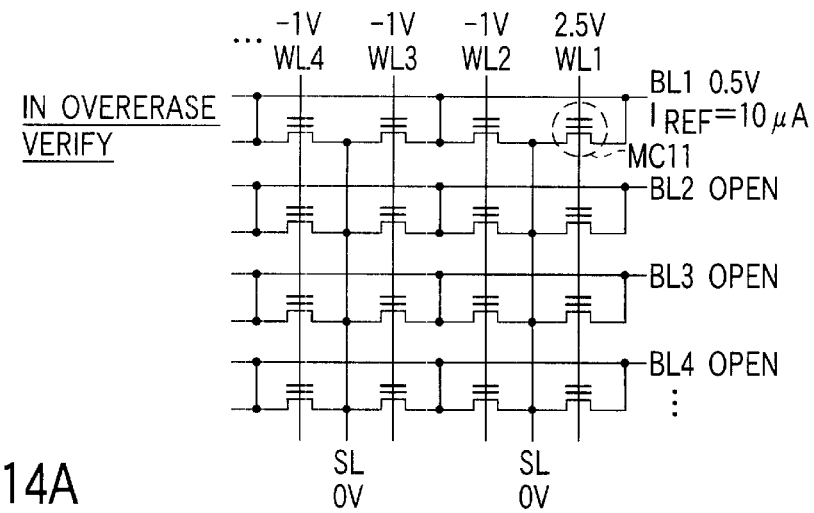
F I G. 14A
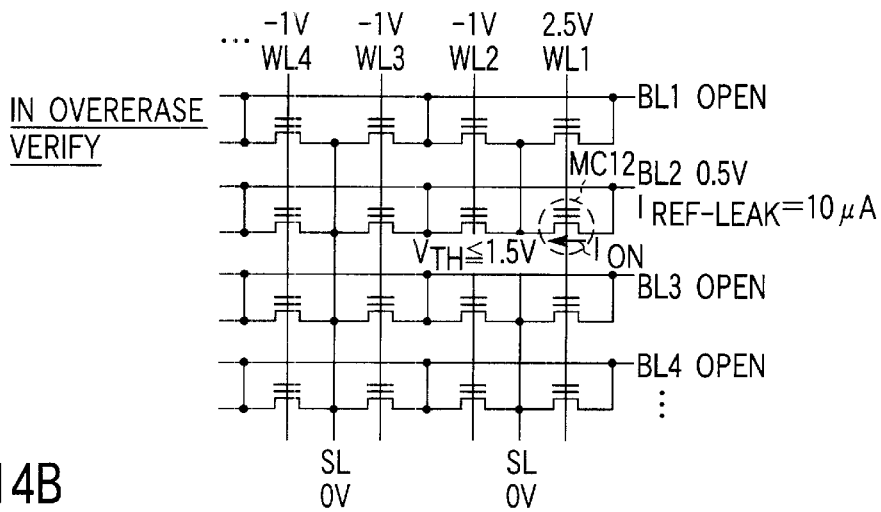
F I G. 14B
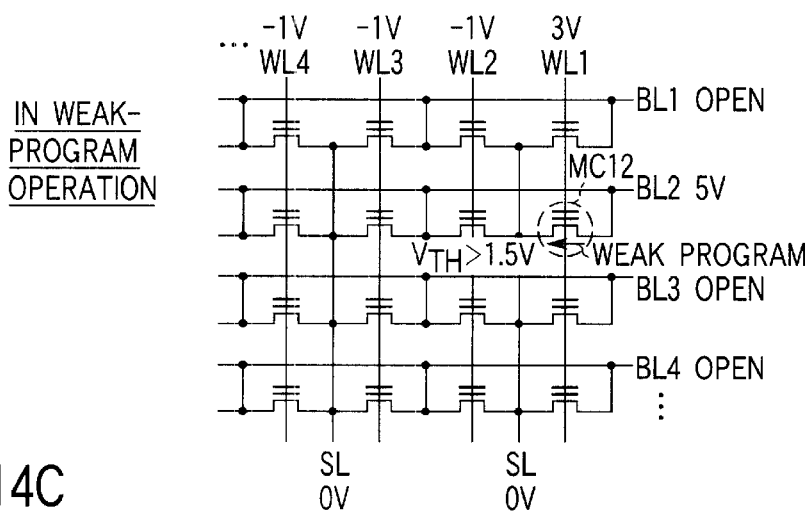
F I G. 14C

IN LEAKAGE BIT LINE CHECK

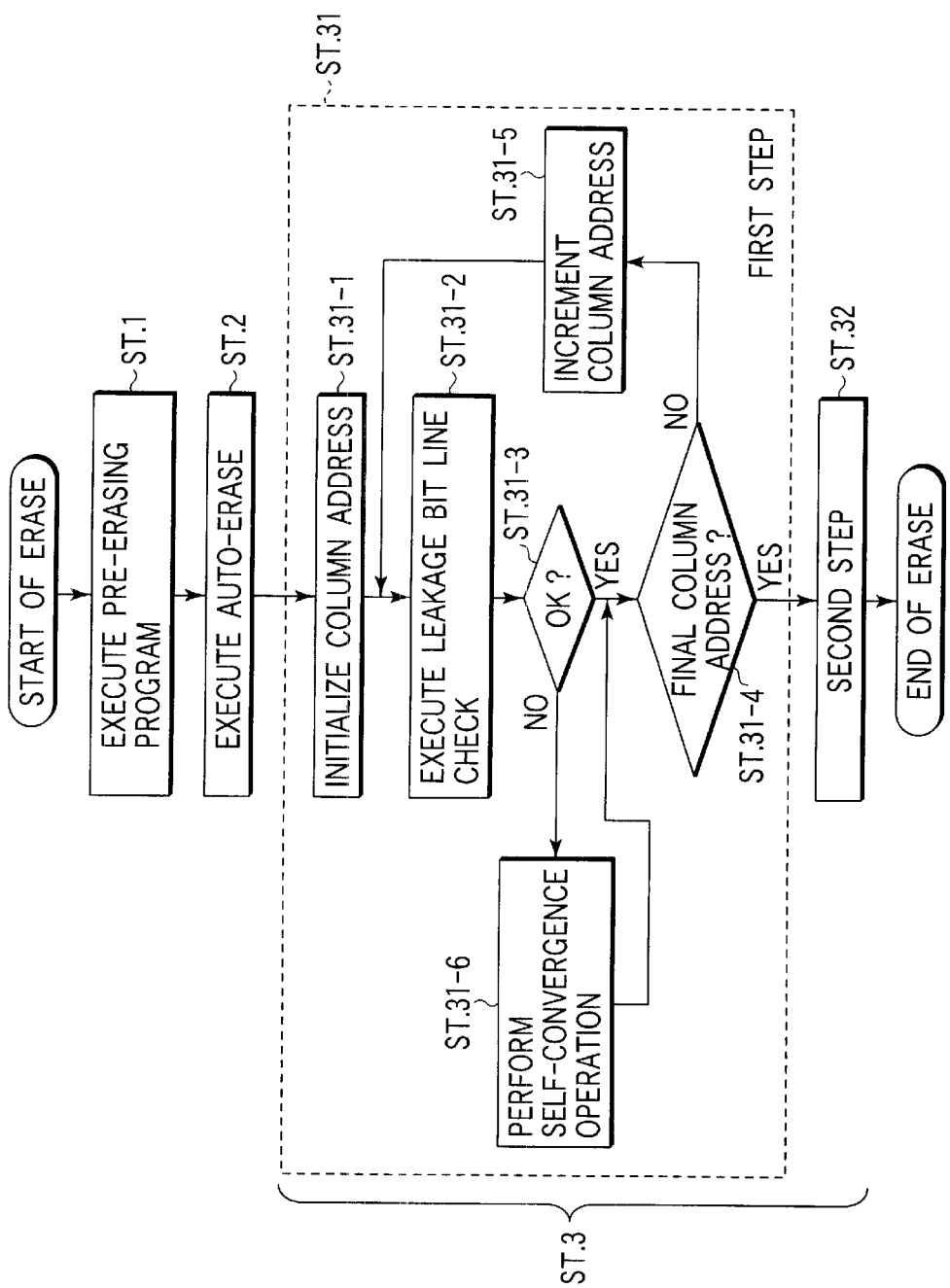
F I G. 22

F I G. 23A

IN SELF-CONVERGENCE
OPERATION

-1V  -1V  -1V  -1V  0V
WL1024 ··· WL4 WL3 WL2 WL1

MEMORY CELL ARRAY

F I G. 23B

IN SELF-CONVERGENCE
OPERATION

-1V  -1V  -1V  0V  -1V
WL1024 ··· WL4 WL3 WL2 WL1

MEMORY CELL ARRAY

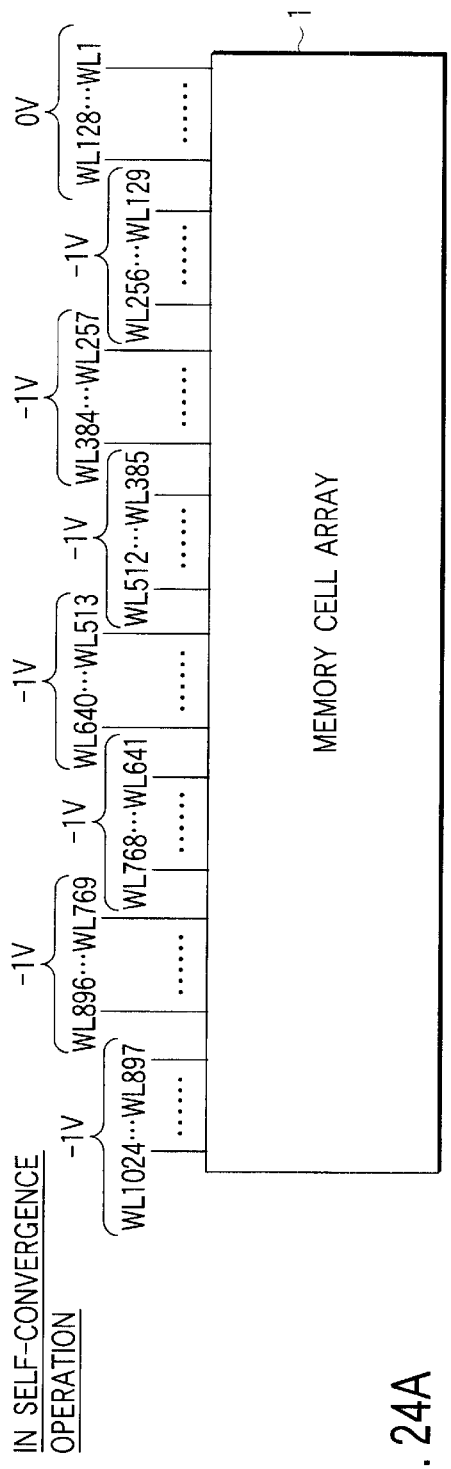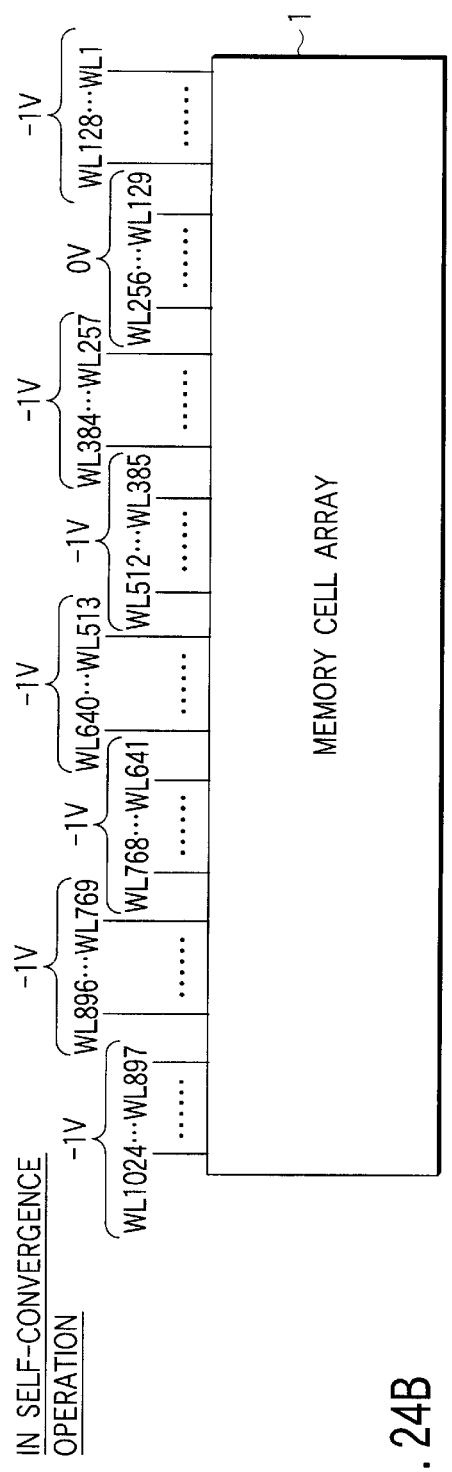
F I G. 24A
F I G. 24B

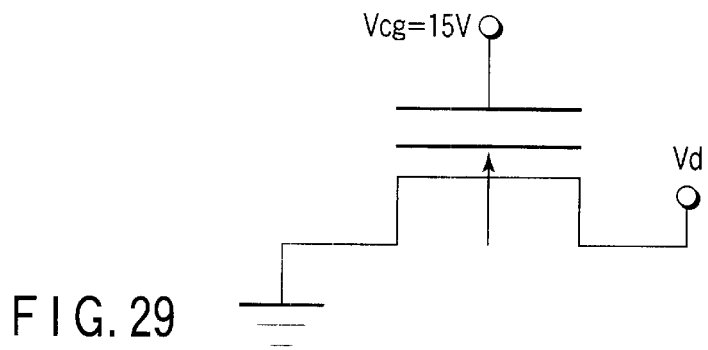
F I G. 29
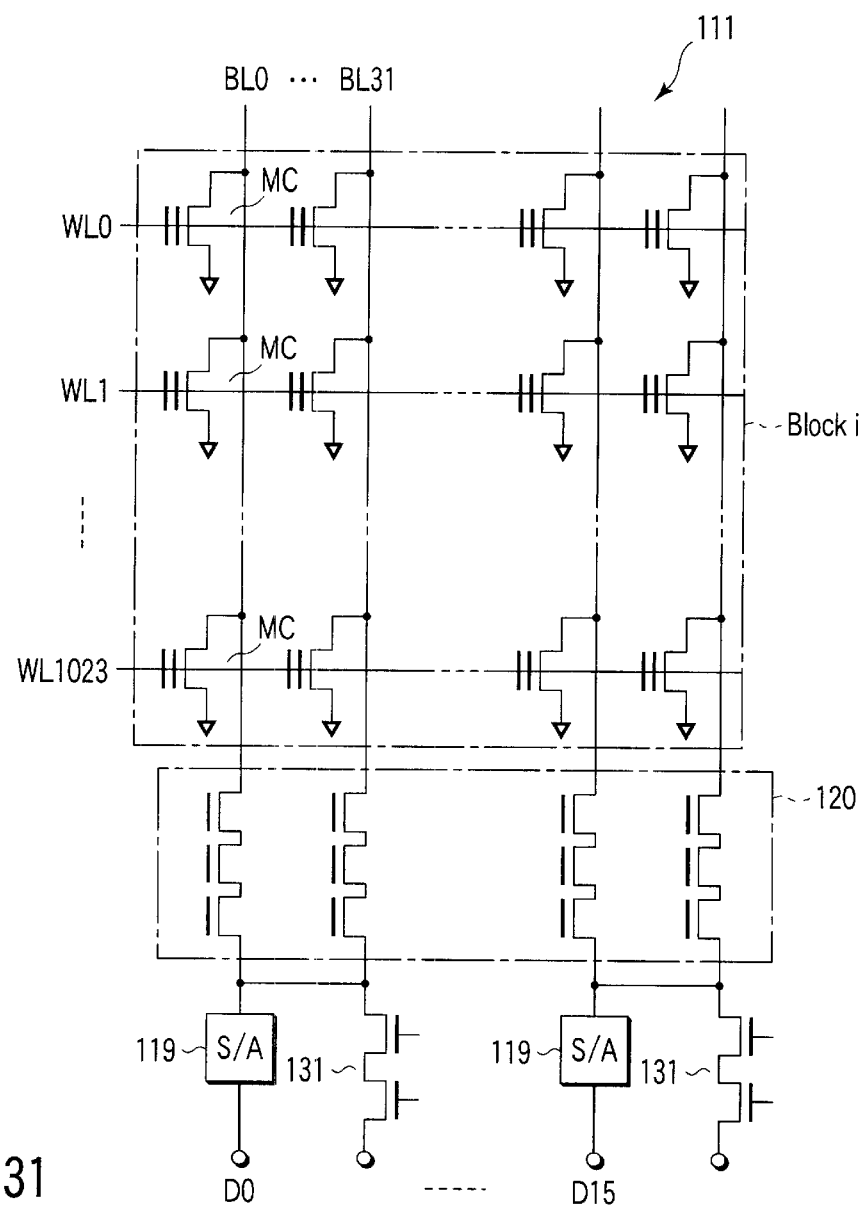
F I G. 31

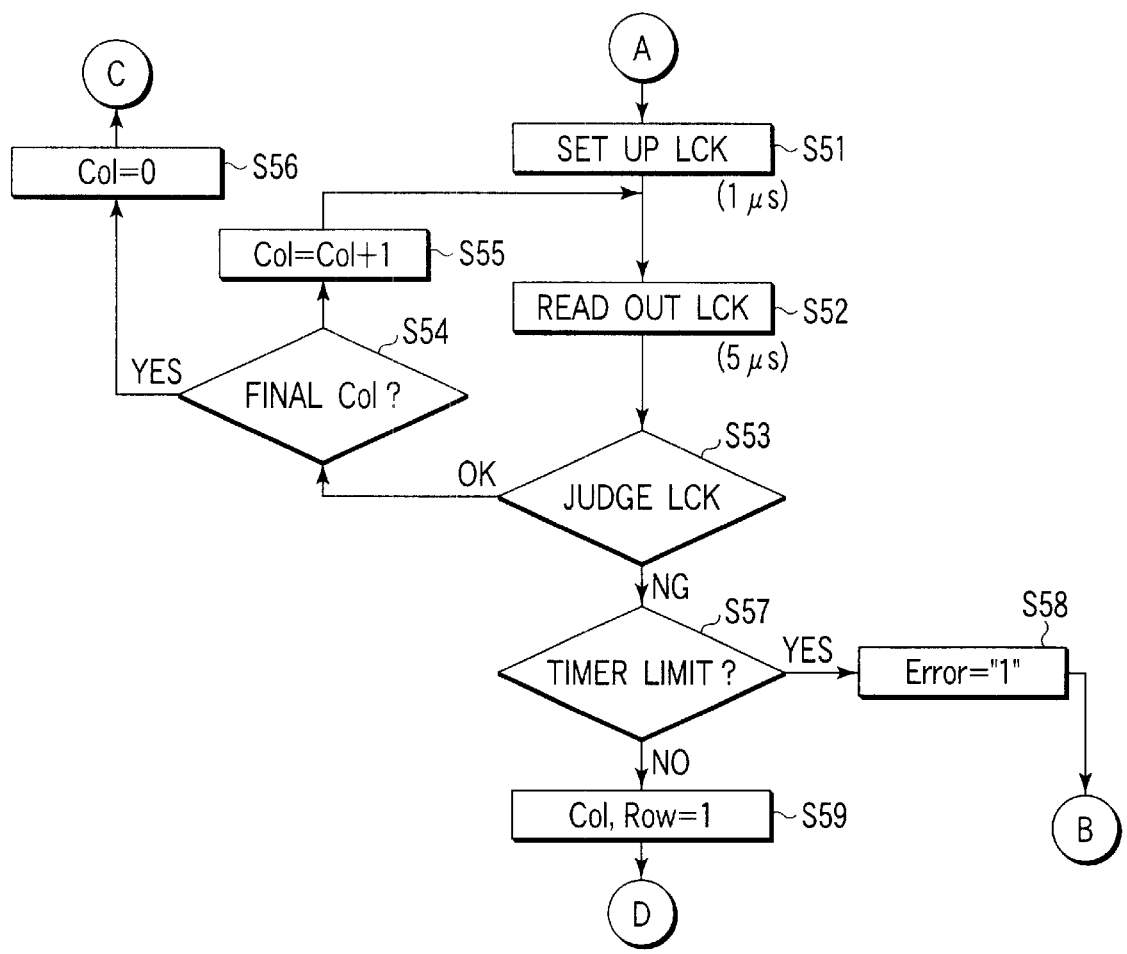
F I G. 35

FIG. 37A INITIAL

FIG. 37B PRE-ERASING PROGRAM

FIG. 37C ERASE

FIG. 37D WEAK-PROGRAM

FIG. 37E ERASE

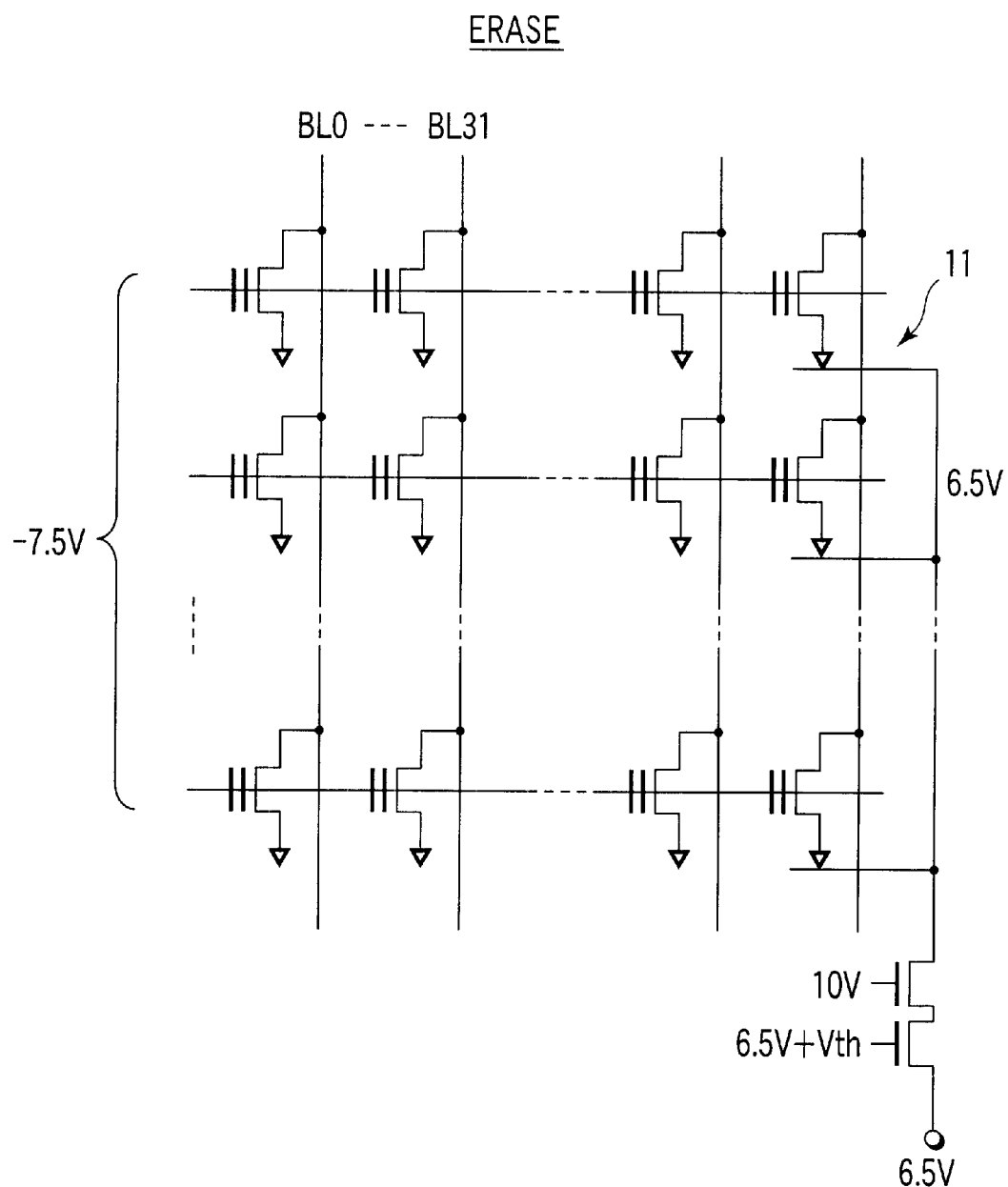
F I G. 40

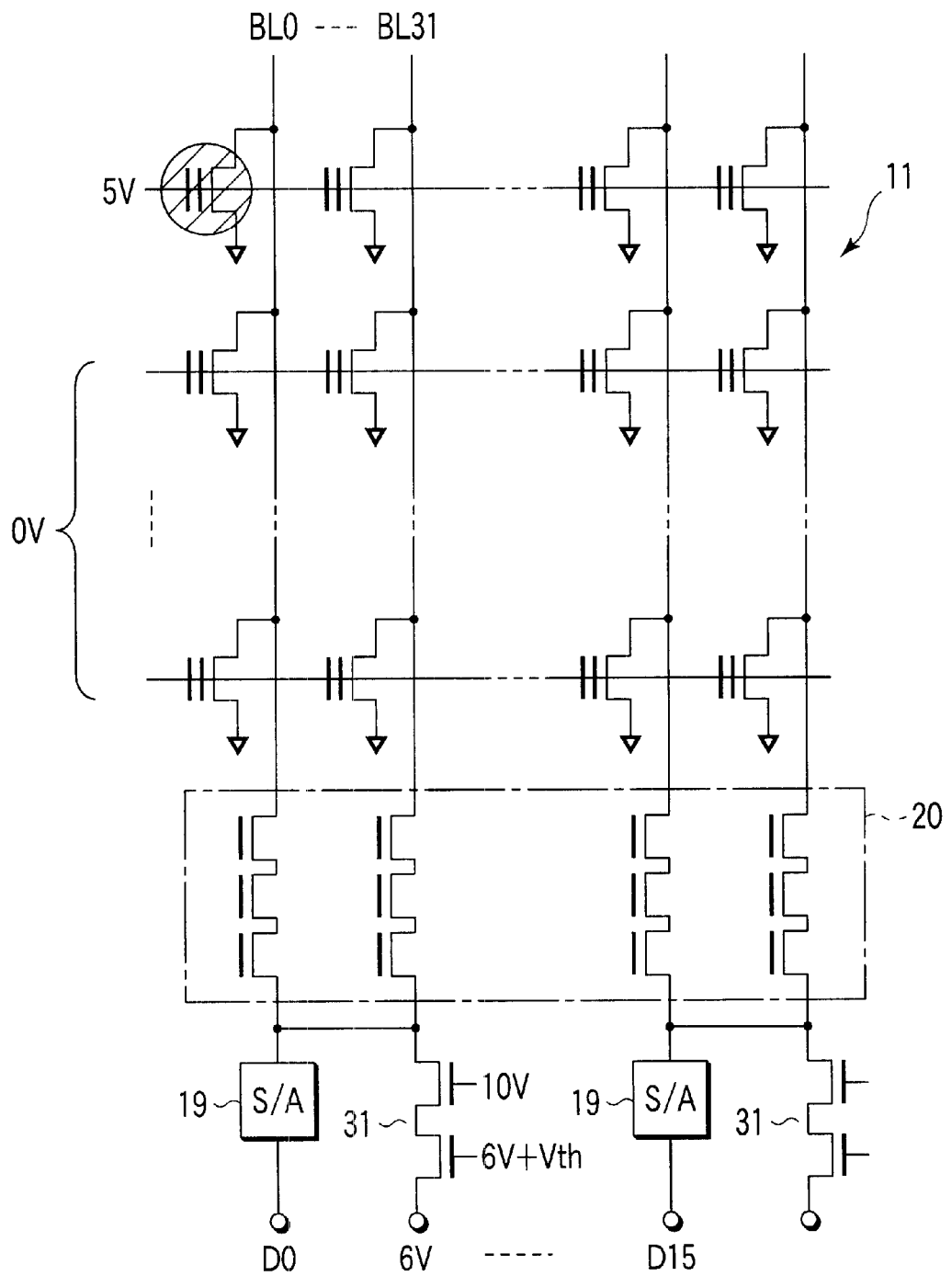
F I G. 43

NONVOLATILE SEMICONDUCTOR MEMORY AND THRESHOLD VOLTAGE CONTROL METHOD THEREFOR

CROSS-REFERENCE TO RELATED APPLICATIONS

This application is based upon the prior Japanese Patent Applications No. 11-062269, filed Mar. 9, 1999; and No. 11-369758, filed Dec. 27, 1999, the entire contents of which are incorporated herein by reference.

BACKGROUND OF THE INVENTION

The present invention relates to a technique of controlling the threshold voltage of a nonvolatile semiconductor memory and, more particularly, to a technique of shifting the threshold voltage of an overerased cell to an appropriate threshold voltage range.

A nonvolatile semiconductor memory conventionally uses a scheme of injecting hot electrons from the drain side to the floating gate to write data in a selected memory cell (to be simply referred to as a cell hereinafter) and removing electrons from the floating gate to the source diffusion layer or to the substrate through the entire channel surface on the basis of the mechanism of a Fowler-Nordheim tunnel current to erase data. Cells constitute one block in units of, e.g., 64 kbytes (512 kbits). In the erase, data are flash-erased at once in units of blocks. The distribution of the threshold voltage of the cell in the flash erase will be described with reference to FIG. 1.

As shown in FIG. 1, erase operation is repeatedly performed until the latest erased bit obtains a desired threshold voltage $V_{TH}$. This voltage is called an erase verify voltage $V_{EV}$. The value of the erase verify voltage $V_{EV}$ is preferably set as small as possible to increase a difference $\Delta V$ between the voltage applied to a selected word line and the value of the erase verify voltage $V_{EV}$ in the data read. The larger the voltage difference $\Delta V$ becomes, the larger the ON current flowed by the cell becomes. Hence, the data can be read out at a higher speed, and the performance of the nonvolatile semiconductor memory improves.

In flash erase in units of blocks, since the erase speed varies between the cells, the threshold voltage $V_{TH}$ after the flash erase varies with a certain distribution width D, as shown in FIG. 1. The threshold voltage $V_{TH}$ varies due to various reasons, and generation or disappearance of a trap in the gate oxide film is also related. For this reason, when the rewrite is repeated, the erase speed of a cell suddenly increases or returns to the previous speed again.

When a cell (to be referred to as an overerased cell hereinafter) whose threshold voltage $V_{TH}$ becomes too low because of a high erase speed, e.g., a cell whose threshold voltage $V_{TH}$ is equal to or lower than the voltage applied to unselected word lines in the data read is generated, several problems occur in the subsequent write operation or read operation.

FIG. 2 is a circuit diagram showing the cell array of a nonvolatile semiconductor memory (flash memory).

As shown in FIG. 2, cells MC are arranged as a matrix in the cell array. A drain terminal D of each cell is connected to a bit line BL (BL1, BL2, BL3, BL4, . . . ) running in the horizontal direction in FIG. 2, and a control gate CG is connected to a word line WL (WL1, WL2, WL3, WL4, . . . ) running in the vertical direction in FIG. 2. The source terminal of each cell is connected to a source line SL running in the vertical direction in FIG. 2.

Problems which occur when an overerased cell is generated in the cell array will be described with reference to FIG. 3. FIG. 3 shows the biased state of the cell array in the write operation.

As shown in FIG. 3, assume that an overerased cell (e.g., a cell MC32 in FIG. 3) is generated in the cell array. The overerased cell MC32 flows an excess leakage current $I_{LEAK}$ from its drain terminal D to source terminal S. For this reason, in the subsequent operation, the excess leakage current $I_{LEAK}$ will flow to the bit line BL2 to which the overerased cell MC32 is connected. For example, in the write operation generally performed next to the erase operation, the excess leakage current $I_{LEAK}$ reduces the voltage of the bit line BL2. For this reason, when data is to be written in a cell (e.g., a cell MC12 in FIG. 3) connected to the bit line BL2, the write time increases, or in some cases, the write is disabled.

In a recent nonvolatile semiconductor memory, the bias voltage to be applied to the bit line BL in the write operation is boosted from a low power supply voltage using a charge pump circuit. In such a nonvolatile semiconductor memory, drop of the voltage on the bit line BL particularly tends to occur due to the leakage current $I_{LEAK}$.

Even when the write is possible, if the leakage current $I_{LEAK}$ flows to the bit line BL in the read operation, data of all cells with drain terminals connected to the bit line BL may be erroneously detected as data "1". Even when the detection error for data "1" is avoided, the read speed from the cell with data "0" may be reduced by the leakage current $I_{LEAK}$.

The generation frequency of such an overerased cell increases as the erase verify voltage $V_{EV}$ becomes low.

On the other hand, however, since the performance of the nonvolatile semiconductor memory can improve as the erase verify voltage $V_{EV}$ is lowered, as described above, the erase verify voltage $V_{EV}$ is required to be as low as possible.

To meet this requirement, it has been proposed to employ a function of restoring the excessively low threshold voltage $V_{TH}$ to a desired value after the flash erase.

As one method for this, the bit line BL connected to the cell whose threshold voltage $V_{TH}$ is too low is detected, and a high voltage is applied to the bit line BL while fixing the voltage of the word line WL to a potential of, e.g., almost 0 V. With this operation, the excessively low threshold voltage $V_{TH}$ is raised to a desired value. This method is disclosed in S. Yamada, IEDM Tech. Dig, pp. 307–310 (1991) and currently called a self-convergence method. FIG. 4 shows the biased state of a cell in the self-convergence operation.

With the self-convergence method, however, when the desired threshold voltage is relatively high, a very long time is required to raise the threshold voltage $V_{TH}$ to the desired value, unlike, e.g., the normal write operation. As is apparent from data disclosed in the above reference, a time of several ms or less suffices to raise the threshold voltage $V_{TH}$ to 0 V or more, though a time of several ten ms is required to raise the threshold voltage to 1 V or more. For a recent memory cell having a short channel length, the threshold voltage rises to about −1 to 0 V in a shorter time: for example, the threshold voltage rises to about 0 V in, e.g., about 1 ms. The threshold voltage rises to −1 V in a much shorter time. However, to increase the threshold voltage to a higher level, a long time is often necessary because the speed of rise is saturated even in a microfabricated device. For this reason, when the number of cells whose threshold voltages $V_{TH}$ must be raised is large, an impractical time is required for the entire chip to increase the threshold voltages $V_{TH}$ of all the cells to a desired value of, e.g., 1 V or more using only this method.

In addition, when a plurality of overerased cells are connected to one bit line BL, a leakage current flows through the plurality of overerased cells. Hence, in the self-convergence operation, the voltage of the bit line BL drops, and only this may make the time required to boost the threshold voltage $V_{TH}$ to a desired value very long.

As another method, an overerased cell is detected by scanning the voltage of the word line WL at a predetermined voltage, the detected overerased cell is selected, and desired voltages are applied to the word line WL and bit line BL connected to the selected overerased cell to write data until the threshold voltage $V_{TH}$ rises to a desired value. This method is disclosed in U.S. Pat. No. 5,568,419 and generally called a weak-program method. FIG. 5A shows the biased state of a selected cell in the weak-program operation.

In this weak-program method, electrons are injected from the drain to the floating gate by positively applying desired voltages to the word line WL and bit line BL connected to the overerased cell. For this reason, as in the normal write operation, the threshold voltage $V_{TH}$ can be boosted to a desired value by supplying a write pulse in units of μs to the selected word line and bit line.

In the weak-program method, an overerased cell is selected, and a weak write is executed, unlike the self-convergence method. For this reason, as shown in FIG. 5B, in an unselected cell, the voltage of the word line WL (unselected word line) can be set to, e.g., −1 V, thereby minimizing the current flowed by another overerased cell present on the same bit line BL.

In the weak-program method, however, when the threshold voltage $V_{TH}$ of a cell lowers to a very small value, the overerased cell may not be accurately detected to cause an operation error. This will be described with reference to FIG. 6.

As shown in FIG. 6, unselected word lines (WL2, WL3, WL4, . . . in FIG. 6) are set to a voltage of, e.g., −1 V. Each of the cells connected to the unselected word lines is cut off if its threshold voltage $V_{TH}$ exceeds −1 V.

On the other hand, the selected word line (WL1 in FIG. 6) is set to a voltage higher than the threshold voltage $V_{TH}$ to be detected by a predetermined value, and a read bias voltage of, e.g., 0.5 V is applied to the selected bit line (BL2 in FIG. 6) to make it perform the read operation. For example, to detect a cell whose threshold voltage $V_{TH}$ is equal to or lower than 1 V, a voltage of, e.g., 2 V is applied to the selected word line WL1. In addition, a voltage of 0.5 V is applied to the selected bit line. The unselected bit lines (BL1, BL3, BL4, . . . in FIG. 6) are, e.g., OPEN.

With this biased state, the cell (cell MC12 in FIG. 6) to be detected is selected, and it is detected whether an ON current $I_{ON}$ equal to or larger than a predetermined value flows to the bit line BL2. If not, it is determined that the threshold voltage $V_{TH}$ is "higher than 1 V", and "the weak-program operation is unnecessary".

If the ON current $I_{ON}$ equal to or larger than the predetermined value flows, it is determined that the threshold voltage $V_{TH}$ is "equal to or lower than 1 V", and "the weak-program operation is necessary".

In this way, it is detected whether the selected cell MC12 is an overerased cell. If so, the weak-program operation is executed for the selected cell MC12.

Assume that a cell whose threshold voltage $V_{TH}$ is lower than −2 V is connected to the same bit line BL2 (for example, a cell MC42 in FIG. 6). In this case, since the voltage of the unselected word line WL4 is −1 V, the unselected cell MC42 flows the ON current $I_{ON}$ equal to or larger than the predetermined value. As a consequence, the threshold voltage $V_{TH}$ of the cell MC12 to be detected is determined to be "equal to or lower than 1 V" regardless of the state of the threshold voltage $V_{TH}$.

If the threshold voltage $V_{TH}$ of the selected cell MC12 is higher than 1 V, i.e., the threshold voltage has an appropriate value, the threshold voltage $V_{TH}$ of the selected cell MC12 is erroneously detected. For this reason, the weak-program operation is executed for the selected cell MC12 having the appropriate threshold voltage $V_{TH}$.

The weak-program operation caused by the detection error is repeatedly performed while the unselected cell MC42 flows the ON current $I_{ON}$ equal to or larger than the predetermined value. As a result, the threshold voltage $V_{TH}$ of the selected cell MC12 may continuously increase, exceed the erase verify voltage $V_{EV}$, and then exceed a value for the "1" read in the data read.

When the threshold voltage $V_{TH}$ exceeds the value for the "1" read, it means that the data is not erased ("0" is read in the data read) although the data is erased ("1" is read in the data read). The chip with this phenomenon is "defective".

Assume that a cell (e.g., the cell MC32 in FIG. 7) whose threshold voltage $V_{TH}$ is between −2 V (inclusive) and −1 V (exclusive) is connected to the same bit line BL2, as shown in FIG. 7. In this case, the detection error described with reference to FIG. 6 does not occur, though the unselected cell MC32 flows the leakage current $I_{LEAK}$. This leakage current $I_{LEAK}$ is added to the current flowed by the selected cell MC12 to be detected. This also causes the overwrite in the selected cell MC12.

Assume a design in which the voltage of the selected word line WL1 is set to 2 V, and when the ON current $I_{ON}$ flowing to the selected bit line BL2 is, e.g., 10 μA or less, it is determined that the threshold voltage $V_{TH}$ of the selected cell MC12 exceeds 1 V, and the weak-program operation is ended.

However, if the unselected cell MC32 is flowing the leakage current $I_{LEAK}$ of 5 μA, the weak-program operation is not ended unless the ON current $I_{ON}$ of the selected cell MC12 is 5 μA or less. This means that although the threshold voltage $V_{TH}$ of the selected cell MC12 already exceeds 1 V and has an appropriate value, the weak-program operation is not ended. This may cause the overwrite in the selected cell MC12.

If the overwrite occurs, the above phenomenon that the data is not erased although it is erased occurs.

In addition, when the threshold voltage $V_{TH}$ is still lower than the voltage for the "1" read but is equal to or higher than the erase verify voltage $V_{EV}$, this causes a shortage in the voltage difference ΔV, i.e., a shortage in read current margin. The shortage in margin current delays the read operation.

Furthermore, when the unselected cell MC32 flows the leakage current $I_{LEAK}$, the voltage of the bit line BL2 becomes lower than the original set value due to the leakage current $I_{LEAK}$.

In the weak-program operation, unselected word lines are fixed to −1 V, and a voltage is applied to the drains of the unselected cells MC22, MC32, MC42, which share the bit line BL2 with the selected cell MC12. For this reason, in these unselected cells, the threshold voltages $V_{TH}$ are increased by the same mechanism as that of, e.g., self-convergence. When the threshold voltage $V_{TH}$ of the unselected cell MC32 increases and exceeds −1 V, the unselected cell MC32 is set in the "cutoff state", and the leakage current $I_{LEAK}$ suddenly decreases. As a consequence, the voltage of the bit line BL2, which is lower than the original set value, is suddenly restored to the original set value (suddenly rises).

As described above, the voltage of the bit line BL2 connected to the unselected cell MC32 whose threshold voltage $V_{TH}$ is lower than −1 v sometimes suddenly increases, so the write speed or write amount of the weak-program operation cannot be controlled as designed. When the voltage of the bit line BL2 suddenly rises, data beyond the desired threshold voltage $V_{TH}$ may be written in the selected cell MC12.

This phenomenon especially conspicuously occurs when the step-up method is used together in the weak-program operation. In the step-up method, every time the weak-program operation is repeated for the selected cell MC12, the voltage of the word line WL1 is stepped up. The step-up method is disclosed in, e.g., H. Shiga, Symposium of VLSI Circuit Technical Digest, pp. 33–36 (1999).

The step-up method can increase the threshold voltage $V_{TH}$ to a desired value at a much higher speed as compared to the method of repeating the weak-program operation while keeping the voltage of the selected word line WL1 constant.

However, since the leakage current $I_{LEAK}$ flows to the bit line BL2 connected to the cell MC32 whose threshold voltage $V_{TH}$ is lower than −1 V, the voltage value of the bit line BL2 becomes smaller than the original set value, and the weak-program speed lowers. For this reason, the number of times of repetition of weak-program operation increases, and the number of step-up operation of the selected word line WL1 increases. Consequently, the voltage of the selected word line WL1 increases to a very large value.

In use of such a step-up method, when the voltage of the bit line BL2 is suddenly increased by the above mechanism, a write with a very large value is performed. Hence, the phenomenon that data is written beyond the desired threshold voltage $V_{TH}$ especially conspicuously occurs.

The same phenomenon as described above particularly readily occurs in a nonvolatile semiconductor memory that simultaneously reads/writes data. FIG. 8 is a block diagram of such a nonvolatile semiconductor memory.

As shown in FIG. 8, a nonvolatile semiconductor memory which simultaneously executes the data read and write for a plurality of bit lines has a plurality of I/O circuits 109 in one block. Each of the I/O circuits 109 is connected several bit lines, e.g., 16 bits lines BL1 to BL16, BL17 to BL32, . . . through a column selector 107. A column decoder 108 supplies column selection signals corresponding to a column address to the plurality of column selectors 107 through column selection lines (CSL1 to CSL16). Each of the plurality of column selectors 107 selects one of the 16 bit lines in accordance with the column selection signal and connects the selected bit line to the I/O circuit 109. The output of a charge pump circuit 104 is connected to the connection paths for connecting the I/O circuits 109 and column selectors 107. In the weak-program operation, a write bit line bias voltage is simultaneously supplied from one charge pump circuit 104 to the plurality of bit lines.

In this nonvolatile semiconductor memory, when even one of the plurality of selected bit lines has an excess leakage path, the voltage output from the charge pump circuit 104 lowers. As a result, the voltage values of all of the plurality of selected bit lines become smaller than the original set value.

In the nonvolatile semiconductor memory shown in FIG. 8, even when the self-convergence method is used, the time required for self-convergence increases. This is because when even one of the plurality of selected bit lines has an excess leakage path, the voltage values of all of the plurality of selected bit lines become smaller than the original set value, as described above.

A case wherein a cell having a very low threshold voltage is present on the same bit line has been described above for the descriptive convenience.

Actually, however, even when a number of cells having relatively low threshold voltages are present, the same problem of operation error is posed when the sum of leakage currents is large.

A measure against an operation error in the weak-program operation has disclosed in Jpn. Pat. Appln, KOKAI Publication No. 8-106793 filed by Takahashi et al., in which after a bit line with a leakage is detected, the weak-program operation is executed for all cells on the bit line, and after the leakage is eliminated, a cell having a threshold voltage lower than a desired threshold voltage is detected, and the weak-program operation is executed under the same bias conditions as those for the first weak-program operation. However, this method also has two serious problems. As one problem, when the write is performed in all cells under the same bias conditions as those for the weak-program operation, the write operation is performed even for a cell whose threshold voltage is high and close to the erase verify voltage. Hence, data is further written in that cell, soothe voltage exceeds the erase verify level. FIG. 17 of Jpn. Pat. Appln, KOKAI Publication No. 8-106793 shows a state wherein the threshold voltage of a cell having a high threshold voltage is reduced by the weak-program operation. However, the threshold voltage normally often increases in an actual device in which the erase verify voltage is set to, e.g., 2.5 V or less, and the word line voltage in the weak-program operation is set to 4 V. The actual characteristic is also shown in H. Shiga et al., Symposium of VLSI circuit Technical Digest, pp. 33–36 (1999). As the other problem, a long time is required when the weak-program operation is sequentially executed for all cells. The reason for this is as follows. Since the number of cells connected to a single bit line is 1K to 2K, and it cannot be determined which cell needs the write, the write must be performed while sequentially increasing the voltages of word lines of all cells on that bit line, though the write time for each cell can be shortened. In addition to the actual application time for a memory cell, a time is also required to increasing/decreasing the voltage while switching the word lines. Hence, even when the threshold voltage is to be adjusted to a predetermined range in two steps, for example, the first step for all cells,on a single bit line, and the second step for necessary cells, it is not preferable to execute the two steps disclosed in the prior art using the same potential from the viewpoint of the risk of operation error generation and the operation speed.

BRIEF SUMMARY OF THE INVENTION

The present invention has been made in consideration of the above situation, and has as its main object to provide a nonvolatile semiconductor memory which can restore the threshold voltage of a memory cell, which falls outside a desired range, to the desired range while suppressing any operation error and detection error without reducing the operation speed, and a threshold voltage control method for the memory.

In order to achieve the above object, according to the present invention, the threshold voltages of a plurality of memory cells are shifted at once to a range for which one of the upper and lower levels is set to a first level, and then, for the plurality of memory cells including a memory cell deviating from the second level close to the first level, the other of the upper and lower limits of the shifted threshold voltages is shifted at once to the second level under a first bias condition. As the bias condition at this time, an appropriate bias voltage is applied so that no problem is posed even when the voltage is applied to a cell which does not actually deviate from the second level, and a cell that deviates from the second level reaches the second level at a high speed. More specifically, a so-called self-convergence method of setting the word lines to a low voltage of 0 to −1 V and applying a voltage of 4 to 5 V to a bit line which is detected as a bit line including a cell deviating from the second range is used.

Note that in this operation, a bias may be applied to even a bit line including no memory cell deviating from the second level to simplify the circuit operation.

After this, the other of the upper and lower limits of the threshold voltages shifted to the second level is shifted to the third level closer to the first level than the second level under the second bias condition different from the first bias condition. For example, only a cell deviating from the second level is selected, a voltage of 2 V is applied to the word line of the cell, and a voltage of 4 to 5 V is applied to the drain of the cell. As described above, under the second bias condition, when the same charge injection mechanism is used for the first and second bias conditions, the word line voltage is set to be higher than that under the first bias condition. The word line voltage can be increased to the desired third level in a shorter time by using a step-up method of sequentially boosting the voltage while monitoring the write speed of cells. An unselected word line is fixed to a voltage which does not generate a leakage current that poses a problem for a memory cell at the second level. For example, the voltage is −1 to 0 V.

In such a nonvolatile semiconductor memory, first, the other of the upper and lower limits of the threshold voltages of the plurality of memory cells is shifted at once to the second level in a short time. For this reason, in shifting the other of the upper and lower limits of the threshold voltage to the third level, the plurality of memory cells can. be reliably cut off by applying an appropriate bias to unselected word lines on the basis of the second level. Hence, in shifting the other of the upper and lower limits of the threshold voltage to the third level, even when the weak-program method is used, the threshold voltage can be shifted to a desired range while suppressing, e.g., an operation error and detection error.

Since the other of the upper and lower limits of the threshold voltage is shifted to the third level stepwise, and appropriate bias conditions are used for the respective shift steps, the shift amount per step can be small, as compared to a case wherein the threshold voltage is boosted to the third level at once. For this reason, in shifting the threshold voltage to the second level, for example, even when a self-convergence method of setting all word lines to 0 V or a potential close to 0 V and applying a voltage to the bit line of all cells on the same bit line at once is used, the speed of operation of shifting the threshold voltage is hardly reduced. In addition, after a cell deviating from the second level is made reliably detectable, a memory cell deviating from the third level is detected. For this memory cell, a bias condition different from that in shifting to the second level is set, and the threshold voltage is shifted to the desired value in a short time.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 14A and 14B are views showing the biased states of the cell array in the overerase verify;

FIG. 14C is a view showing the biased state of the cell array in the weak-program operation;

FIG. 22 is a flow chart showing a control method according to the first modification to the second embodiment;

FIGS. 23A and 23B are views showing the biased states of word lines in the self-convergence operation according to the third embodiment of the present invention;

FIGS. 24A and 24B are views showing the biased states of word lines in the self-convergence operation according to the fourth embodiment of the present invention;

FIG. 29 is a view showing the biased state of a cell in the tunnel current convergence operation;

FIG. 31 is an equivalent circuit diagram of the cell array of the flash memory;

FIG. 35 is a flow chart of the erase step of the auto-erase sequence (continued);

FIGS. 37A to 37F are graphs showing a change in threshold value distribution in the auto-erase sequence;

FIG. 40 is a view showing the bias relationship in the erase of the auto-erase sequence;

FIG. 43 is a view showing the bias relationship in the weak-write of the auto-erase sequence.

DETAILED DESCRIPTION OF THE INVENTION

Figure 1:
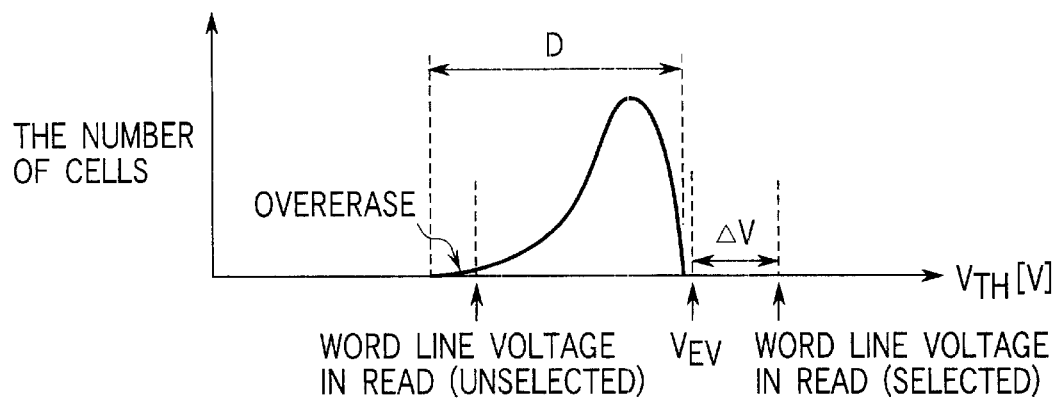
FIG. 1 is a graph showing the distribution of a threshold voltage in a data erase.
Figure 2:
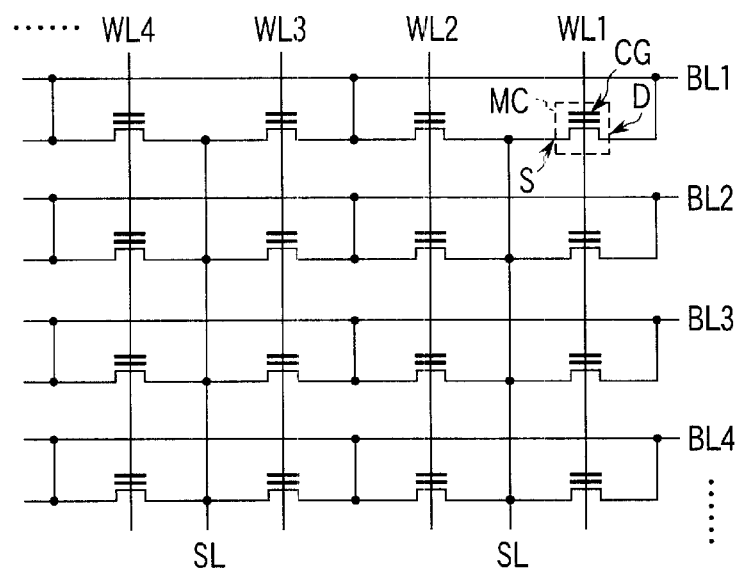
FIG. 2 is an equivalent circuit diagram of the cell array of a nonvolatile semiconductor memory.
Figure 3:
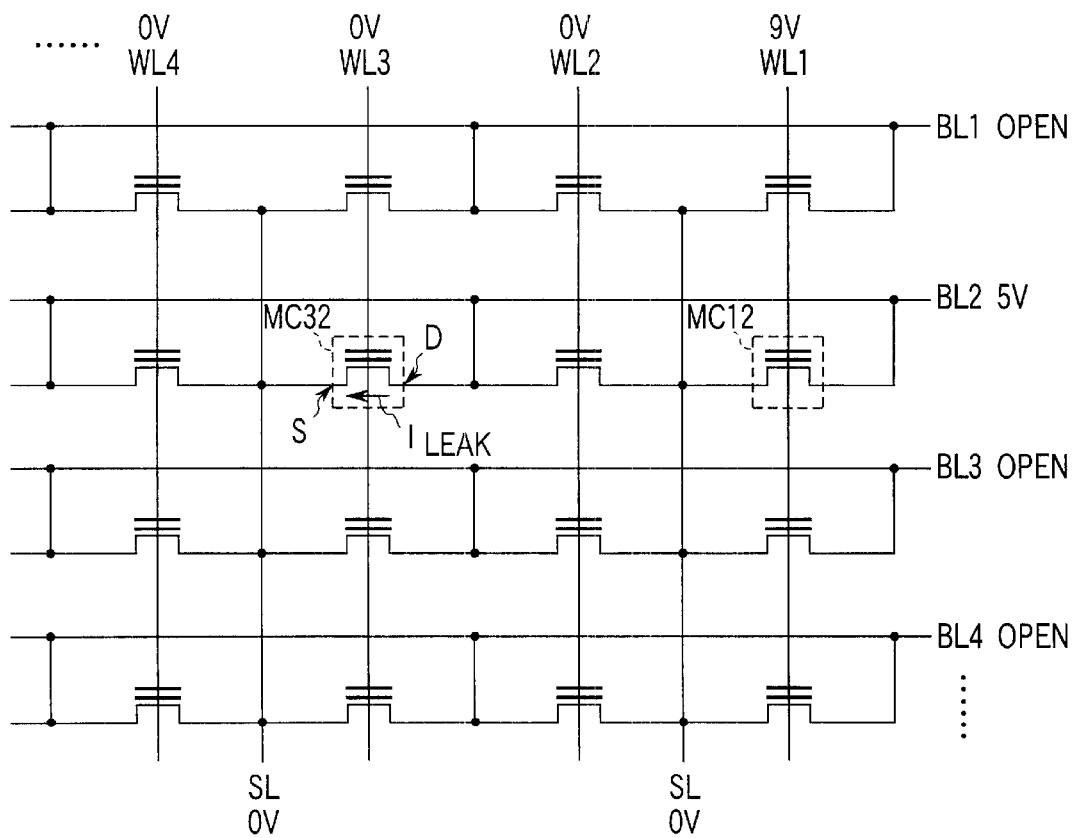
FIG. 3 is a view showing the biased state of the cell array in a write.
Figure 4:
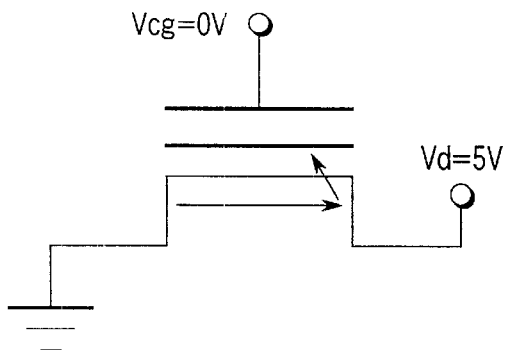
FIG. 4 is a view showing the biased state of the cell array in the self-convergence operation.
Figure 5A:
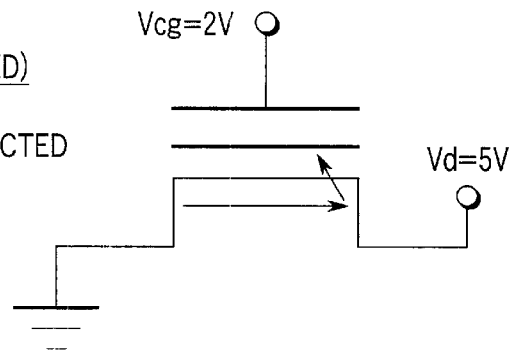
FIG. 5A is a view showing the biased state of a selected cell in the weak-program operation.
Figure 5B:
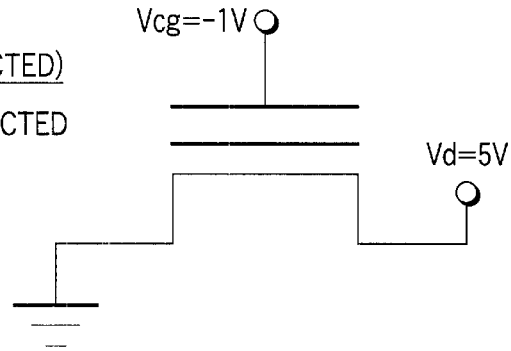
FIG. 5B is a view showing the biased state of an unselected cell in the weak-program operation.
Figure 6:
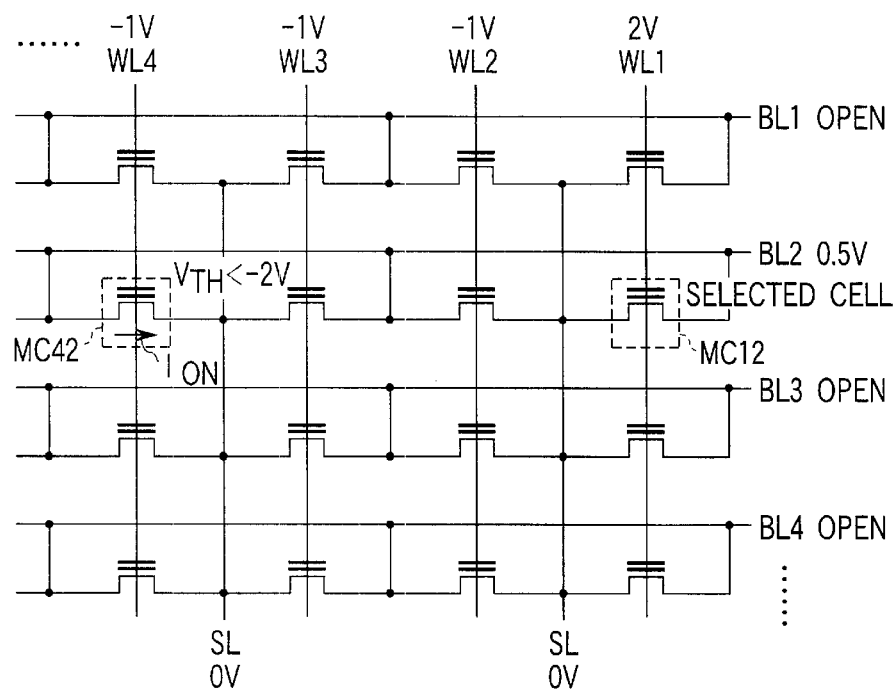
FIG. 6 is a view for explaining a conventional problem.
Figure 7:
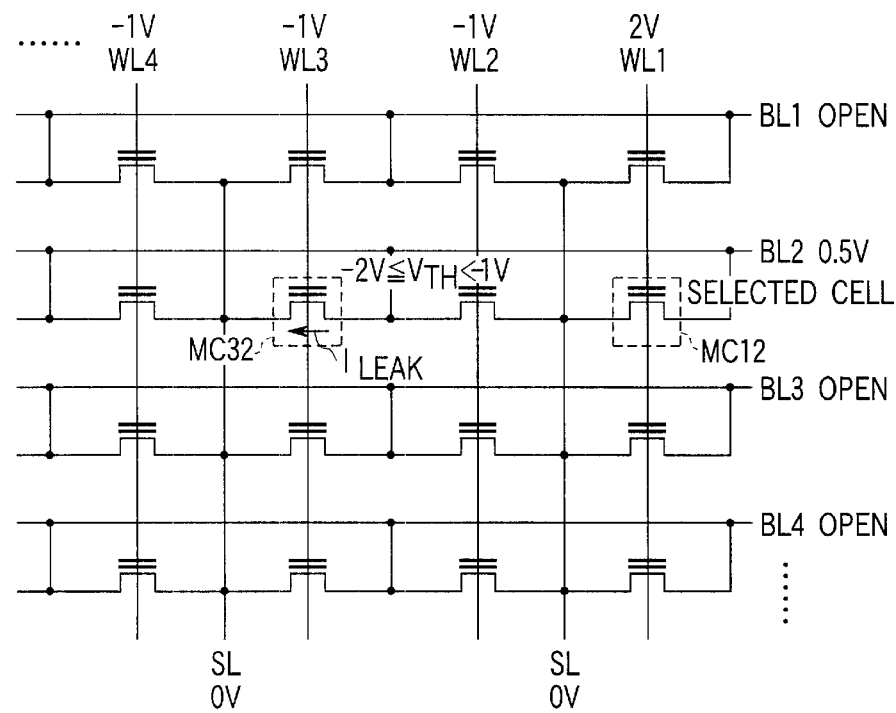
FIG. 7 is a view for explaining another conventional problem.
Figure 8:
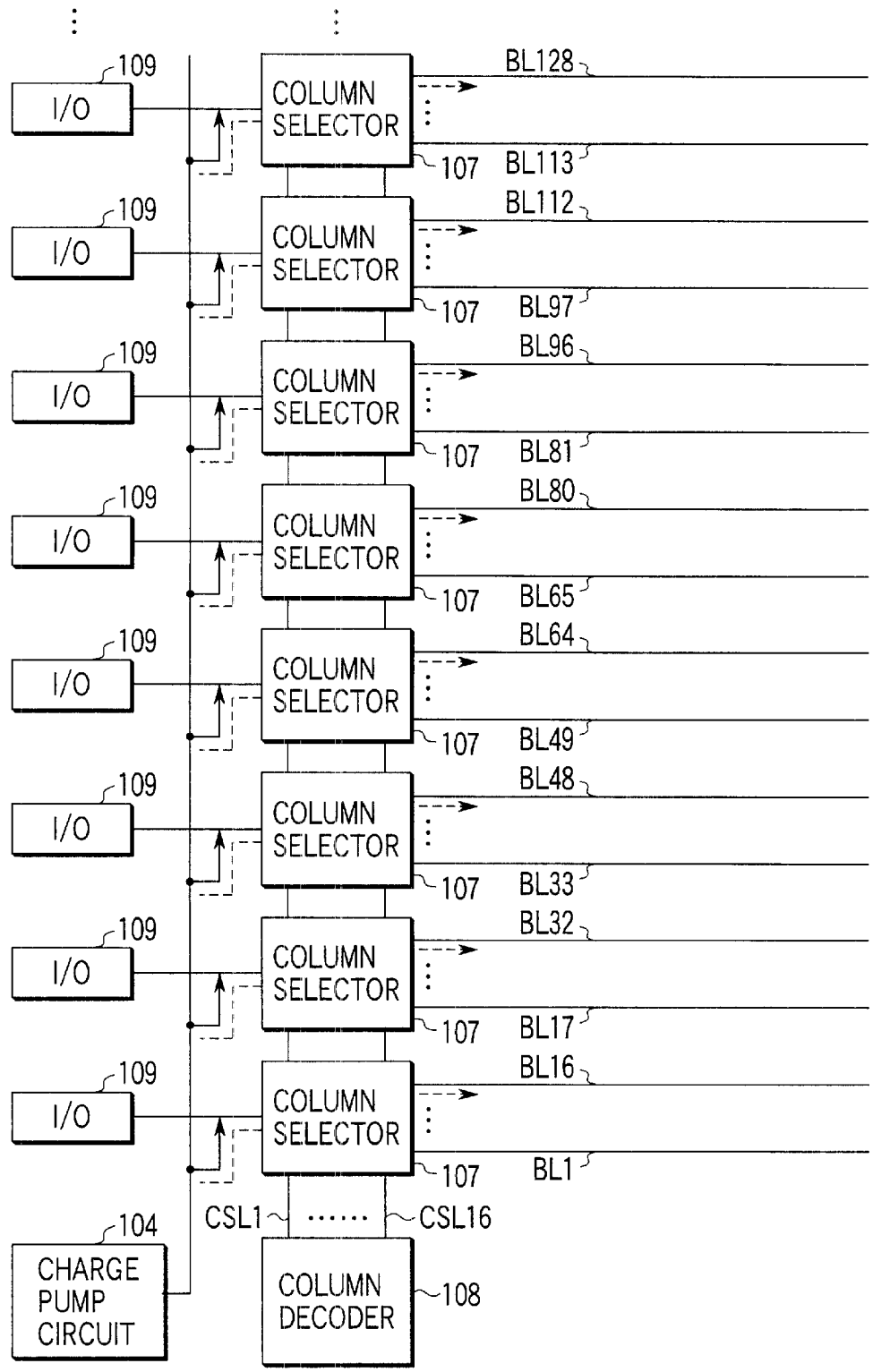
FIG. 8 is a block diagram of a nonvolatile semiconductor memory.

The embodiments of the present invention will be described below with reference to the accompanying drawing. In the following description, the same reference numerals denote the same parts throughout the drawing.

A description will be made below assuming that, for a data read, a data "1" or "1" read is performed when a current flowing to a bit line has a value equal to or larger than a predetermined value (i.e., the cell is ON), and to the contrary, a data "0" or "0" read is performed when the current has a value smaller than the predetermined value (i.e., the cell is OFF). A binary memory for storing data "1" or "0" will be exemplified. However, the present invention can also be applied to a multilevel memory.

First Embodiment

Figure 9A:
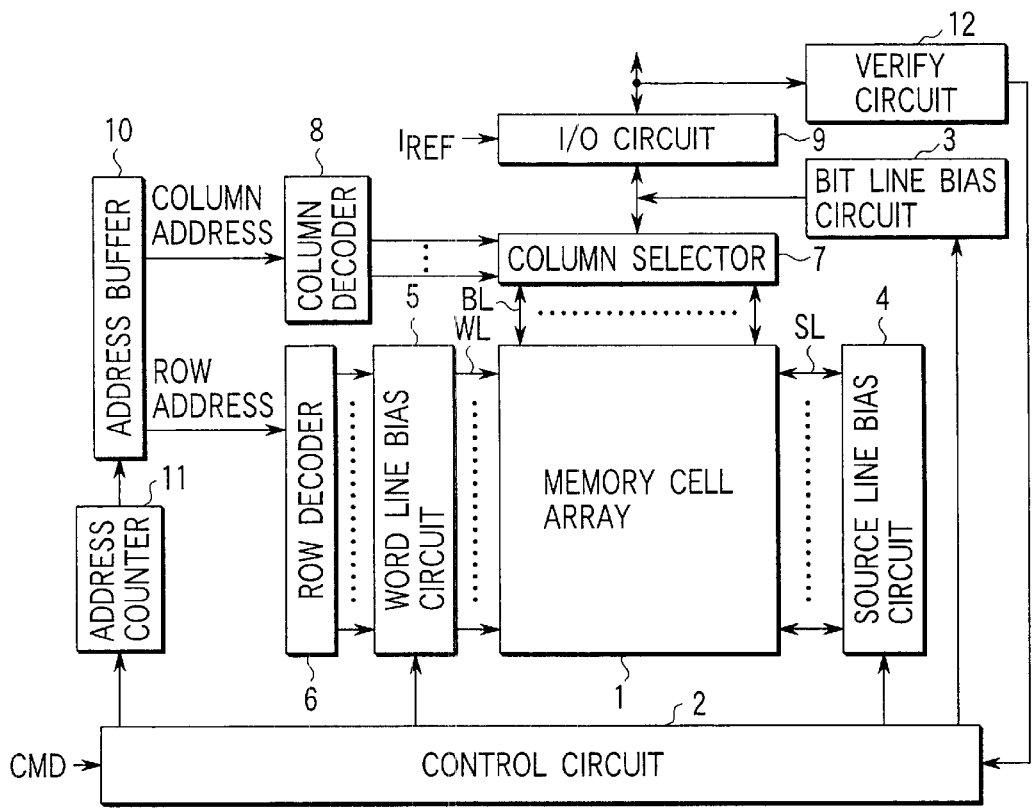
FIG. 9A is a block diagram of a nonvolatile semiconductor memory to which the present invention is applied.

FIG. 9A is a block diagram schematically showing a nonvolatile semiconductor memory to which the present invention is applied.

Figure 9B:
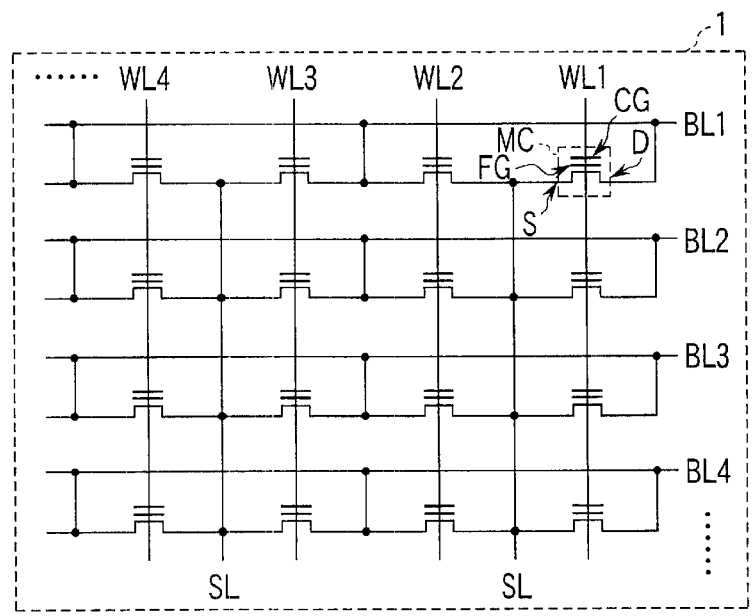
FIG. 9B is an equivalent circuit diagram of the cell array.

As shown in FIG. 9A, the nonvolatile semiconductor memory has a memory cell array 1 (to be simply referred to as a cell array hereinafter). The cell array 1 has a plurality of memory cells (to be simply referred to as cells hereinafter) MC arranged in a matrix. FIG. 9B is an equivalent circuit diagram of the cell array 1. FIG. 9B shows the cell array 1 of a NOR flash memory.

As shown in FIG. 9B, a drain terminal D of each cell MC is connected to a bit line BL, a source terminal S is connected to a source line SL, and a gate (control gate CG) is connected to a word line WL. Each cell MC has a floating gate FG for storing electrons between the channel and the control gate CG. The cell MC can variably set a threshold voltage $V_{TH}$ by changing the amount of electrons stored in the floating gate. Whether the data is "1" or "0" is set in accordance with the threshold voltage $V_{TH}$ and stored in the cell MC.

A control circuit 2 controls the threshold voltage of the cell MC in the data write or data erase on the basis of a command CMD externally supplied. For example, the control circuit 2 especially controls a bit line bias circuit 3, source line control circuit 4, and word line bias circuit 5 to change the biased state of the cell array 1. When the biased state of the cell array 1 is changed, the threshold voltage $V_{TH}$ of the cell MC is controlled.

The bit line bias circuit 3 supplies a bit line bias voltage to the bit line BL. The bit line bias circuit 3 switches the bit line bias voltage between the data read and the data write on the basis of, e.g., a control signal from the control circuit 2.

The source line control circuit 4 supplies a source line bias voltage to the source line SL. The source line bias voltage is normally "0 V". However, in a scheme of removing electrons to the source line SL to erase data, a source line bias voltage VSL is set to be higher than "0 V" in the data erase on the basis of, e.g., a control signal from the control circuit 2.

The word line bias circuit 5 supplies a word line bias voltage to the word line WL selected by a row decoder 6 or all word lines WL. The word line bias circuit 5 switches the word line bias voltage between the data read, data write, and data erase on the basis of, e.g., a control signal from the control circuit 2.

A column selector 7 connects the bit line BL selected by a column decoder 8 to an I/O circuit 9.

The I/O circuit 9 compares a current flowing to the selected bit line BL with a predetermined value $I_{REF}$ in, e.g., the data read to determine whether data is "0" or "1".

An address buffer 10 supplies a row address to the row decoder 6 and a column address to the column decoder 8.

When an address that is normally externally supplied need be generated in the chip, an address counter 11 generates an address in the chip on the basis of, e.g., a control signal from the control circuit 2. The address counter 11 increments the address to sequentially generate different addresses and supplies them to the address buffer 10.

A verify circuit 12 detects whether the threshold voltage $V_{TH}$ has a desired level in the data write or data erase. For example, when a verify is performed after the data write or data erase, the verify circuit 12 detects whether the threshold voltage $V_{TH}$ has a desired level on the basis of whether the I/O circuit 9 determines data "0" or "1".

Figure 10:
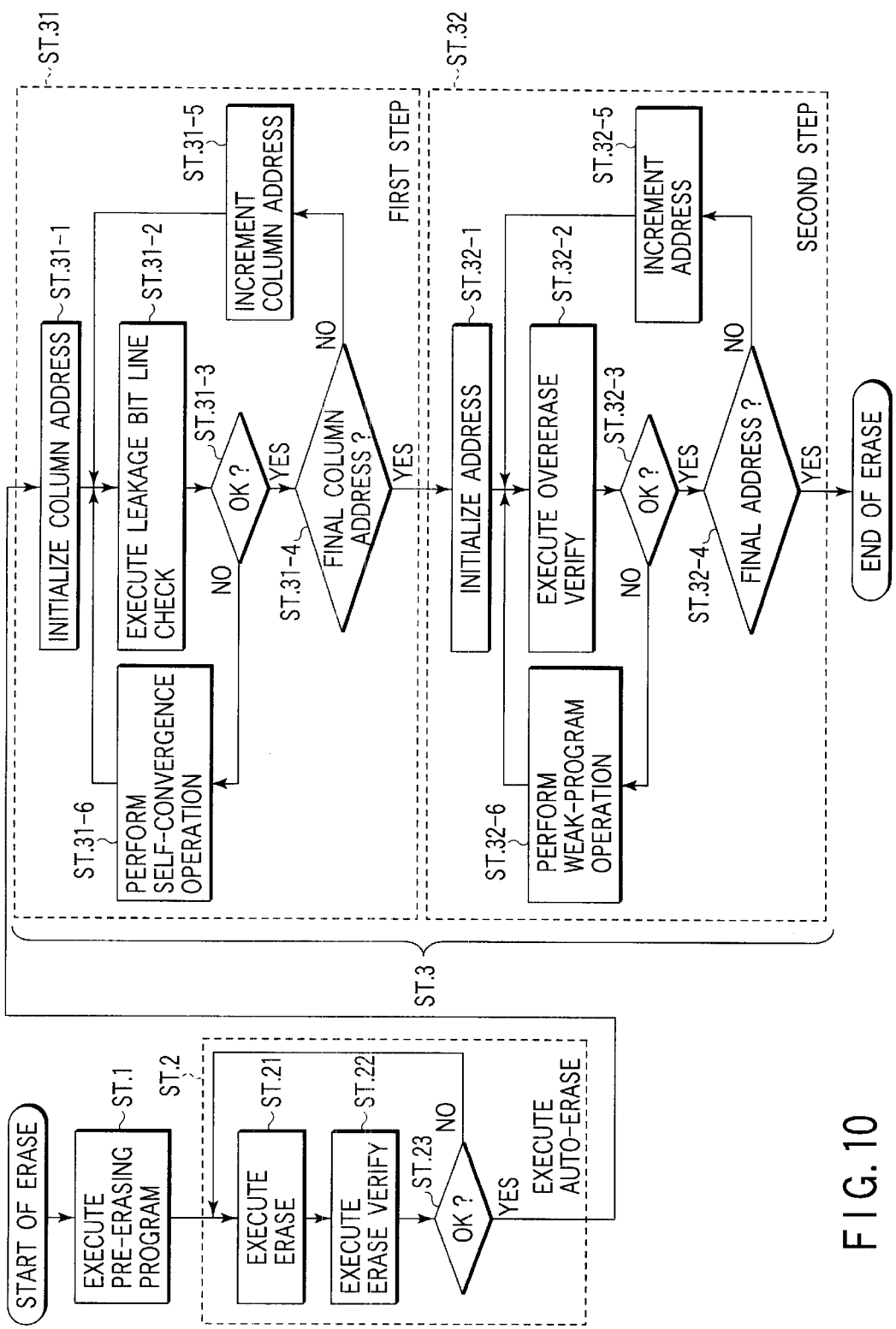
FIG. 10 is a flow chart showing the threshold voltage control method for a nonvolatile semiconductor memory according to the first embodiment of the present invention.

FIG. 10 is a flow chart showing the threshold voltage control method for the nonvolatile semiconductor memory according to the first embodiment of the present invention. Especially, FIG. 10 shows an example in which the present invention is applied to a data erase sequence.

Figure 11A:
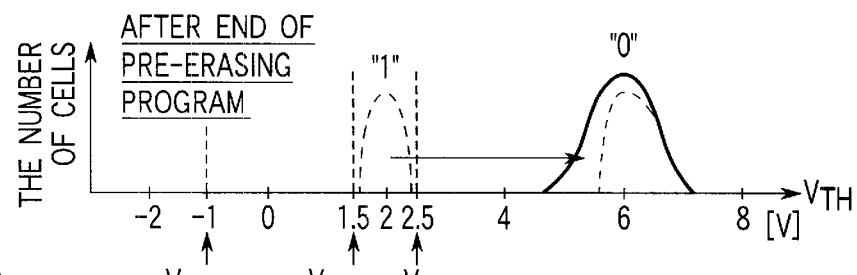
FIGS. 11A to 11E are graphs showing a change in threshold voltage distribution.

As shown in step ST.1 in FIG. 10, pre-erasing program operation is performed before the data erase. In the pre-erasing program operation, a write pulse is supplied to some or all word lines and bit lines in the block as a data erase target to program all cells to data "0" or data "1". FIG. 11A shows the distribution of the threshold voltage $V_{TH}$ after pre-erasing program operation.

In this example, the threshold voltages $V_{TH}$ of all cells are shifted in the direction of data "0" such that the distribution of the threshold voltages $V_{TH}$ becomes opposite to that after the data erase, as shown in FIG. 11A.

The data erase is performed next as shown in step ST.2. Thus, the threshold voltages of all cells are shifted from data "0" to data "1".

Figure 11B:
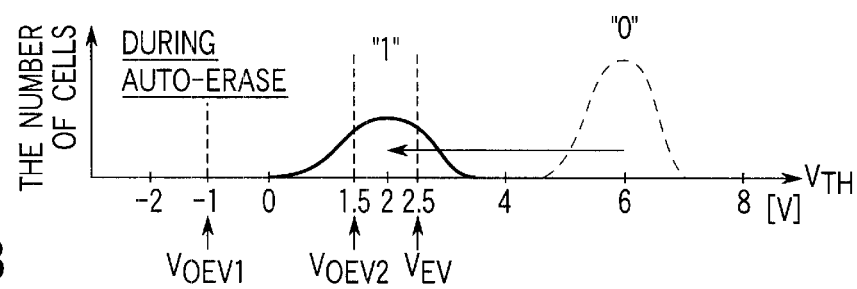
Figure 11C:
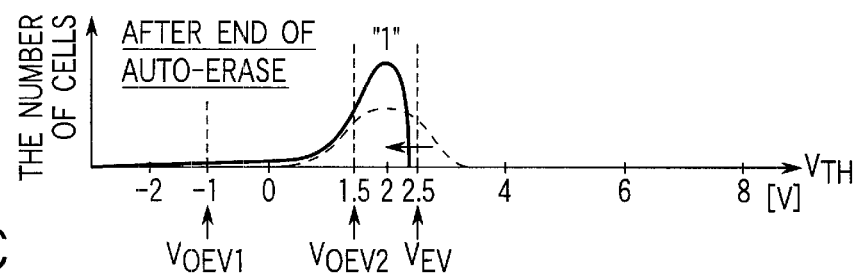

In this example, a scheme called an auto-erase is employed to erase data. In the auto-erase, after the data is erased (ST.21), an erase verify is performed (ST.22), and it is determined whether the threshold voltage $V_{TH}$ of each cell is lower than an erase verify voltage $V_{EV}$ (ST.23). When the threshold voltage $V_{TH}$ is equal to or higher than the erase verify voltage $V_{EV}$ (NO), the data erase is repeated. FIG. 11B shows the distribution of the threshold voltages $V_{TH}$ during the auto-erase. FIG. 11C shows the distribution of the threshold voltages $V_{TH}$ after the auto-erase.

When the erase verify and data erase are repeated, the threshold voltages $V_{TH}$ of all cells are defined to "$V_{TH} < V_{VE}$" first.

A known method can be used for these processes.

The pre-erasing program operation need not always be performed, and it is executed as needed.

As shown in step ST.3, the distribution width of the threshold voltages $V_{TH}$ is reduced. In the first embodiment, a lower limit value $V_{THMIN}$ of the threshold voltage $V_{TH}$ is raised stepwise in at least two steps to reduce the distribution width.

For example, this example comprises a first step (ST.31) of increasing the lower limit value $V_{THMIN}$ to the first lower limit value under the first biasing condition, and a second step (ST.32) of further increasing the first lower limit value to the second lower limit value close to the erase verify voltage $V_{EV}$ (ST.32) under the second biasing condition, as shown in FIG. 10.

Detailed examples of the first step (ST.31) and second step (ST.32) will be described below.

In the first step (ST.31), the lower limit value $V_{THMIN}$ of the threshold voltage $V_{TH}$ is defined to be equal to or higher than a first overerase verify voltage $V_{OEV1}$. The threshold voltages $V_{TH}$ of all cells are defined to "$V_{OEV1} < V_{TH} < V_{EV}$".

As an example for this definition, while a predetermined bias voltage is applied to all word lines in the block as a data erase target, the bit line current flowing to the bit lines is reduced to a predetermined value $I_{REF-LEAK}$ or less.

An example of the predetermined bias voltage to be applied to all word lines is the first overerase verify voltage $V_{OEV1}$, and its numerical value is "−1 V". To increase the threshold voltage $V_{TH}$ to "−1 V" or more, the predetermined value $I_{REF-LEAK}$ is set to be smaller than the predetermined value $I_{REF}$ in the data read.

For example, assume that when the voltage of a word line is higher than the threshold voltage $V_{TH}$ of a cell by "1 V" or more, a current of "10 μA" or more flows to a bit line. This "10 μA" is used as the predetermined value $I_{REF}$ used to discriminate between the "0" read and the "1" read in the data read. In this case, when a bit line current of "10 μA" or more flows, the "1" read is performed. To the contrary, when the bit line current is smaller than "10 μA", the "0" read is performed.

Figure 12A:
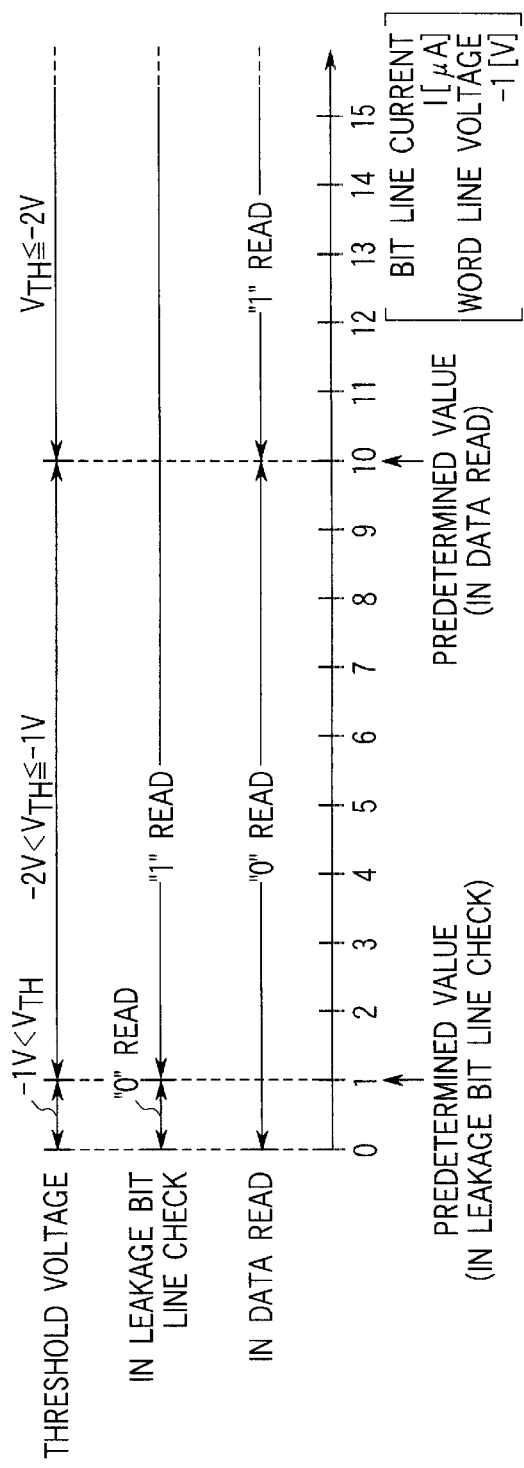
FIG. 12A is a view showing the relationship between a predetermined value and the "0/1" read.

When the predetermined value $I_{REF}$ in the read is set to "10 μA", the predetermined value $I_{REF-LEAK}$ in leakage current detection (to be referred to as leakage bit line check hereinafter) is set to be smaller than "10 μA", e.g., "1 μA". More specifically, in the leakage bit line check, when a current of "1 μA" flows to the bit line, the "1" read is performed, and to the contrary, when a current smaller than "1 μA" flows to the bit line, the "0" read is performed. FIG. 12A visually illustrates this state, and FIG. 12B shows a circuit arrangement for realizing this state.

Figure 12B:
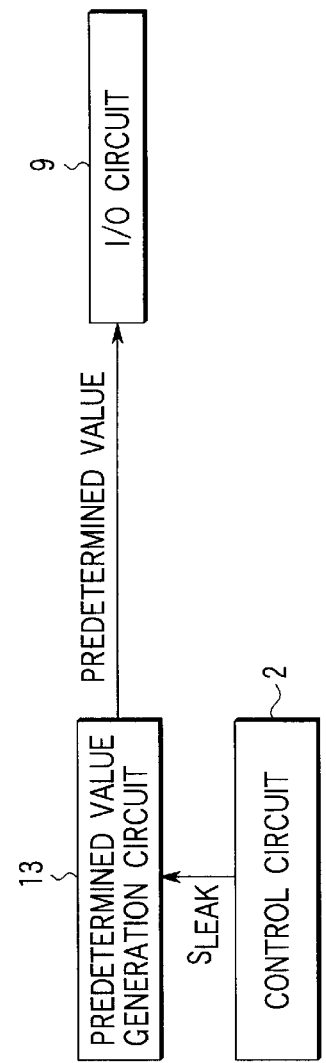
FIG. 12B is a block diagram showing predetermined value switching.

As shown in FIG. 12B, a predetermined value generation circuit 13 supplies a predetermined value to, e.g., the I/O circuit 9. Upon receiving a signal $S_{LEAK}$ for controlling the leakage bit line check, which is output from, e.g., the control circuit 2, the predetermined value generation circuit 13 switches the predetermined value from "10 μA" to "1 μA".

When a bit line current I is "I≧10 μA", the threshold voltage $V_{TH}$ of the cell is supposed to be "$V_{TH} \leq -2$ V" because a predetermined bias voltage applied to the word line is "−1 V".

In addition, when the current I flowing to the bit line is "10 μA>I≧1 μA", the threshold voltage $V_{TH}$ of the cell is supposed to be "−2 V<$V_{TH} \leq -1$ V".

Hence, when the current I flowing to the bit line is "I<1 μA", the threshold voltage $V_{TH}$ of the cell can be "$V_{TH} > -1$ V".

As described above, the predetermined value for discriminating between the "0" read and the "1" read is more strictly set in the leakage bit line check than in the read, and for example, the current flowing to the bit line is set to be smaller than "1 μA". Thus, the threshold voltage $V_{TH}$ can be set to be equal to or higher than, e.g., the first overerase verify voltage $V_{OEV1}$.

The predetermined value $I_{REF-LEAK}$ is set to "1 μA". However, this value can be appropriately set in consideration of some factors including the bit line capacitance.

The self-convergence method can be preferably used to set the current flowing to the bit line to be smaller than "1 μA". An example in which the self-convergence method is used for step ST.31 will be described below.

In step ST.31-1 in FIG. 10, the column address is initialized first.

Figure 13A:
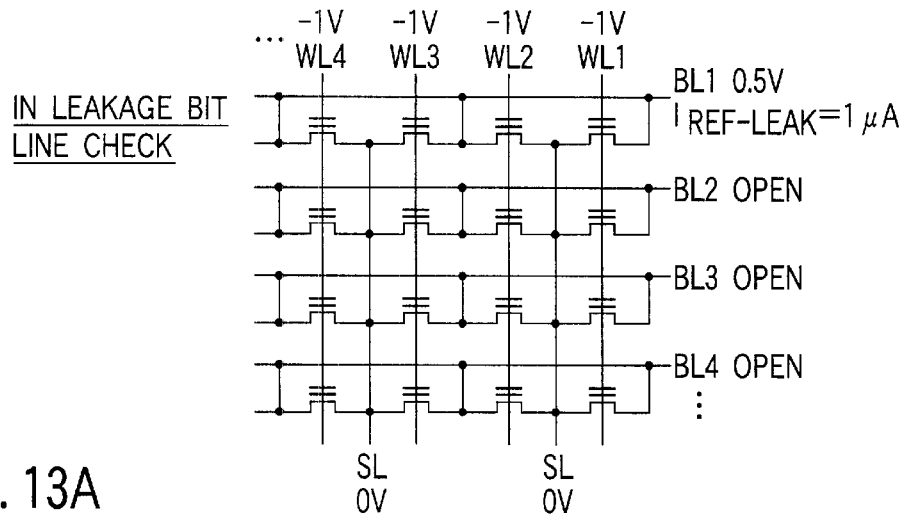
FIGS. 13A and 13B are views showing the biased states of the cell array in a leakage bit line check.

In step ST.31-2, the leakage bit line check is performed. To do this, the bit line BL1 is selected by the initialized column address, and the leakage current of the selected bit line BL1 is detected. The predetermined value $I_{REF-LEAK}$ at this time is set to, e.g., "1 μA" smaller than the predetermined value $I_{REF}$ in the read. FIG. 13A shows the biased state of the cell array 1 in the leakage current detection.

As shown in FIG. 13A, all the word lines WL1, WL2, WL3, WL4, . . . in the block as a data erase target are unselected, and a nonselection bias voltage is applied to the word lines. The numerical value of the nonselection bias voltage is "−1 V". A read bias voltage is applied to the selected bit line BL1. The numerical value of the read bias voltage is "0.5 V". The unselected bit lines BL2, BL3, BL4, . . . are OPEN or set to "0 V". The source lines SL are set to "0 V".

In step ST.31-3, it is determined in the biased state shown in FIG. 13A whether the leakage current flowing to the selected bit line BL1 is smaller than "1 μA". For this determination, the leakage current flowing to the selected bit line BL1 is compared with the predetermined value $I_{REF-LEAK}$ to determine whether the "0" read or "1" read is performed.

When it is determined that the "0" read is performed, i.e., the leakage current is smaller than "1 μA" (YES), the flow advances to step ST.31-4.

In step ST.31-4, it is determined whether the column address is the final column address. If it is determined in step ST.31-4 that "the column address is not the final column address" (NO), the flow advances to step ST.31-5.

In step ST.31-5, the column address is incremented. To do this, for example, "1" is added to the current column address. After the column address is incremented, the flow returns to step ST.31-2.

Figure 13B:
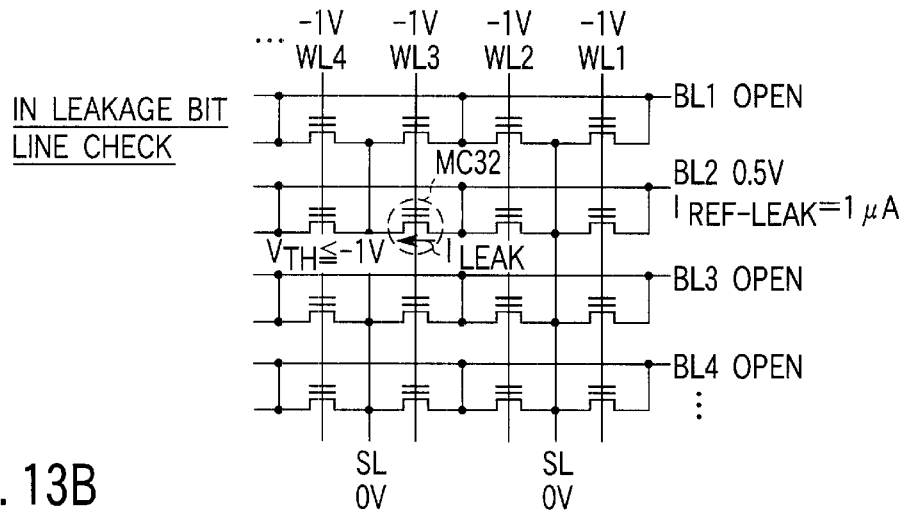

In step ST.31-2, the bit line BL2 is selected in place of the bit line BL1 in accordance with the incremented column address, and the read bias voltage (0.5 V) is applied to the selected bit line BL2, as shown in FIG. 13B.

In step ST.31-3, it is determined in the biased state shown in FIG. 13B whether the leakage current flowing to the selected bit line BL2 is smaller than "1 μA".

When it is determined that the "1" read is performed, i.e., the leakage current is equal to or larger than "1 μA" (NO), it can be supposed that a cell (MC32 in FIG. 13B) whose threshold voltage $V_{TH}$ is equal to or lower than "−1 V" is connected to the bit line BL2, as shown in FIG. 13B.

When the leakage current is equal to or larger than "1 μA" (NO), the flow advances to step ST.31-6.

Figure 13C:
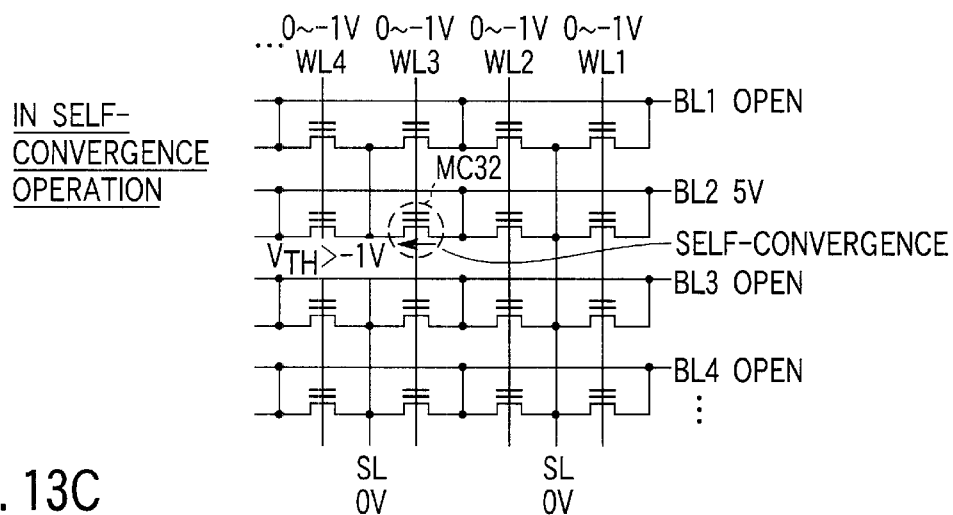
FIG. 13C is a view showing the biased state of the cell array in the self-convergence operation.

In step ST.31-6, the self-convergence operation is performed. FIG. 13C shows the biased state of the "1" read in the self-convergence operation.

As shown in FIG. 13C, a self-convergence bias voltage (self-convergence pulse) higher than the read bias voltage is applied to the bit line BL2. The self-convergence bias voltage is, e.g., equal to the write bias voltage, and its numerical value is "5 V".

A bias voltage optimum for self-convergence, and for example, a voltage of "0 to −1 V" is applied to the word lines WL1, WL2, WL3, WL4, . . . . The unselected bit lines BL1, BL3, BL4, . . . are OPEN or set to "0 V". The source lines SL are set to "0 V".

When the biased state shown in FIG. 13C is set, self-convergence is executed for the cell MC32, and its threshold voltage $V_{TH}$ rises toward a value generally called a self-convergence threshold voltage $V_{TH}^*$.

The self-convergence threshold voltage $V_{TH}^*$ will be described. The self-convergence threshold voltage $V_{TH}^*$ is proportional to, e.g., a threshold voltage $V_{TH}$-UV of a cell after the UV erase. That is, the self-convergence threshold voltage $V_{TH}^*$ can be controlled by adjusting, e.g., the impurity concentration in the channel of the cell (reference: S. Yamada et al., "A SELF-CONVERGENCE ERASING SCHEME FOR A SIMPLE STACKED GATE FLASH EEPROM", IEDN Tech. Dig. pp. 307–310 (1991)).

In the first embodiment, the impurity concentration in the channel is preferably adjusted such that the self-convergence threshold voltage $V_{TH}^*$ of the cell is equal to or higher than the: first overerase verify voltage $V_{OEV1}$. For a cell whose threshold voltage $V_{TH}$ is equal to or lower than "−1 V", the threshold voltage is increased to a value more than the first overerase verify voltage $V_{OEV1}$ by the self-convergence mechanism.

The self-convergence threshold voltage $V_{TH}^*$ is preferably set within the range from the first overerase verify voltage $V_{OEV1}$ (inclusive) to the erase verify voltage $V_{EV}$ (exclusive). This prevents the threshold voltage $V_{TH}$ of the cell from becoming equal to or higher than the erase verify voltage $V_{EV}$ due to the self-convergence mechanism.

After the self-convergence operation, the flow returns to step ST.31-2 again to set the biased state shown in FIG. 13B again.

Next, in step ST.31-3, it is determined in the biased state shown in FIG. 13B whether the leakage current flowing to the selected bit line BL2 is smaller than "1 μA".

When it is determined again that the "1" read is performed, i.e., the leakage current is equal to or larger than "1 μA" (NO), the self-convergence operation is repeated again.

When it is determined that the "0" read is performed, i.e., the leakage current is smaller than "1 μA" (YES), the flow advances to step ST.31-4.

In step ST.31-4, it is determined whether the column address is the final column address. If it is determined in step ST.31-4 that "the column address is not the final column address" (NO), the flow advances to step ST.31-5 to increment the column address, and the operation from step ST.31-2 is repeated.

Figure 11D:
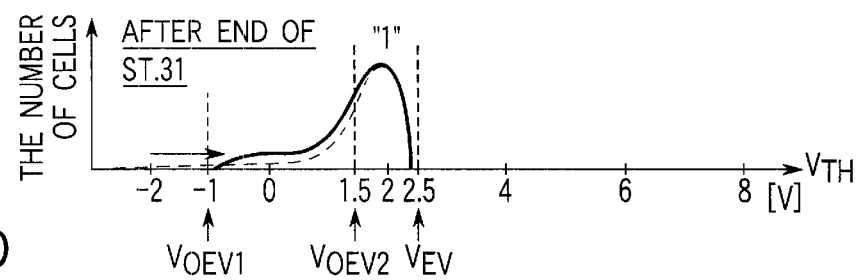

When it is determined that "the column address is the final column address" (YES), the first step (ST.31) the final column address" (YES), the first step (ST.31) is ended. FIG. 11D shows the distribution of the threshold voltages $V_{TH}$ after the first step (ST.31).

As shown in FIG. 11D, after the first step (ST.31), the threshold voltages $V_{TH}$ of all cells are defined to "$V_{OEV1} < V_{TH} < V_{EV}$".

The flow advances to the second step (ST.32).

The weak-program method can be preferably used for the second step (ST.32). An example in which the weak-program method is used for the second step (ST.32) will be described below.

In step ST.32-1 shown in FIG. 10, the address is initialized first.

In step ST.32-2, the overerase verify is performed. FIG. 14A shows the biased state of the "1" read in the leakage current detection.

To do this, first, an overerase verify bias voltage is applied to the word line WL1 selected by the initialized address, as shown in FIG. 14A. When a second overerase verify voltage $V_{OEV2}$ is set to "1.5 V", the overerase verify bias voltage is set to "2.5 V" by adding "1 V" to the second overerase verify voltage $V_{OEV2}$. The "1 V" is added because the current flowing to the bit line is set to "10 μA" when the voltage of the word line becomes higher than the threshold voltage $V_{TH}$ of the cell by "1 V" or more, and the current value is used as the predetermined value $I_{REF}$ in the same as in the read.

A nonselection bias voltage is applied to the unselected word lines WL2, WL3, WL4, . . . . The numerical value of the nonselection bias voltage is, e.g., "−1 V".

The read bias voltage (0.5 V) is applied to the bit line BL1 selected by the initialized address. Thus, the cell MC11 is selected as an overerase verify target cell.

The unselected bit lines BL2, BL3, BL4, . . . are OPEN or set to "0 V". The source lines are set to "0 V".

In step ST.32-3, it is determined in the biased state shown in FIG. 14A whether the ON current flowing to the selected bit line BL1 is smaller than, e.g., A"10 µA". For this determination, the ON current of the selected bit line BL 1 is compared with the predetermined value $I_{REF}$ to determine whether the "0" read or "1" read is performed.

When it is determined that the "0" read is performed, i.e., the ON current is smaller than "10 µA" (YES), the flow advances to step ST.32-4.

In step ST.32-4, it is determined whether the address is the final address. If it is determined that "the address is not the final address" (NO), the flow advances to step ST.32-5.

In step ST.32-5, the address is incremented. To do this, for example, "1" is added to the current address. After the address is incremented, the flow returns to step ST.32-2.

In step S32-2, the read bias voltage (0.5 V) is applied to the selected bit line BL2 selected in place of the bit line BL1 in accordance with the incremented address, as shown in FIG. 14B. Thus, the cell MC12 is selected as an overerase verify target cell.

In step ST.32-3, it is determined in the biased state shown in FIG. 14B whether the ON current flowing to the bit line BL2 is smaller than "10 µA".

When it is determined that the "1" read is performed, i.e., the ON current is equal to or larger than "10 µA" (NO), it can be supposed that the threshold voltage $V_{TH}$ of the selected cell MC12 is equal to or lower than "1.5 V".

Hence, when it is determined that the ON current is equal to or larger than "10 µA" (NO), the flow advances to step ST.32-6.

In step ST.32-6, the weak-program operation is performed. FIG. 14C shows the biased state of the "1" read in the weak-program operation.

As shown in FIG. 14C, a weak-program word line bias voltage (weak-program pulse) is applied to the selected word line WL1. The numerical value of the weak-program bias voltage is "3 V".

A weak-program bit line bias voltage (weak-program pulse) is applied to the selected bit line BL2. The weak-program bit line bias voltage is the same as the write bias voltage, and its numerical value is 5 V. The nonselection bias voltage (−1 V) is applied to the unselected word lines WL2, WL3, WL4, . . . . The unselected bit lines BL1, BL3, BL4, . . . are OPEN or set to "0 V". The source lines SL are set to "0 V".

When the biased state shown in FIG. 14C is set, the weak-program operation is performed for the selected cell MC12, and its threshold voltage $V_{TH}$ increases. In this weak-program operation, voltages are positively applied to the word line WL1 and connected to the selected cell MC12, and electrons are written from its drain. For this purpose,.the weak-program bias voltage to be applied to the selected word line WL1 and the write bias voltage to be applied to the selected bit line BL2 are given as pulses in units of is, µs in the normal write operation.

The weak-program bias voltage is lower than the normal program bias voltage. For example, the numerical value of the normal program bias voltage is "9 V". With this setting, the amount of electrons injected to the floating gate of the selected cell MC12 in the weak program per unit time is smaller than that in the normal program. Hence, the increase amount of the threshold voltage $V_{TH}$ of the selected cell MC12 is smaller than that in the normal program, so the threshold voltage $V_{TH}$ can be increased by a small amount.

After the weak-program operation, the flow returns to step ST.32-2 again to set the biased state shown in FIG. 14B again and determine whether the ON current flowing to the bit line BL2 is smaller than "10 µA".

When it is determined again that the "1" read is performed, i.e., the ON current is equal to or larger than "10 µA" (NO), the weak-program operation is repeated again.

When it is determined that the "0" read is performed, i.e., the ON current is smaller than "10 µA" (YES), the flow advances to step ST.32-4.

In step ST.32-4, it is determined whether the address is the final address. If it is determined that "the address is not the final address" (NO), the flow advances to step ST.32-5 to increment the address, and the operation from step ST.32-2 is repeated.

Figure 11E:
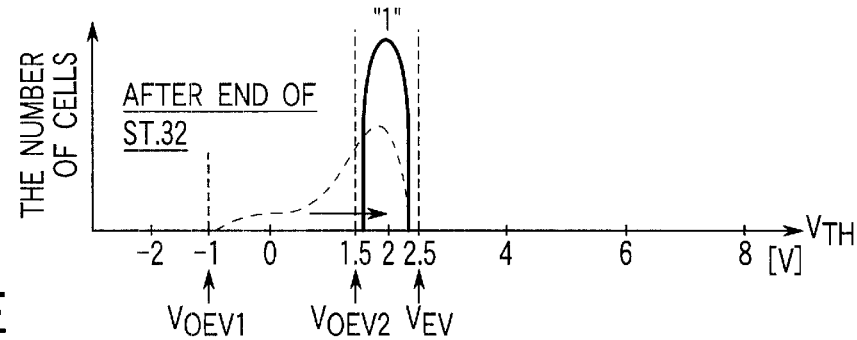

Of the addresses, when the column address is incremented to the final address, the column address returns to the initial value, and subsequently, the row address is incremented to select the word line WL2 in place of the word line WL1. In this way, whether the weak-program operation is necessary is determined for each of all the cells in the block as a data erase target, and the weak-program is performed as needed. When it is determined that the cell is the final cell, i.e., "the address is the final address" (YES), the second step (ST.32) is ended. FIG. 11E shows the distribution of the threshold voltages $V_{TH}$ after the second step (ST.32).

As shown in FIG. 11E, the threshold voltages $V_{TH}$ of all the cells are defined to "$V_{OEV2}<V_{TH}<V_{EV}$". When the second step (ST.32) is ended, the data erase sequence using the first embodiment of the present invention is ended.

In the first embodiment, in the first step (ST.31), the threshold voltages $V_{TH}$ of all cells are shifted to, e.g., "−1 V" or more.

For this reason, when the voltage applied to the unselected word lines is "−1 V" in use of the weak-program method for the second step (ST.32), all the unselected cells connected to the unselected word lines can be sufficiently cut off.

Hence, the unselected cells can be suppressed from flowing a leakage current equal or larger than the predetermined value $I_{REF}$ to the selected bit line, and a detection error of the threshold voltage $V_{TH}$ of the selected cell due to the phenomenon can be suppressed.

In addition, since the leakage current flowed by an unselected cell to the selected bit line decreases, the current flowing to the selected bit line can be defined to almost correspond to the current flowed by the selected cell. For this reason, the overwrite in the selected cell due to the phenomenon that the current flowed by an unselected cell is added to the current flowed by the selected cell can be suppressed.

Furthermore, the leakage current flowed by an unselected cell to the selected bit line decreases, the phenomenon that the voltage of the selected bit line becomes lower than the original set value can also be suppressed. For this reason, the overwrite in the selected cell due to the phenomenon that the lowered voltage of the selected bit line suddenly rises to the original set value can also be suppressed.

In the first step (ST.31), the increase amount of the threshold voltage $V_{TH}$ can be small. For this reason, even when the self-convergence method is used for the first step (ST.31), the time required for the first step (ST.31) can be short. Additionally, a decrease in voltage of the selected bit line due to the leakage current flowed by an unselected cell can be suppressed, and the number of times of repetition of the weak-program operation can be decreased.

Hence, according to the first embodiment, the threshold voltage that falls outside the desired range can be restored to the desired range without reducing the operation speed while suppressing any operation error and detection error.

The threshold voltage control method according to the first embodiment is put into, e.g., the control circuit 2 of the nonvolatile semiconductor memory as shown in FIG. 9 as a data erase sequence.

According to such a nonvolatile semiconductor memory, in the data erase, the threshold voltage that falls outside the desired range can be restored to the desired range without reducing the operation speed while suppressing any operation error and detection error.

Figure 15:
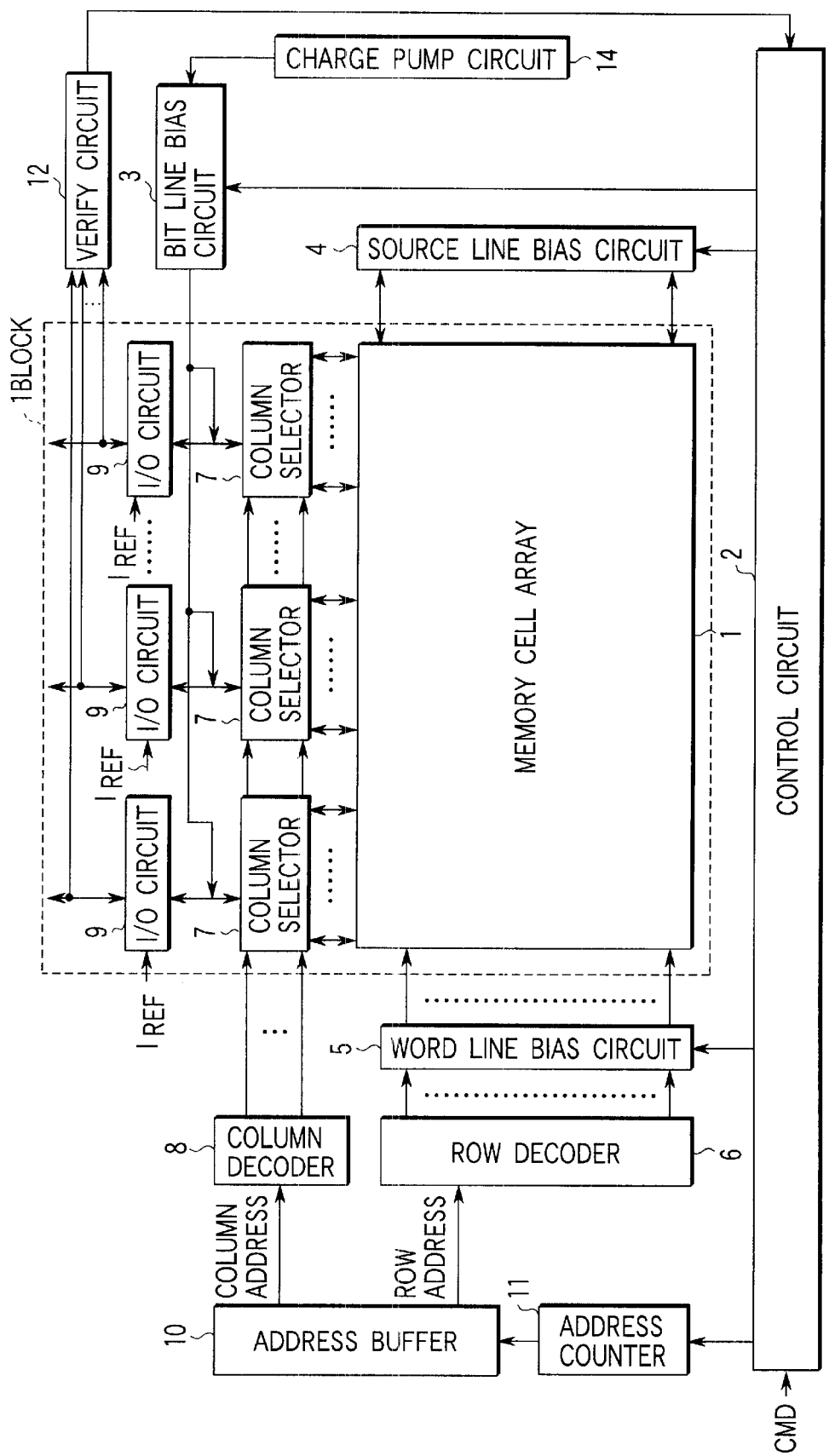
FIG. 15 is a block diagram of another nonvolatile semiconductor memory to which the present invention is applied.

The present invention is especially effective to a nonvolatile semiconductor memory which has a plurality of I/O circuits 9 in one block and simultaneously reads/writes data for a plurality of bit lines, as shown in FIG. 15.

In the nonvolatile semiconductor memory shown in FIG. 15, when an excess leakage current flows to even one of a plurality of selected bit lines, the write bias voltage output from the bit line bias circuit 3 lowers.

Especially, when the write bias voltage is obtained by boosting the power supply voltage using, e.g., a charge pump circuit 14, as shown in FIG. 15, the decrease in write bias voltage is more conspicuous.

According to the present invention, for example, in the second step (ST.32), the leakage current flowed by an unselected cell to the selected bit line can be decreased. The present invention is therefore particularly effective to a nonvolatile semiconductor memory which has a plurality of I/O circuits 9 in one block and simultaneously reads/writes data for a plurality of bit lines, as shown in FIG. 15.

The present invention is also effective to a nonvolatile semiconductor memory which obtains the write bias voltage by boosting, e.g., the power supply voltage using the charge pump circuit 14, as shown in FIG. 15.

Since the method of detecting the threshold voltage of a memory cell is merely an example, many changes and modifications can be made for the bias condition and detection method, and they will be partially described later as modifications. In addition, the optimum absolute values of the bias conditions for a cell whose threshold voltage is to be shifted in two steps change in accordance with the characteristics of the cell.

First Modification to First Embodiment

In the first embodiment, the self-convergence operation is performed for all columns first, and then, the weak-program sequence starts from the first column again.

However, when the self-convergence operation is ended for each column, the weak-program operation may be subsequently performed to eventually set the threshold voltage $V_{TH}$ of the cell MC to be higher than the second overerase verify voltage $V_{OEV2}$, and then, the column address may be incremented.

The sequence is modified so in this first modification.

Figure 16:
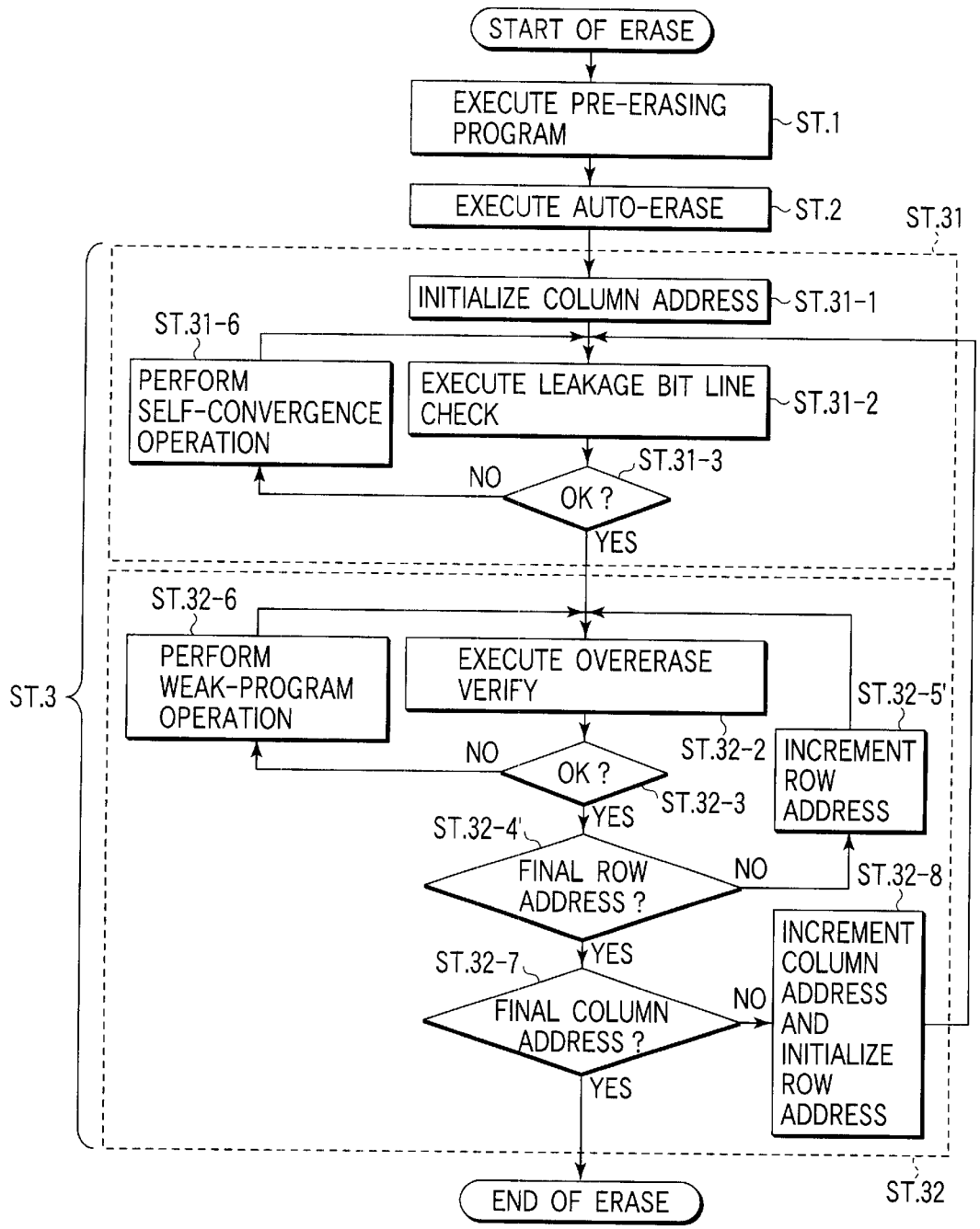
FIG. 16 is a flow chart showing a control method according to the first modification to the first embodiment.

FIG. 16 is a flow chart showing the first modification to the first embodiment.

As shown in FIG. 16, the sequence of the first modification is the same as that shown in FIG. 9 until step ST.31-3. However, when it is determined in step ST.31-3 that the "0" read is performed, i.e., the leakage current is smaller than "1 $\mu$A" (YES), the subsequent sequence is different from that in FIG. 9.

More specifically, as shown in FIG. 16, when it is determined in step ST.31-3 that the leakage current flowing to the selected bit line is smaller than "1 $\mu$A" 0 (YES), the flow advances to step ST.32-2 of the second step (ST.32) without determining whether the column address is the final column address. Then, the overerase verify is performed for the selected cell.

After the overerase verify, it is determined in step ST.32-3 whether the ON current flowed by the selected cell to the bit line is smaller than "10 $\mu$A".

When it is determined that the ON current flowed by the selected cell is smaller than "10 $\mu$A" (NO), the flow advances to step ST.32-6, as in the first embodiment, to execute the weak-program operation, and then, the flow returns to step ST.32-2. On the other hand, when it is determined that the ON current is equal to or larger than "10 $\mu$A" (YES), the flow advances to step ST.32-4' to determine whether the row address is the final row address.

If it is determined that "the row address is not the final row address" (NO), the flow advances to step ST.32-5' to increment the row address and then returns to step ST.32-2.

On the other hand, when it is determined that "the row address is the final row address" (YES), the flow advances to step ST.32-7 to determine whether the column address is the final column address.

If it is determined that "the column address is not the final column address" (NO), the flow advances to step ST.32-8 to initialize the row address and increment the column address. After that, the flow returns to step ST.31-2 of the first step (ST.31) to execute the leakage bit line check for the bit line selected by the incremented column address.

On the other hand, when it is determined that "the column address is the final column address" (YES), the erase is ended.

According to this first modification, the number of times of sequence of scanning (incrementing) the column address can be reduced to once from twice in the first embodiment, so the erase sequence can be simplified.

Second Modification to First Embodiment

The second modification to the first embodiment will be described next.

This second modification is related to a modification of the biased state in the leakage bit line check (ST.31-2).

Figure 17:
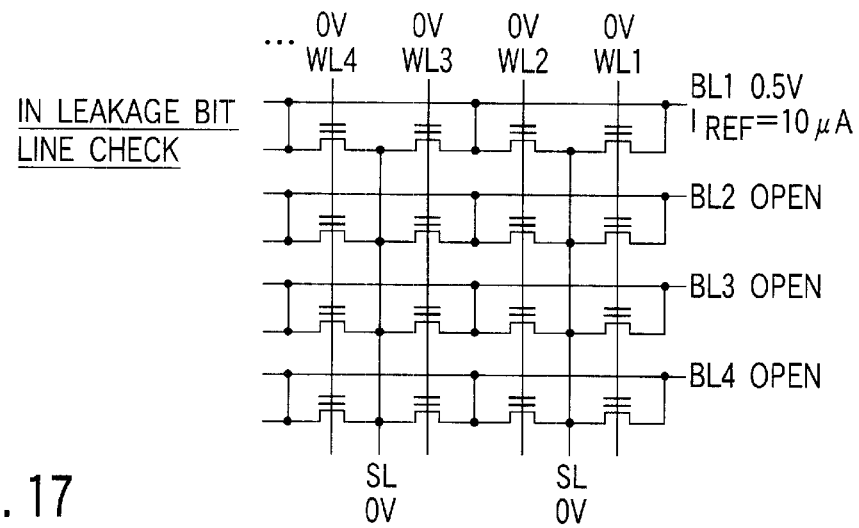
FIG. 17 is a view showing the biased state of the cell array in the leakage bit line check according to the second modification to the first embodiment.

FIG. 17 is a view showing the biased state of the cell array in the leakage bit line check according to the second modification.

As shown in FIG. 17, the nonselection bias voltage applied to all the word lines WL1, WL2, WL3, WL4, in the block as a data erase target may be higher than the first overerase verify voltage $V_{OEV1}$. When the first overerase verify voltage $V_{OEV1}$ is "−1 V", the nonselection bias voltage has a numerical value of "0 V" higher than the first overerase verify voltage $V_{OEV1}$ by "1 V".

In this second modification, the nonselection bias voltage applied to the word lines in the leakage bit line check is made higher than the first overerase verify voltage $V_{OEV1}$ by "1 V".

For this reason, even when the predetermined value in the leakage bit line check is set to, e.g., "10 $\mu$A" equal to the predetermined value $I_{REF}$ in the normal read, a cell having the threshold voltage $V_{TH}$ of "−1 V" or less can be detected. This is because when the bias voltage of the word line is "0 V", and a current of "10 $\mu$A" flows to the bit line, the threshold voltage $V_{TH}$ of the cell is supposed to be "−1 V" or less.

As an advantage of the second modification, the predetermined value for discriminating between the "0" read and the "1" read need not be switched between the read and the leakage bit line check. For this reason, a circuit for switching the predetermined value between the read and the leakage bit line check and a circuit for generating the signal $S_{LEAK}$ for controlling the predetermined value switching can be omitted from the predetermined value generation circuit 13 as shown in FIG. 12B.

Hence, according to the second modification, in addition to the effect obtained by the first embodiment, the circuit can be simplified, the degree of integration can be increased, and the yield can be improved.

Third Modification to First Embodiment

The third modification to the first embodiment will be described next.

The overerased bit detection sequence (ST.31-1 to ST.31-6) of the first step (ST.31) is preferably integrated with the overerased cell detection sequence (ST.32-1 to ST.32-6) of the second step (ST.32) as much as possible from the viewpoint of elimination of the cumbersomeness of control, reduction of the number of elements, and an increase in operation speed.

Figure 18:
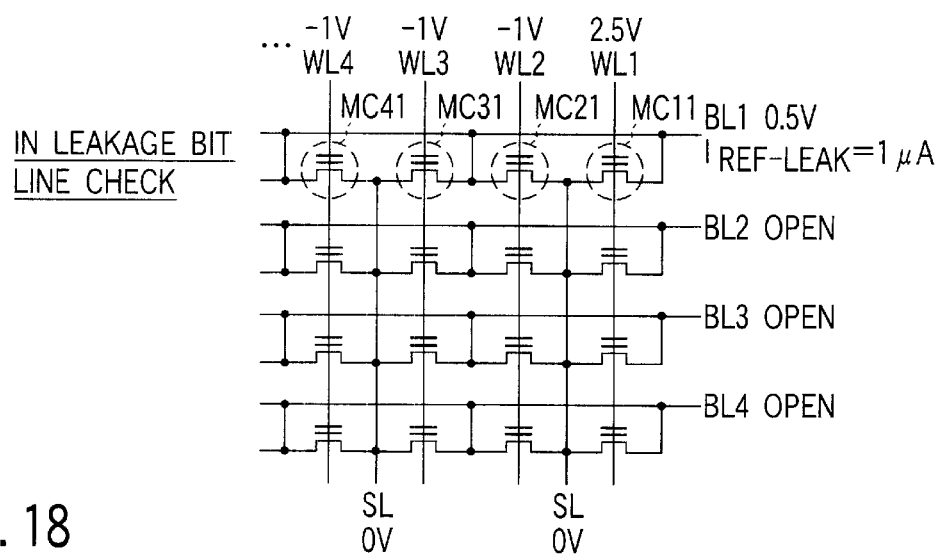
FIG. 18 is a view showing the biased state of the cell array in the leakage bit line check according to the third modification to the first embodiment.

FIG. 18 is a view showing the biased state of the cell array 1 in the leakage bit line check according to the third modification to the first embodiment.

As shown in FIG. 18, in the leakage bit line check, for example, the voltage of the first word line WL1 is set to the first overerase verify voltage of, e.g., "2.5 V", and the voltages of the remaining word lines WL2, WL3, WL4, ... are set to the nonselection voltage of, e.g., "−1 V". This biased state is the same as that in the overerase verify described in the first embodiment (e.g., FIG. 14A).

It is determined in the biased state shown in FIG. 18 whether the leakage current flowing to the selected bit line BL1 is smaller than "1 µA", as in, e.g., the first embodiment.

If it is determined that the "1" read is performed, i.e., the leakage current is "1 µA" or more, at least following two cases can be considered.

[Case 1]

The threshold voltage $V_{TH}$ of the cell MC11 connected to the first word line WL1 is "2.5 V" or less.

[Case 2]

At least one of the cells MC21, MC31, MC41, connected to the unselected word lines WL2, WL3, WL4, ... has the threshold voltage $V_{TH}$ of "−1 V" or less.

In "case 1", when the threshold voltage $V_{TH}$ of the cell MC11 is "−1 V" or less, the threshold voltage $V_{TH}$ must be increased.

In "case 2", the threshold voltage $V_{TH}$ of at least one of the cells MC21, MC31, MC41, ... must be increased.

Hence, as in the first embodiment, when it is determined that the "1" read is performed, i.e., the leakage current is "1 µA" or more, the self-convergence operation is executed.

When the threshold voltage $V_{TH}$ of the cell MC12 is higher than "−1 V", the threshold voltage $V_{TH}$ need not be increased at this timing even when it is "2.5 V" or less. However, no fault occurs even when the increasing operation is performed.

However, when the self-convergence operation is performed until the threshold voltage $V_{TH}$ of the cell MC12 exceeds "2.5 V", a very long time may be required.

Figure 19:
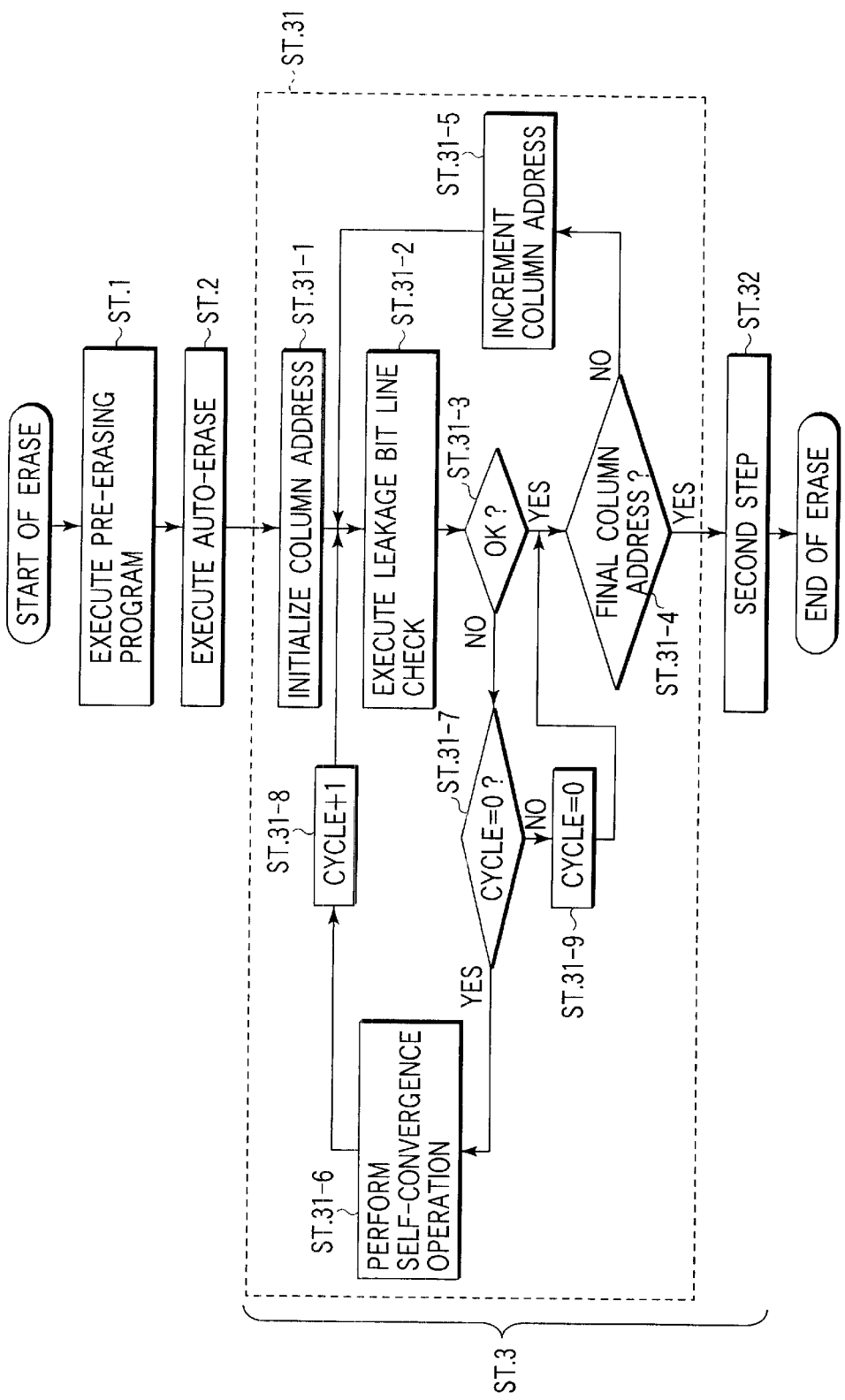
FIG. 19 is a flow chart showing a control method preferable to the third modification to the first embodiment.

To prevent this, in the third modification, for example, the self-convergence operation is performed under conditions to raise the threshold voltage $V_{TH}$ of the cell MC to a level higher than "−1 V", and in the re-check after the self-convergence operation, the self-convergence operation of the bit line may be forcibly ended even when the leakage current is equal to or larger than the predetermined value. FIG. 19 shows such a sequence.

As shown in FIG. 19, the sequence preferable to the third modification is the same as that shown in FIG. 9 until step ST.31-3. However, when it is determined in step ST.31-3 that the "1" read is performed, i.e., the leakage current is equal to or larger than "1 µA" (NO), the subsequent sequence is different from that in FIG. 9.

More specifically, as shown in FIG. 19, when it is determined in step ST.31-3 that the leakage current is equal to or larger than "1 µA" (NO), the flow advances to step ST.31-7 to determine whether the cycle of "0". The cycle here represents the log of self-convergence operation of the selected bit line. If "cycle=0", no log is present; otherwise, a log is present.

If it is determined in step ST.31-7 that "cycle=0" (YES), the flow advances to step ST.31-6 to perform the self-convergence operation.

The flow advances to step ST.31-8 to increment the cycle by "1". Then, the flow returns to step ST.31-2 to check the leakage current again. When it is determined in this re-check that the leakage current is "1 µA" or more (NO), the flow advances to step ST.31-7. At this time, "cycle=1" in step ST.31-7. For this reason, it is determined in step ST.31-7 that "the cycle is not 0". The flow advances to step ST.31-9 to return the cycle to "0" in, e.g., step ST.3.1-9, and then, the flow advances to step ST.31-4.

The subsequent sequence is the same as in FIG. 9.

According to this sequence, the self-convergence operation need not be repeated until the threshold voltage of the cell MC connected to the first word line WL1 biased to, e.g., 2.5 V, exceeds 2.5 V. Hence, particularly in the second modification, the time required for the first step (ST.31) can be shortened.

The idea of the above third modification is basically the same as that of the first embodiment in that the self-convergence operation is performed without specifying the overerased cell in the selected bit line BL1.

According to this third modification, in the leakage bit line check, control need not be performed to set all the word lines to, e.g., "−1 V", unlike the first embodiment. Hence, a circuit for setting all the word lines to, e.g., "−1 V" can be omitted, so the number of elements can be reduced, and the operation speed can be increased.

Fourth Modification to First Embodiment

The fourth modification to the first embodiment will be described next.

In the third modification, the cumbersomeness of control is eliminated by making the biased state in the leakage current detection equal to that in the overerase verify.

In the fourth modification, not only the biased state but also the detection method in the leakage bit line check is made equal to that in the overerase verify, thereby further eliminating the cumbersomeness of control.

Figure 20:
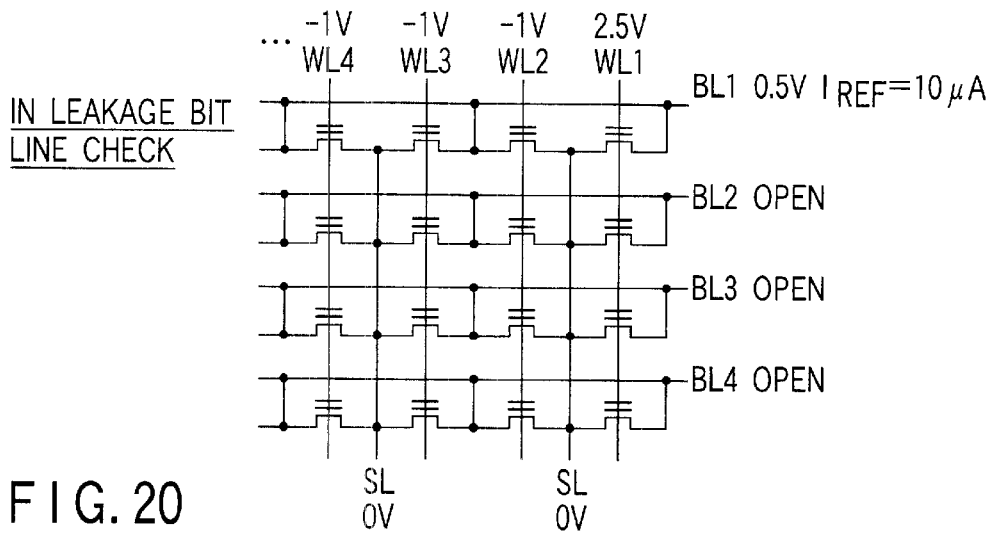
FIG. 20 is a view showing the biased state of the cell array in the leakage bit line check according to the fourth modification to the first embodiment.

FIG. 20 is a view showing the biased state in the leakage bit line check according to the fourth modification.

The biased state shown in FIG. 20 is the same as in FIG. 18. However, the predetermined value for discriminating between the "0" read and the "1" read is set to not, e.g., "1 µA" but, e.g., "10 µA", i.e., the same value as in the overerase verify.

For example, it is determined in the biased state shown in FIG. 20 whether the leakage current flowing to the selected bit line BL1 is smaller than "10 µA", i.e., the same value as in the normal read.

If it is determined that the "1" read is performed, i.e., the leakage current is "10 µA" or more, at least following two cases can be considered.

[Case 1]

The threshold voltage $V_{TH}$ of the cell MC11 connected to the first word line WL1 is "1.5 V" or less.

[Case 2]

At least one of the cells MC21, MC31, MC41, ... connected to the unselected word lines WL2, WL3, WL4, ... has the threshold voltage $V_{TH}$ of "−2 V" or less.

In the fourth modification, a cell having the threshold voltage $V_{TH}$ from "−2 V" (exclusive) to −1 V (inclusive) cannot be detected from the cells MC21, MC31, MC41, ... connected to the unselected word lines WL2, WL3, WL4, ..., unlike the third modification.

However, in the sequence of detecting a cell, i.e., an overerased cell having the threshold voltage $V_{TH}$ of "−2 V" or less (ST.32-1 to ST.32-6), generation of a cell which will flow a current equal to or larger than the predetermined value can be suppressed in the overerase verify.

In addition, when consideration is made to reduce the probability of an operation error caused by the presence of a cell having the threshold voltage $V_{TH}$ from "−2 V" (exclusive) to −1 V (inclusive), no problem is posed.

Alternatively, in the cases shown in FIGS. 18 and 20 of the third and fourth modification, the bias conditions can be modified such that the potential of an unselected word line is set to not −1 V but 0 V also in the overerase verify, or the potential of an unselected word line is set to 0 V only in the leakage bit line check while allowing the circuit complexity to some extent. This also depends on the degree of margin ensured for each operation.

The idea of the above fourth modification is also basically the same as that of the first embodiment in that the self-convergence operation is performed without specifying the overerased cell in the selected bit line BL1.

According to the fourth modification, the cumbersomeness of control can be further suppressed by setting the predetermined value in the leakage bit line check equal to that in the overerase verify, as compared to the third modification. Hence, a circuit necessary for control of the leakage bit line check can be further omitted, the number of elements can be reduced, and the operation speed can be increased.

The first overerase verify voltage $V_{OEV1}$ is set to be lower than the second overerase verify voltage $V_{OEV2}$. In this setting, an appropriate value is set in consideration of the characteristics of the cell MC because when the setting is too high or too low, the following problems are posed.

To make the setting low, the negative voltage to be applied to an unselected word line in the weak-program operation must be further lowered to avoid an operation error in the subsequent weak-program sequence.

However, when the setting is too low, the required capability of the charge pump circuit for generating the negative voltage must be increased, resulting in an increase in area of the charge pump circuit. In addition, a portion that requires a high breakdown voltage may be formed in the negative voltage switching circuit.

Hence, it is not preferable to make an unnecessarily low setting.

On the other hand, when the setting is too high, a very long time may be required until the threshold voltage $V_{TH}$ is raised to that value by the self-convergence operation, or when the difference from the erase verify voltage $V_{EV}$ is small, the threshold voltage $V_{TH}$ may exceed the erase verify voltage $V_{EV}$.

Hence, as the first overerase verify voltage $V_{OEV1}$, an optimum voltage lower than the second overerase verify voltage $V_{OEV2}$ is set by checking the characteristics of the cell MC.

Second Embodiment

In the first step (ST.31) of the first embodiment, a bit line having a relatively large leakage current is detected. Then, for example, a self-convergence bias voltage is applied to the detected bit line to perform the self-convergence operation for a cell connected to the detected bit line.

However, when the second step (ST.32) is to be performed after the first step (ST.31), as in the present invention, a threshold voltage $V_{TH}$ only need be restored to a relatively low level such as "−1 V" in the first step (ST.31). For this reason, the threshold voltage $V_{TH}$ can often be properly restored to a desired level only by applying a short-time pulse (write bias voltage) to the bit line.

In this case, for example, a method of restoring the threshold voltage by applying a voltage to all bit lines while scanning the bit lines without executing the leakage bit line check can be used. This simplifies the circuit for controlling the first step (ST.31), as compared to the case wherein the leakage bit line check is performed every time.

Figure 21:
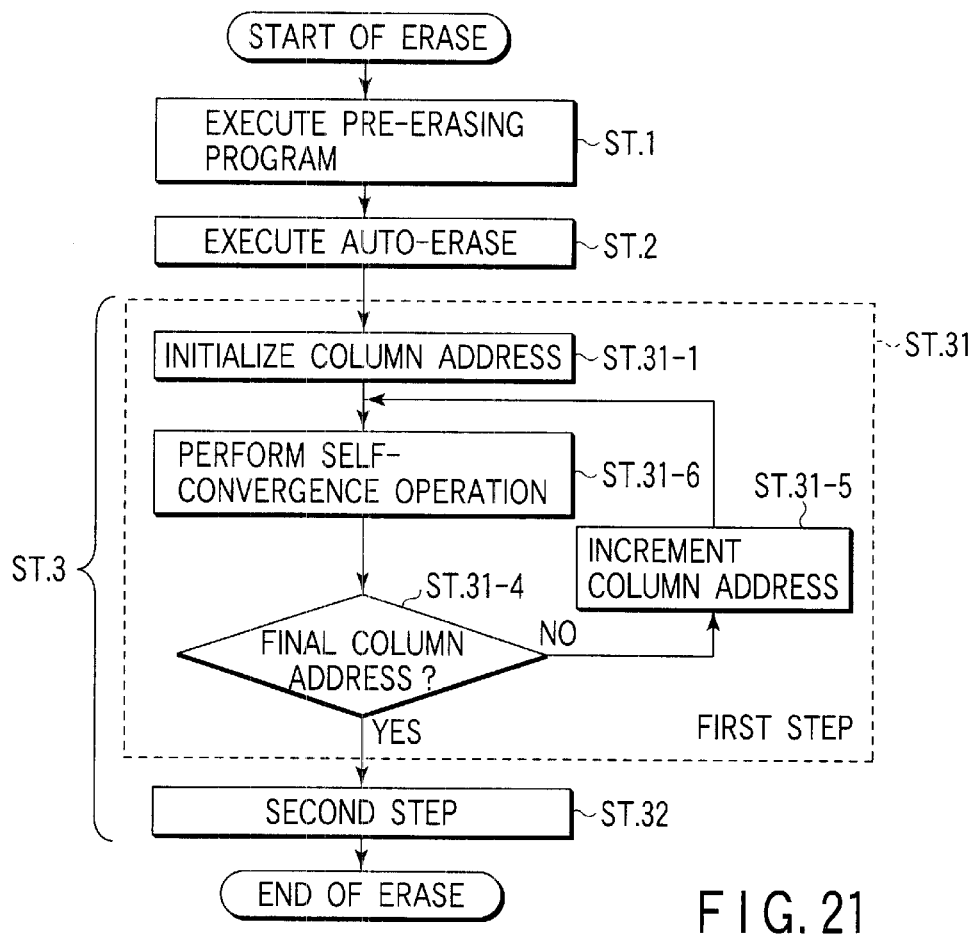
FIG. 21 is a flow chart showing a control method according to the second embodiment of the present invention.

FIG. 21 is a flow chart of the first step (ST.31).

In step ST.31-1 shown in FIG. 21, the column address is initialized.

The flow advances to step ST.31-6 to apply a self-convergence bias voltage of, e.g., 5 V to the bit line selected by the initialized column address. The self-convergence operation is executed for cells connected to the selected bit line, and the threshold voltages $V_{TH}$ of these cells are boosted to, e.g., "−1 V" or more.

The flow advances to step ST.31-4 to determine whether the column address is the final column address. If it is determined in step ST.31-4 that "the column address is not the final column address" (NO), the flow advances to step ST.31-5.

In step ST.31-5, the column address is incremented. After the column address is incremented, the flow returns to step ST.31-6.

In step ST.31-6, the self-convergence bias voltage of, e.g., 5 V is applied to the bit line selected by the incremented column address. The self-convergence operation is performed for cells connected to the selected bit line, and the threshold voltages $V_{TH}$ of these cells are boosted to, e.g., "−1 V" or more.

The flow advances to step ST.31-4 to determine whether the column address is the final column address. If it is determined in step ST.31-4 that "the column address is not the final column address" (NO), the flow advances to step ST.31-5.

On the other hand, when it is determined that "the column address is the final column address" (YES), the first step (ST.31) is ended, and the flow advances to the second step (ST.32).

According to the second embodiment, since the leakage bit line check is not executed every time, the circuit for controlling the first step (ST.31) can be made simpler than-that in the first embodiment.

First Modification to Second Embodiment

Alternatively, determination after the self-convergence operation may be omitted although the leakage current detection is performed.

In this case, the time required for the first step (ST.31) can be shortened.

This will be described below as the first modification to the second embodiment.

FIG. 22 is a flow chart showing the first modification to the second embodiment.

In step ST.31-1 shown in FIG. 22, the column address is initialized.

The flow advances to step ST.31-2 to execute the leakage bit line check and apply a read bias voltage (0.5 V) to the bit line selected by the initialized column address.

The flow advances to step ST.31-3 to determine whether the current flowing to the selected bit line is smaller than a predetermined value.

If it is determined that the "0" read is performed, i.e., the current flowing to the bit line is smaller than the predetermined value (YES), the flow advances to step ST.31-4 to determine whether the column address is the final column address.

If it is determined in step ST.31-4 that "the column address is not the final column address" (NO), the flow advances to step ST.31-5 to increment the column address.

The flow returns to step ST.31-2 to apply the read bias voltage (0.5 V) to the bit line selected by the incremented column address.

The flow advances to step ST.31-3 to determine whether the current flowing to the bit line is smaller than the predetermined value.

If it is determined that the "1" read is performed, i.e., the current flowing to the bit line is equal to or larger than the predetermined value (NO), the flow advances to step ST.31-6.

In step ST.31-6, the self-convergence bias voltage of, e.g., 5 V is applied to the bit line selected by the incremented column address. The self-convergence operation is performed for cells connected to the selected bit line, and the threshold voltages $V_{TH}$ of these cells are boosted to, e.g., "−1 V" or more.

The flow advances to step ST.31-4 to determine whether the column address is the final column address. If it is determined in step ST.31-4 that "the column address is not the final column address" (NO), the flow advances to step ST.31-5.

On the other hand, when it is determined that "the column address is the final column address" (YES), the first step (ST.31) is ended, and the flow advances to the second step (ST.32).

According to the first modification to the second embodiment, since determination after the self-convergence operation is omitted although the leakage bit line check is performed, the time required for the first step (ST.31) can be shortened, as compared to the first embodiment.

Third Embodiment

In the first step (ST.31) of the first and second embodiments, a bit line to which a current equal to or larger than a predetermined value is detected, and a self-convergence bias voltage (self-convergence pulse) is applied to the detected bit line to perform the self-convergence operation for cells connected to the detected bit line.

At this time, if all word lines are set to a negative bias voltage of, e.g., "−1 V" to suppress a decrease in voltage of the detected bit line due to the leakage current flowed by a cell, the boosting speed of threshold voltage $V_{TH}$ of the cell may decrease.

The third embodiment has as its object to suppress a decrease in boosting speed of the threshold voltage $V_{TH}$ in the self-convergence operation.

FIGS. 23A and 23B are views showing the biased states of a cell array 1 in the self-convergence operation according to the third embodiment.

FIGS. 23A and 23B show 1,024 word lines WL1 to WL1024. In determination (ST.31-3) after the leakage bit line check (ST.31-2), a bit line (not shown) to which a current equal to or larger than a predetermined value flows is detected, and then, the self-convergence operation (ST.31-6) is performed.

At this time, the word line WL1 is set to a voltage higher than "−1 V", and for example, to "0 V", as shown in FIG. 23A.

After the elapse of a predetermined time of, e.g., 100 µs, not the word line WL1 but the word-line WL2 is set to a voltage higher than "−1 V", and for example, to "0 V", as shown in FIG. 23B.

This operation is sequentially performed up to the word line WL1024.

Assume that the self-convergence operation requires about 100 µs per cell. As shown in FIGS. 23A and 23B, even in a block having 1,024 word lines, the self-convergence operation per bit line can be ended in about 100 µms (≈100 µs×1024 word lines).

According to the third embodiment, the bias voltage applied to the word lines is set to a bias voltage higher than, e.g., "−1 V" and, more preferably, to a bias voltage of 0 V or more sequentially in units of word lines. For this reason, unlike the case wherein all the word lines are set to a negative bias voltage of, e.g., "−1 V", the decrease in boosting speed of the threshold voltage $V_{TH}$ can be suppressed.

The operation according to the third embodiment can be regarded as a light weak-program operation in the first step (ST.31). The differences from the weak-program operation in the second step (ST.32) are that the bias voltage applied to the word lines is low, and the light weak-program operation is performed for all cells connected to the bit line detected as a bit line to which a current equal to or larger than the predetermined value flows without specifying the address of each cell.

Fourth Embodiment

In the third embodiment, an example in which the decrease in boosting speed of the threshold voltage $V_{TH}$ of a cell can be suppressed has been described. However, for a block having 1,024 word lines, the time required for the self-convergence operation per bit line is about 100 µms, and when the number of bit lines that execute the self-convergence operation is large, a considerably long time may be required for the first step (ST.31).

The fourth embodiment has as its object to shorten the time required for the first step (ST.31) while suppressing the decrease in boosting speed of the threshold voltage.

FIGS. 24A and 24B are views showing the biased states of a cell array 1 in the self-convergence operation according to the fourth embodiment.

FIGS. 24A and 24B show 1,024 word lines WL1 to WL1024. In determination (ST.31-3) after the leakage bit line check (ST.31-2), a bit line (not shown) to which a current equal to or larger than a predetermined value flows is detected, and then, the self-convergence operation (ST.31-6) is performed.

At this time, as shown in FIG. 24A, ⅛ word lines WL1 to WL128 out of the 1,024 word lines are set to a voltage higher than "−1 V", and for example, to "0 V".

After the elapse of a predetermined time of, e.g., 100 μs, not the word lines WL1 to WL128 but the word lines WL129 to WL256 are set to a voltage higher than "−1 V", and for example, to "0 V", as shown in FIG. 24B.

This operation is sequentially performed up to the group consisting of the word lines WL897 to WL1024.

According to this fourth embodiment, a voltage higher than "−1 V" is set in units of word lines but in units of groups of a plurality of word lines. Assume that the self-convergence operation requires about 100 μs per cell when the bias voltage is raised in units of 128 word lines, as shown in FIGS. 24A and 24B. Even in a block having 1,024 word lines, the self-convergence operation per bit line can be ended in about 800 μs (≈100 μs×8 groups).

As described above, in the fourth embodiment, the decrease in boosting speed of the threshold voltage $V_{TH}$ can be suppressed by making the word line voltage higher than, e.g., "−1 V", as in the third embodiment. In addition, since the word line voltage is raised in units of groups of a plurality of word lines, the time required for the first step (ST.31) can be shortened, as compared to the third embodiment.

Fifth Embodiment

For the weak-program operation, a method of executing the operation at a high speed has been proposed. For example, a step-up method is. disclosed in, e.g., H. Shiga et al, Symposium of VLSI Circuit Technical Digest, pp. 33–36 (1999).

In the step-up method, the voltage of a selected word line is stepped up every time the weak-program operation is repeated for a selected cell.

In the step-up method, a weak-program pulse is applied to a selected bit line and selected word line, and after this, the overerase verify is executed to check whether a threshold voltage $V_{TH}$ of the cell is restored to a desired level. If the threshold voltage $V_{TH}$ has not reached the desired level regardless of the weak-program operation, the voltage of the word line is increased every predetermined amount at the next pulse application timings.

In this step-up method, unless the voltage of the bit line is stable, the write amount may suddenly change before and after the step-up. In the step-up method, basically, the threshold voltage $V_{TH}$ is set within a desired range using the fact that when the drain voltage is constant, and the word line voltage is stepped up, the write amount always increases by the same amount. When a leakage current flows to the bit line, the drain voltage of the selected cell becomes unstable. The write amount in the selected cell is proportional to the drain voltage. For this reason, when the drain voltage is unstable, the write amount in the selected cell is not constant, and for example, the write amount may suddenly increase to raise the threshold voltage $V_{TH}$ beyond the desired value.

In the present invention, the leakage current flowed by an unselected cell to the bit line can be decreased. For this reason, a variation in voltage of the bit line due to the leakage current can be suppressed, and a very stable voltage can be supplied to the drain of the selected cell.

Hence, when the weak-program method is used for the second step (ST.32), the step-up method can be preferably used together.

Figure 25:
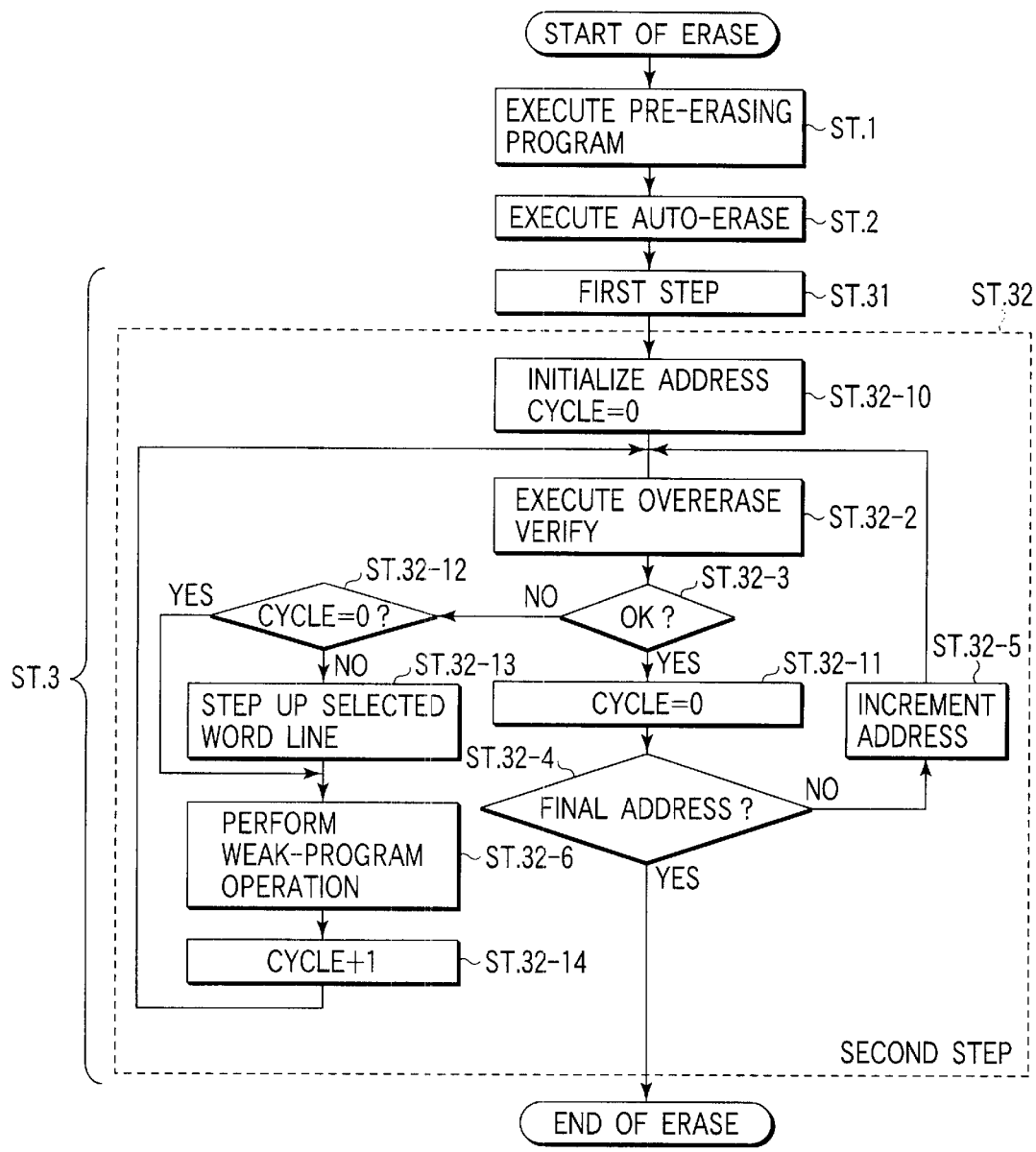
FIG. 25 is a flow chart showing a control method according to the fifth embodiment of the present invention.

FIG. 25 is a flow chart showing a control method according to the fifth embodiment.

In step ST.32-10 shown in FIG. 25, the address is initialized, and the repetitive number of times (cycle) of the weak-program operation is set to "0".

The flow advances to step ST.32-2 to execute the overerase verify. First, an overerase verify voltage of, e.g., 3 V is applied to the word line selected by the initialized address. Next, a read bias voltage (0.5 V) is applied to the bit line selected by the initialized address.

The flow advances to step ST.32-3 to determine whether the current flowing to the selected bit line is smaller than a predetermined value.

When it is determined that the "0" read is performed, i.e., the current flowing to the bit line is smaller than the predetermined value (YES), the flow advances to step ST.32-11.

In step ST.32-11, the cycle is set to "0".

The flow advances to step ST.32-4 to determine whether the address is the final address.

If it is determined in step ST.32-4 that "the address is not the final address" (NO), the flow advances to step ST.32-5.

In step ST.32-5, the address is incremented.

The flow returns to step ST.32-2 to execute the overerase verify. In step ST.32-2, cells connected to the bit line and word line, which are selected by the incremented address, are subjected to the overerase verify.

The flow advances to step ST.32-3 to determine whether the current flowing to the selected bit line is smaller than the predetermined value.

When it is determined that the "1" read is performed, i.e., the current flowing to the bit line is equal to or larger than the predetermined value (NO), the flow advances to step ST.32-12.

In step ST.32-12, it is determined whether the cycle is "0".

When it is determined that the cycle is "0" (YES), the flow advances to step ST.32-6. Otherwise (NO), the flow advances to step ST.32-13 to step up the bias voltage of the selected word line, and then the flow advances to step ST.32-6.

In step ST.32-6, the weak-program operation is performed for the selected cell.

The flow advances to step ST.32-14 to increment the cycle by "1".

The flow returns to step ST.32-2 again to execute the overerase verify.

The flow advances to step ST.32-3 to determine whether the current flowing to the selected bit line is smaller than the predetermined value.

When it is determined again that the "1" read is performed, i.e., the current flowing to the bit line is equal to or larger than the predetermined value (NO), the steps ST.32-13, ST.32-6, and ST.32-14 are repeated again.

On the other hand, when it is determined that the "0" read is performed, i.e., the current flowing to the bit line is smaller than the predetermined value (YES), the flow advances to step ST.32-11 to return the cycle to "0". Then, the flow advances to step ST.32-4 to determine whether the address is the final address.

If it is determined that "the address is the final address" (YES), the second step (ST.32) is ended.

The present invention can decrease the leakage current flowed by an unselected cell to the bit line. Hence, when the weak-program method is used for the second step, as shown in FIG. 25, the step-up method can be preferably used together with the weak-program method.

Sixth Embodiment

As described above in, e.g., the third modification to the first embodiment, when the overerased bit detection sequence (ST.31-1 to ST.31-6) of the first step (ST.31) is integrated with the overerased cell detection sequence (ST.32-1 to ST.32-6) of the second step (ST.32) as much as possible, the control circuit can be simplified.

The sixth embodiment has as its object to further simplify the control circuit by putting the overerased bit line detection and self-convergence sequence into the overerased cell detection and weak-program sequence.

According to the sixth embodiment, in the overerased cell detection sequence, only When the first word line is selected, and the first weak-program pulse is to be applied, the pulse is switched to the self-convergence pulse. with this method:, a control method according to the present invention can be realized by adding a minimum function to the circuit for controlling the weak-program operation.

Figure 26:
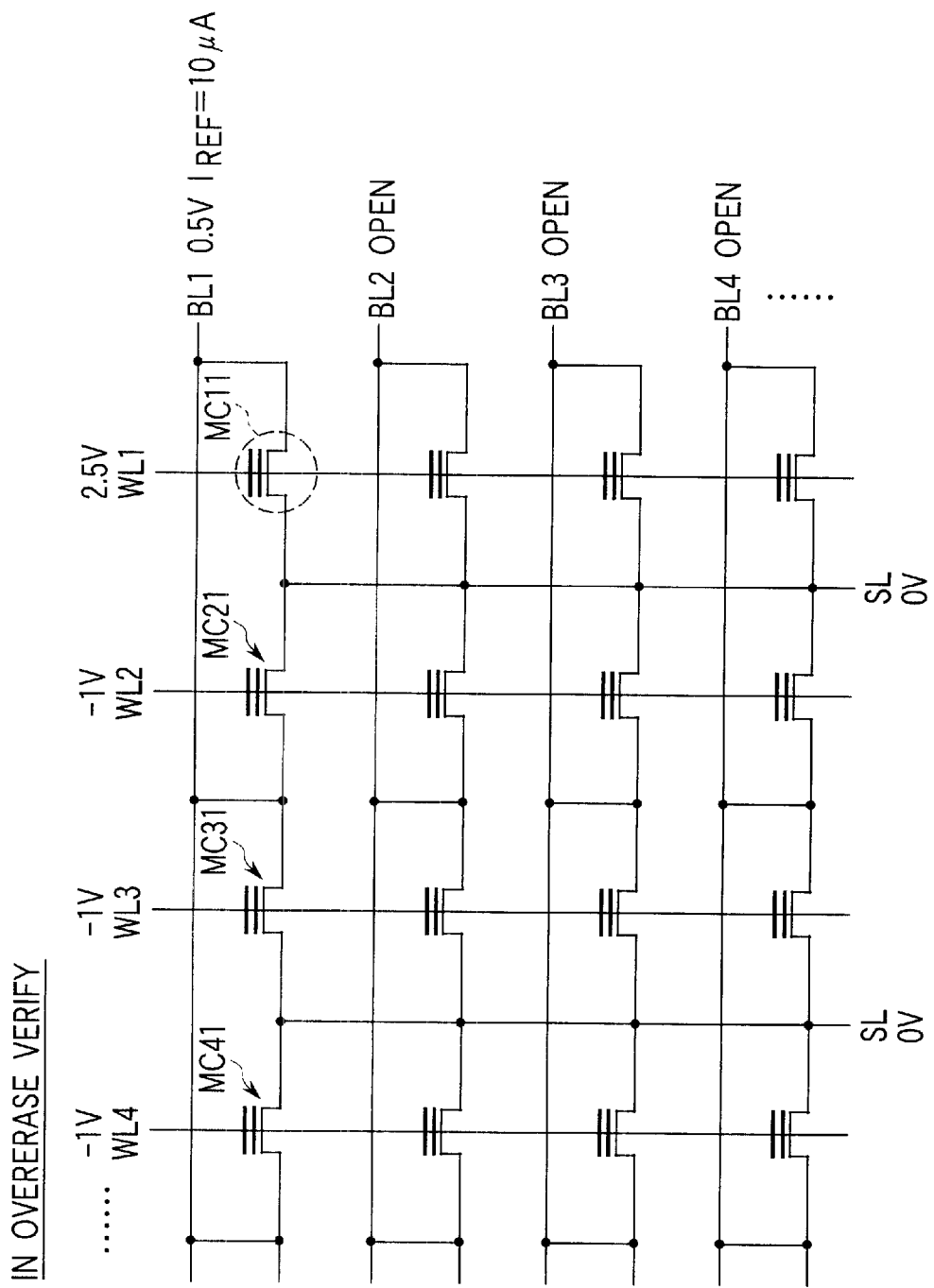
FIG. 26 is a view showing the biased state of a cell array in the overerase verify according to the sixth embodiment of the present invention.

FIG. 26 is a view showing the biased state of a cell array 1 in the overerase verify according to the sixth embodiment.

As shown in FIG. 26, first, after a first word line WL1 is set to "2.5 V", and unselected word lines are set to "−1 V", the "1" read check is performed. A predetermined value $I_{REF}$ is, e.g., 10 μA.

At least following two cases can be considered as conditions to perform the "1" read in this "1" read check.
[Case 1]
A threshold voltage $V_{TH}$ of a selected cell MC11 is "1.5 V" or less.
[Case 2]
At least one of unselected cells MC21, MC31, MC41, . . . has the threshold voltage $V_{TH}$ of "−2 V" or less.

When the "1" read is performed, it is determined that the weak-program operation is necessary.

No problem is posed in "case 1" even when the weak-program operation is performed. In "case 2", however, the selected cell MC11 is erroneously detected as an overerased cell, resulting in an operation error that the weak-program operation is performed for the selected cell MC11.

Hence, only when the selected word line is the first word line WL1, and the first weak-program pulse is to be applied, a relatively high pulsed voltage is applied to a bit line BL1 under the self-convergence bias condition, i.e., while setting all the word lines to 0 to −1 V. Under this condition, the threshold voltage of a cell present on an unselected word line reaches, e.g., "−1 V" or more, and the voltage is, e.g., 5 V. After this voltage (pulse) is applied, the "1" read check is performed again.

When it is assumed that the threshold voltages of the unselected cells MC21, MC31, MC41, . . . are −1 V or more, the condition for "case 2" is not included in the second "1" read check. For this reason, when the "1" read is performed in the second "1" read check, "case 1" is determined. The normal weak-program operation is performed for the selected cell MC11.

This sequence can be the same-as the normal weak-program sequence, and the bias condition in applying the first weak-program voltage (pulse) only need be changed to the self-convergence program voltage (pulse).

Hence, the control method according to the present invention can be realized only by adding a minimum function to the circuit for controlling the weak-program operation.

Figure 27:
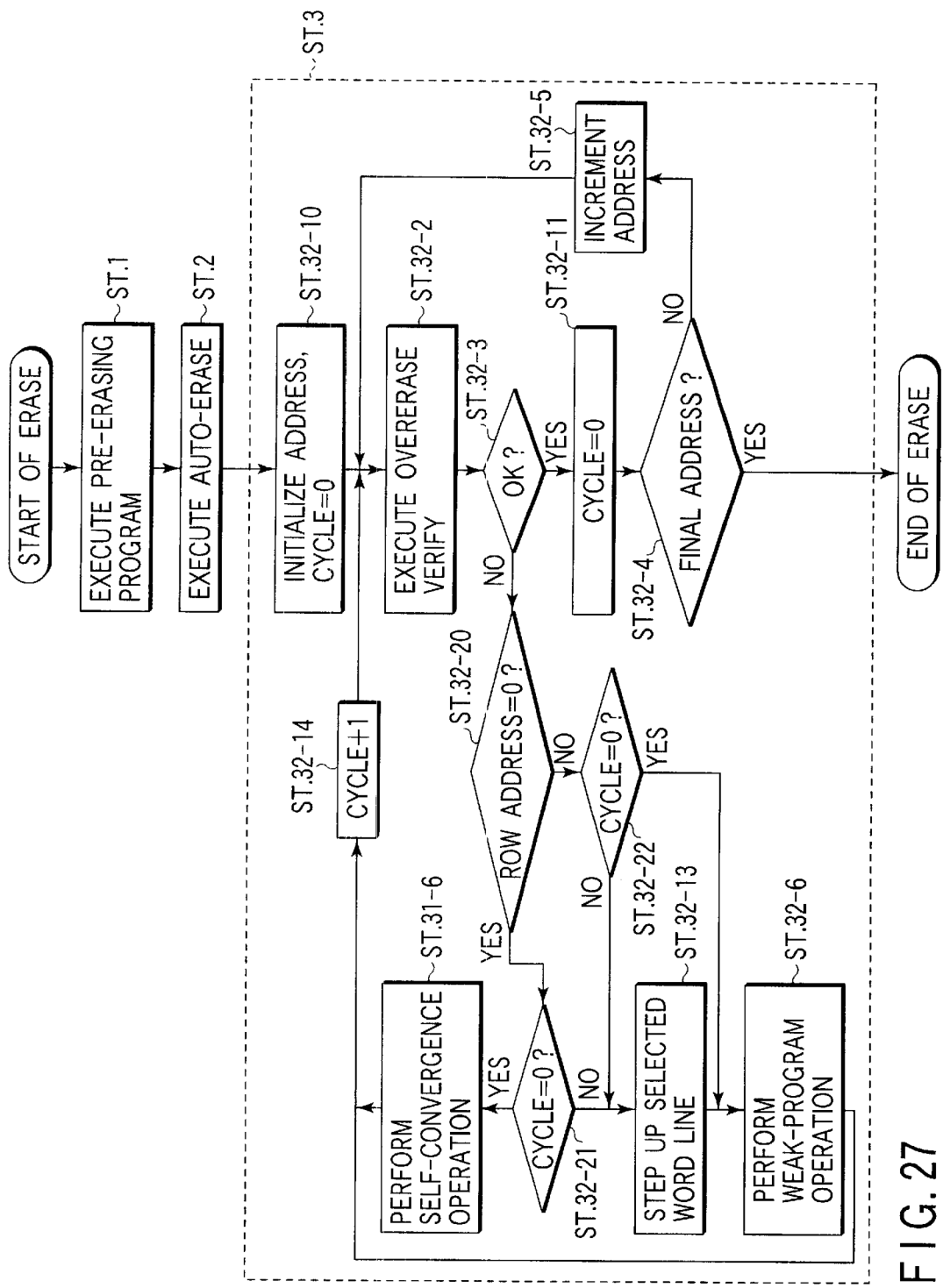
FIG. 27 is a flow chart showing a control method according to the sixth embodiment.

FIG. 27 is a flow chart showing the control method according to the sixth embodiment. FIG. 27 especially shows an example in which the step-up method is used together.

In step ST.31-10 shown in FIG. 27, the address is initialized, and the repetitive number of times (cycle) of the weak-program operation is set to "0".

The flow advances to step ST.32-2 to execute the overerase verify. First, an overerase verify voltage of, e.g., 2.5 V is applied to the word line selected by the initialized address. Next, a read bias voltage (0.5 V) is applied to the bit line selected by the initialized address. At this time, the bias of an unselected word line is, e.g., −1 V.

The flow advances to step ST.32-3 to determine whether the current flowing to the selected bit line is smaller than a predetermined value.

When it is determined that the "1" read is performed, i.e., the current flowing to the bit line is equal to or larger than the predetermined value (NO), the flow advances to step ST.32-20.

It is determined in step ST.32-20 whether the row address is "0". A row address "0" corresponds to the row address of the first word line.

If it is determined that the row address is "0" (YES), the flow advances to step ST.32-21.

It is determined in step ST.32-21 whether the cycle is "0".

If it is determined that the cycle is "0" (YES), the flow advances to step ST.32-6 to execute the self-convergence operation for the selected bit line.

Next, the flow advances to step ST.3-2-14 to increment the cycle by "1".

The flow returns to step ST.32-2 to execute the overerase verify. Then, the flow advances to step ST.32-3 to determine whether the current flowing to the selected bit line is smaller than the predetermined value again.

When it is determined in step ST.32-3 that the "1" read is performed, i.e., the current flowing to the bit line is equal to or larger than the predetermined value (NO), the flow advances to step ST.32-20 to determine whether the row address is "0".

If it is determined in step ST.32-20 that the row address is "0" (YES), the flow advances to step ST.32-21 to determine whether the cycle is "0".

If it is determined in step ST.32-21 that the cycle is not "0" (NO), the flow advances to step ST.32-13 to set the selected word line not to the self-convergence voltage but to the weak-program voltage. This is expressed as "step-up" in FIG. 27.

The flow advances to step ST.32-6 to perform the weak-program operation for the selected cell.

The flow advances to step ST.32-14 to increment the cycle by "1".

The flow returns to step ST.32-2 again to execute the overerase verify, and then the flow advances to step ST.32-3 to determine whether the current flowing to the selected bit line is smaller than the predetermined value again.

If it is determined in step ST.32-2 that the "0" read is performed, i.e., the current flowing to the bit line is smaller than the predetermined value (YES), the flow advances to step ST.32-11 to set the cycle to "0".

Next, the flow advances to step ST.32-4 to determine whether the address is the final address.

If it is determined in step ST.32-4 that "the address is not the final address" (NO), the flow advances to step ST.32-5.

In step ST.32-5, the address is incremented.

The flow returns to step ST.32-2 again to execute the overerase verify. In this step ST.32-2, cells connected to the bit line and word line selected by the incremented address are subjected to the overerase verify.

The flow advances to step ST.32-3 to determine whether the current flowing to the selected bit line is smaller than the predetermined value.

If it is determined that the "1" read is performed, i.e., the current flowing to the bit line is equal to or larger than the predetermined value (NO), the flow advances to step ST.32-20.

If it is determined in step ST.32-20 that "the row address is not "0" (NO), the flow advances to step ST.32-22 to determine whether the cycle is "0".

If it is determined in step ST.32-22 that the cycle is "0" (YES), the flow advances to step ST.32-6. When it is determined that the cycle is not "0" (NO), the flow advances to step ST.32-13 to step up the selected word line, and then the flow advances to step ST.32-6.

In step ST.32-6, the weak-program operation is performed for the selected cell. After this, the flow advances to step ST.32-14 to increment the cycle by "1". The flow returns to step ST.32-2 again to execute the overerase verify.

The flow advances to step ST.32-3 to determine whether the current flowing to the selected bit line is smaller than the predetermined value.

If it is determined that the "0" read is performed, i.e., the current flowing to the bit line is smaller than the predetermined value (YES), the flow advances to step ST.32-11 to set the cycle to "0". Then, the flow advances to step ST.32-4 to determine whether the address is the final address.

If it is determined that "the address is the final address" (YES), the step (ST.3) of reducing the distribution width of the threshold voltage $V_{TH}$ is ended.

According to the sixth embodiment, since the overerased bit detection sequence is put into the overerased cell detection sequence, the control circuit can be further simplified.

First Modification to Sixth Embodiment

In the sixth embodiment, an example in which the step-up method is used together has been described. However, the step-up method need not always be used together.

Such an example will be described below as the first modification to the sixth embodiment.

Figure 28:
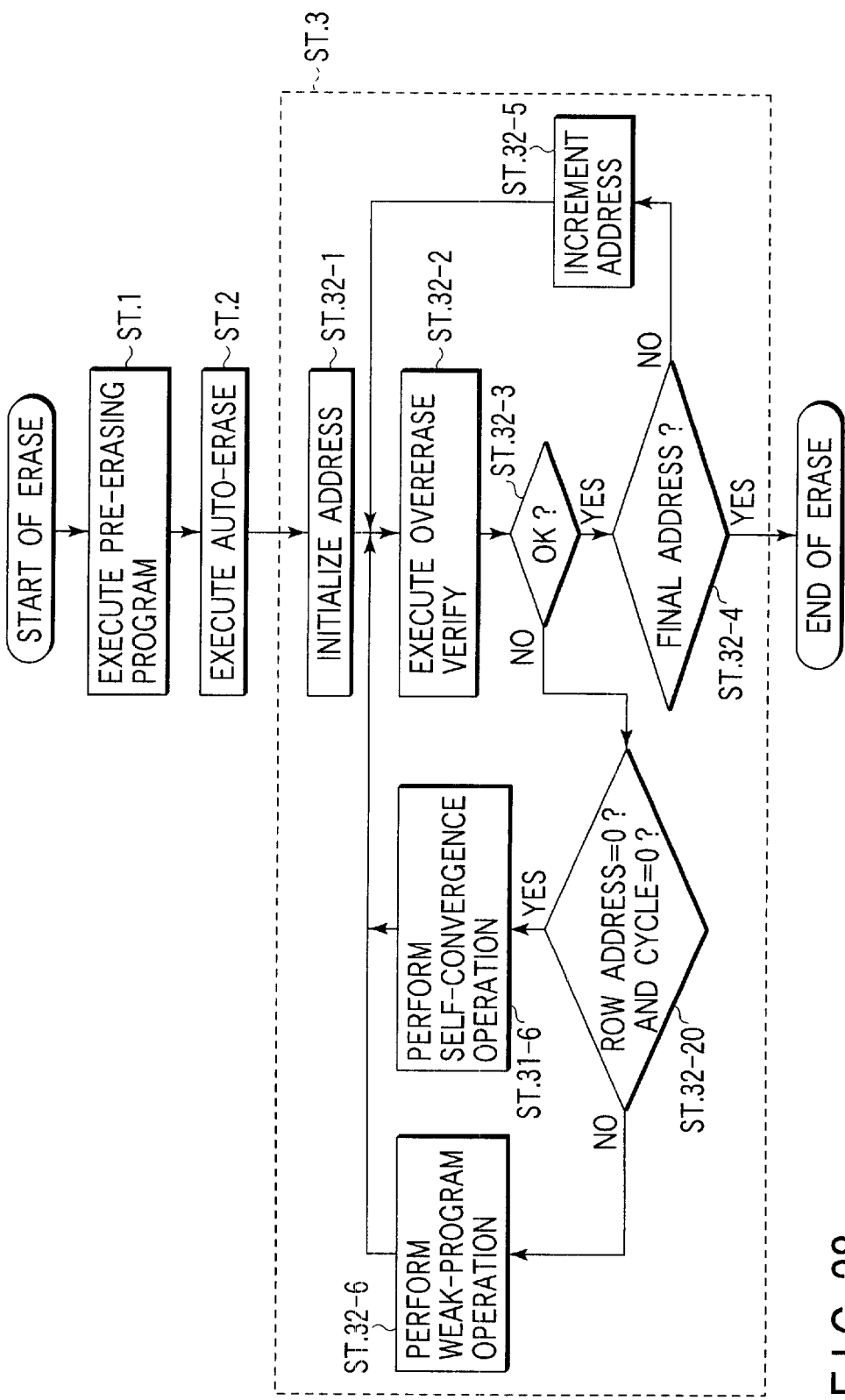
FIG. 28 is a flow chart showing a control method according to the first modification to the sixth embodiment.

FIG. 28 is a flow chart showing the first modification to the sixth embodiment.

As shown in FIG. 28, the sequence according to the first modification is almost the same as that shown in FIG. 27 except that the step of incrementing the cycle is omitted.

More specifically, as shown in FIG. 28, after the overerase verify is executed in step ST.32-2, it is determined in step ST.32-3 whether the ON current flowed by the selected cell to the bit line is smaller than "10 $\mu$A".

If it is determined that the ON current flowed by the selected cell is smaller than "10 $\mu$A" (NO), the flow advances to step ST.32-20, as in the sixth embodiment, to determine whether the row address is 0 and the cycle is 0.

If it is determined that "the row address is 0 and the cycle is 0" (YES), the flow advances to step ST.31-6 to perform the self-convergence operation, and then, returns to step ST.32-2.

On the other hand, when it is determined that "the row address is not 0" (NO), the flow advances to step ST.32-6 to perform the weak-program operation, and then returns to step ST.32-2.

Even in this first modification, since the pulse can be switched to the self-convergence pulse only when the selected word line is the first word line, and the first weak-program pulse is to be applied, the same effect as in the sixth embodiment can be obtained.

Seventh Embodiment

In the first to sixth embodiments, especially as control corresponding to step ST.31-6 (self-convergence operation), the self-convergence method using carrier injection from the drain is used.

However, as control corresponding to step ST.31-6, for example, an electric field in a direction opposite to that of the electric field applied to a cell MC in step ST.2 (erase) is applied to the tunnel insulating film to flow a tunnel current from the floating gate to at least one of the source, drain, and substrate, thereby injecting carries (electrons) into the floating gate. A threshold voltage $V_{TH}$ can also be converted by this method.

More specifically, in step ST.31-6, a tunnel current in a direction opposite to that of the tunnel current flowing to the tunnel insulating film in the erase, thereby converging the threshold voltage $V_{TH}$ in a desired range. This method is disclosed in, e.g., K. Oyama et al., "A Novel Erasing Technology for 3.3 V Flash Memory with 64 Mb Capacity and Beyond", IDEM Digest Technical Papers, pp. 607–610 (1992). This type will be referred to as a tunnel current convergence method hereinafter. FIG. 29 is a view showing the biased state of a cell in the tunnel current convergence operation.

In the tunnel current convergence method, the flowing current is much smaller than the hot carrier injection current. For this reason, a relatively high positive voltage can be simultaneously applied to the word lines in the entire block to be erased.

On the other hand, to largely shift the threshold voltage $V_{TH}$ solely in a short time and converge it into a narrow range, a higher voltage is required. In addition, unlike the self-convergence using hot carrier injection, since the threshold voltage $V_{TH}$ increases together with the voltage application time without being saturated, the threshold voltage $V_{TH}$, of not only the overerased cell but also the normal cell MC also increases.

However, when an optimum stress condition is set, the tunnel current convergence method can be used as one of methods suitable to return the threshold voltage $V_{TH}$ of the largely overerased cell MC to a certain range, as in step ST.31-6 of the present invention.

This tunnel current convergence method may be used in place of the self-convergence method in step ST.31-6 of the first to sixth embodiments.

When the tunnel current convergence method is used in step ST.31-6, first, the leakage bit line check is executed in the erase block. Next, when a bit line having a leakage current equal to or larger than a predetermined value is detected, all the cells MC in the erase block are set to a biased state (to be referred to as a tunnel injection biased state hereinafter) wherein a tunnel current flows from the floating gate to at least one of the source, drain, and substrate. Thus, carriers (electrons) are injected into the floating gate, and the threshold voltage $V_{TH}$ rises.

After this, the leakage bit line check is executed again. When the leakage current is smaller than the predetermined value, the leakage check is executed for the next bit line.

When this operation is repeated, and the leakage current of the final bit line becomes smaller than the predetermined value, the first step (ST.31) is ended.

The tunnel current convergence method may also be applied to a method which repeats a sequence in which after the leakage check is executed for all bit lines, the tunnel current convergence operation is performed, and then the leakage check is executed again for all the bit lines.

For the tunnel current convergence method, the second leakage check may be omitted by optimizing the voltage condition or application time for the tunnel injection biased state, as in the self-convergence method.

In the present invention, the threshold voltage of a memory cell is set to a narrow range in two steps under different bias conditions. When the same, e.g., hot electron injection is used in the first and second steps, it is effective to set the bias potential of a word line higher in the second step than in the first step. However, when different mechanisms are used for the first and second steps, as in the seventh embodiment, the absolute value of the voltage of the second bias condition is not always larger. In the seventh embodiment, a word line may have a value of, e.g. 15 V in the first step, so the voltage becomes higher than the word line voltage in the second step.

The present invention has been described above in accordance with the first to seventh embodiments. The voltage of a word line is expressed as "0 V" or "−1 V" throughout the embodiments. This basically represents the potential of a word line when the potential of the substrate (or well) where the cells are present is set to "0 V". When the potential of the cell substrate (or well) changes in terms of operation, the potential of the word line may be shifted with reference to the changed potential.

The above description has been made by exemplifying N-channel cells. However, the cells may be P-channel cells. In this case, the polarity of the voltage is appropriately changed.

An expression "$V_{OEV1} < V_{TH} < V_{EV}$" or the like has been used throughout the embodiments. This may be changed to "$V_{OEV1} \leq V_{TH} \leq V_{EV}$", "$V_{OEV1} < V_{TH} \leq V_{EV}$", or "$V_{OEV1} \leq V_{TH} < V_{EV}$".

Although several combinations of sequences have been described in the above embodiments, the combinations or the manner the bias potential is applied can be appropriately changed within the spirit and scope of the present invention. For example, in the embodiments of the present invention, after the erase operation is performed to the erase verify level, the overerased cell is remedied. However, for example, the generation frequency of overerased cells when the data are erased to the erase verify level can be reduced by, e.g., a method in which even when the erase verify level has not been reached after application of the erase pulse, the leakage current is checked, and when a current equal to or larger than a predetermined value flows, the erase operation is temporarily stopped to write data in the overerased cell, and the erase is resumed again. These methods can also be appropriately combined.

Figure 30:
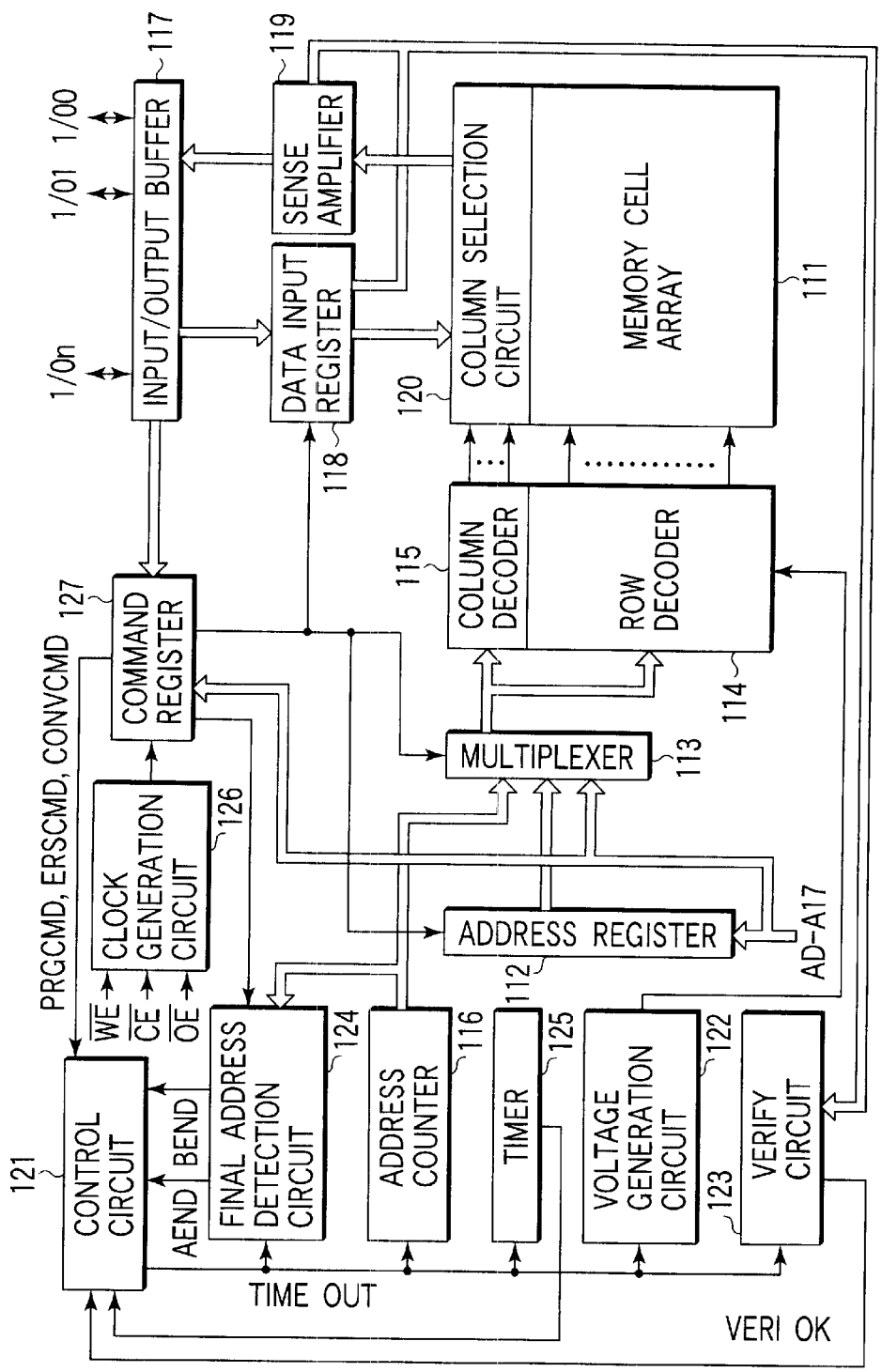
FIG. 30 is a block diagram of an EEPROM flash memory to which the present invention can be applied.

FIG. 30 is a block diagram showing a NOR flash memory to which the above method is applied. As shown in FIG. 31, a memory cell array 111 has a plurality of word lines WL and bit lines BL crossing each other, and electrically rewritable nonvolatile memory cells MC arranged at the intersections. The memory cell array 111 is made of a plurality of blocks. FIG. 31 shows only one block Blockj (1,024 Row×512 Col) as a data erase unit. Each cell MC has a known MOS transistor structure with floating and control gates stacked. The control gates are commonly connected in the row direction to form the word lines WL.

The word line WL of the memory cell array 111 is selected by a row decoder 114, and the bit line BL is selected by a column decoder 115 and column selection circuit 120. Bit line data is sensed by a sense amplifier 119 and extracted to an external terminal I/O through an input/output buffer 117. Write data is received by a data latch (input register) 118 through the input/output buffer 117 and supplied to the selected bit line BL. An address and command externally supplied are received by an address register 112 and command register 127, respectively. The received address is sent to the row decoder 114 and column decoder 115 through a multiplexer 113. The received command is timed by a clock generation circuit 126 and sent to a control circuit 121. A voltage generation circuit 122 generates a voltage other than the power supply voltage, which is to be applied to the word line or the like in accordance with the read/write/erase mode.

The control circuit 121 controls the auto-write and auto-erase sequences on the basis of externally supplied commands. For this sequence control, an address counter 116, timer 125, final address detection circuit 124, verify circuit 123, and the like are provided in addition to the control circuit 121.

Figure 32:
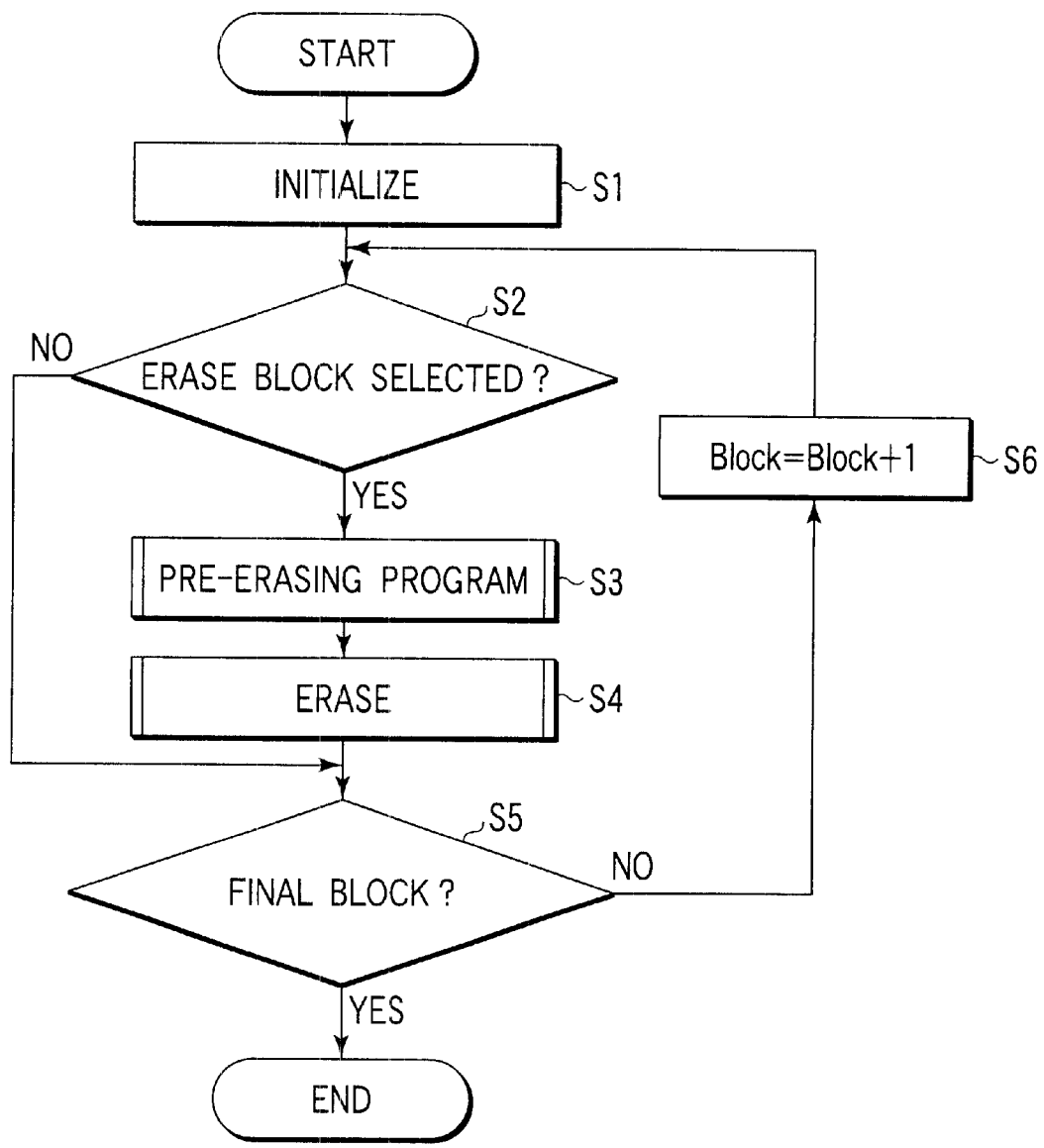
FIG. 32 is a flow chart of the auto-erase sequence of the flash memory.

FIG. 32 is a control flow chart of the auto-erase by the control circuit 121. First, initialization is performed, including selection of a block to be erased and reset of the address counter 116 (S1). It is determined whether the block to be erased is selected, and its "erase protect" is canceled (S2). If NO in step S2, it is determined whether the block is the final block (S5). If NO in step S5, the block address is incremented (S6), and the flow returns to step S2.

If YES in step S2, a pre-write is executed for a memory cell in the erased state (i.e., a memory cell in the "1" state) in the selected block (S3). In this pre-write, all memory cells in the selected block are set to "0", and the selected block is flash-erased (S4). The above operation is performed for all the selected blocks, thus ending the erase operation.

Figure 33:
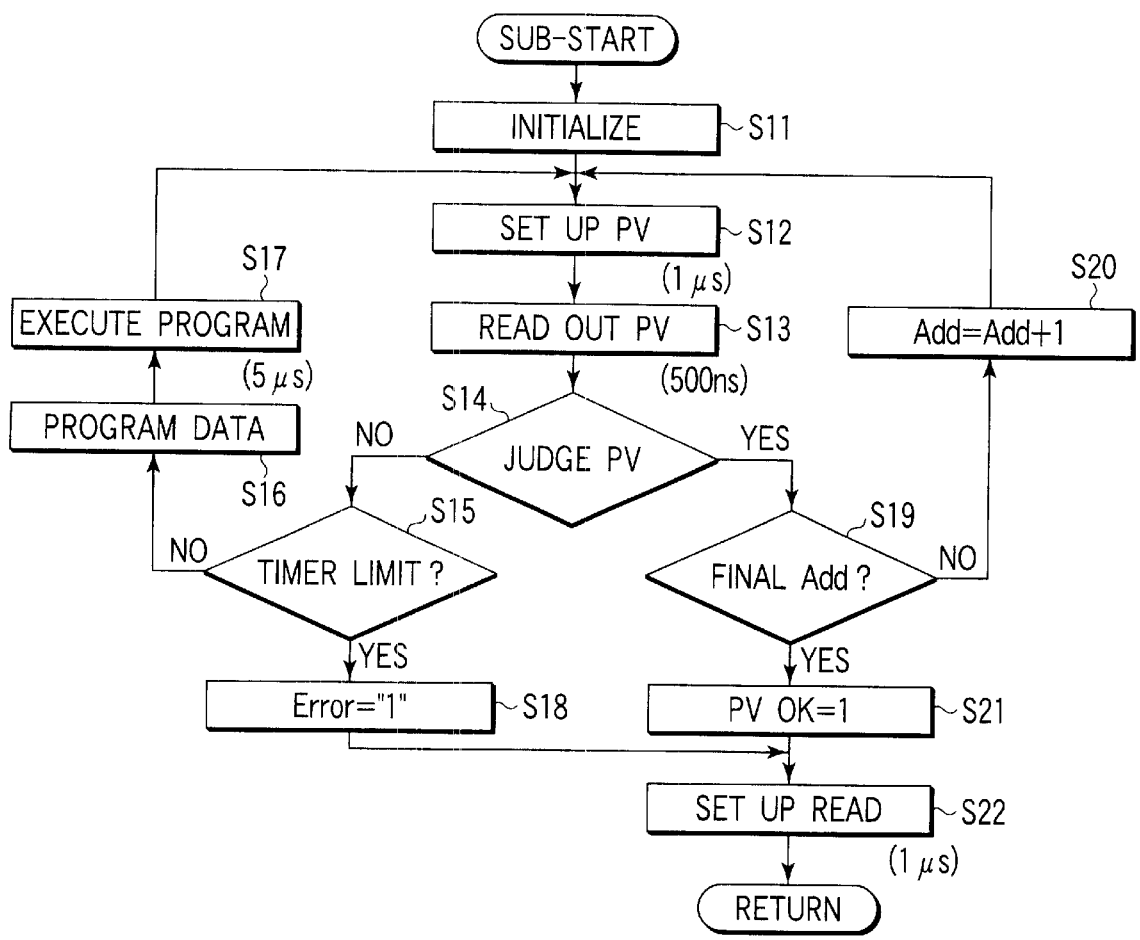
FIG. 33 is a flow chart of the pre-write step of the auto-erase sequence.
Figure 34:
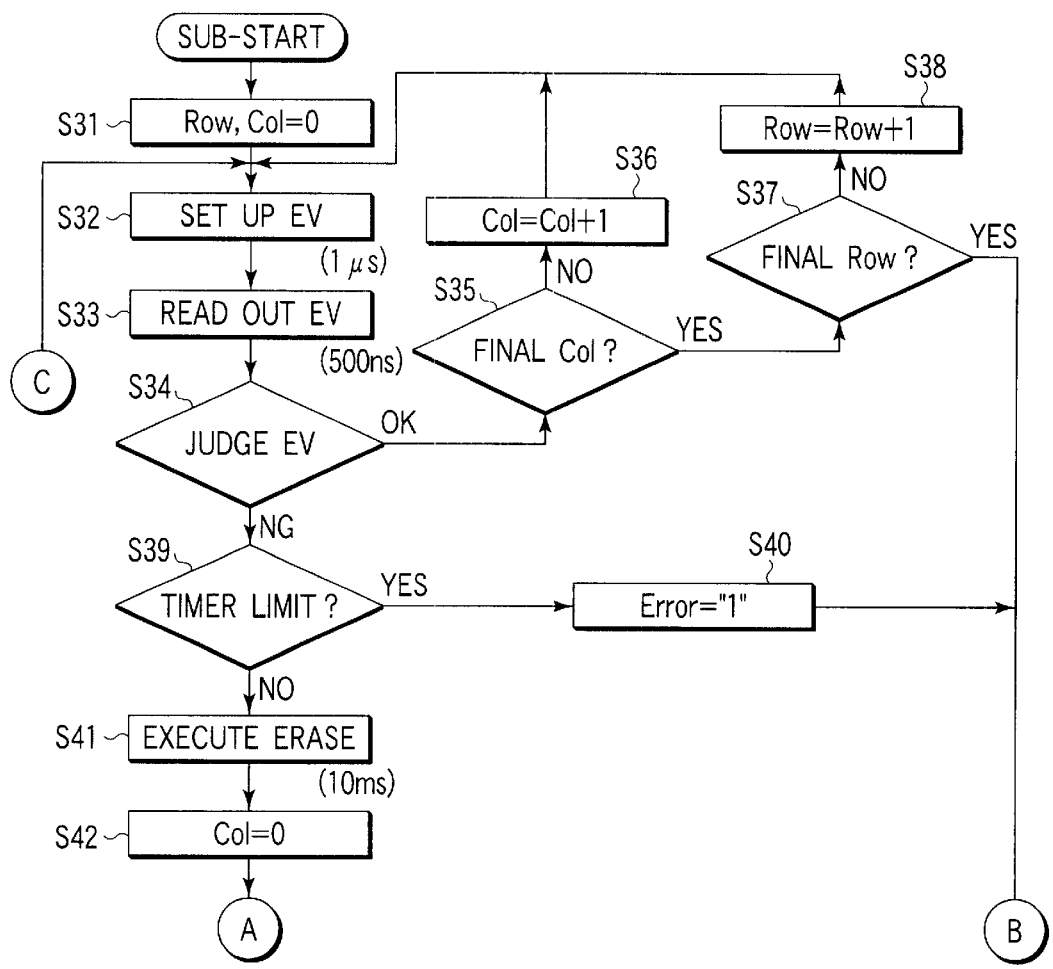
FIG. 34 is a flow chart of the erase step of the auto-erase sequence.
Figure 36:
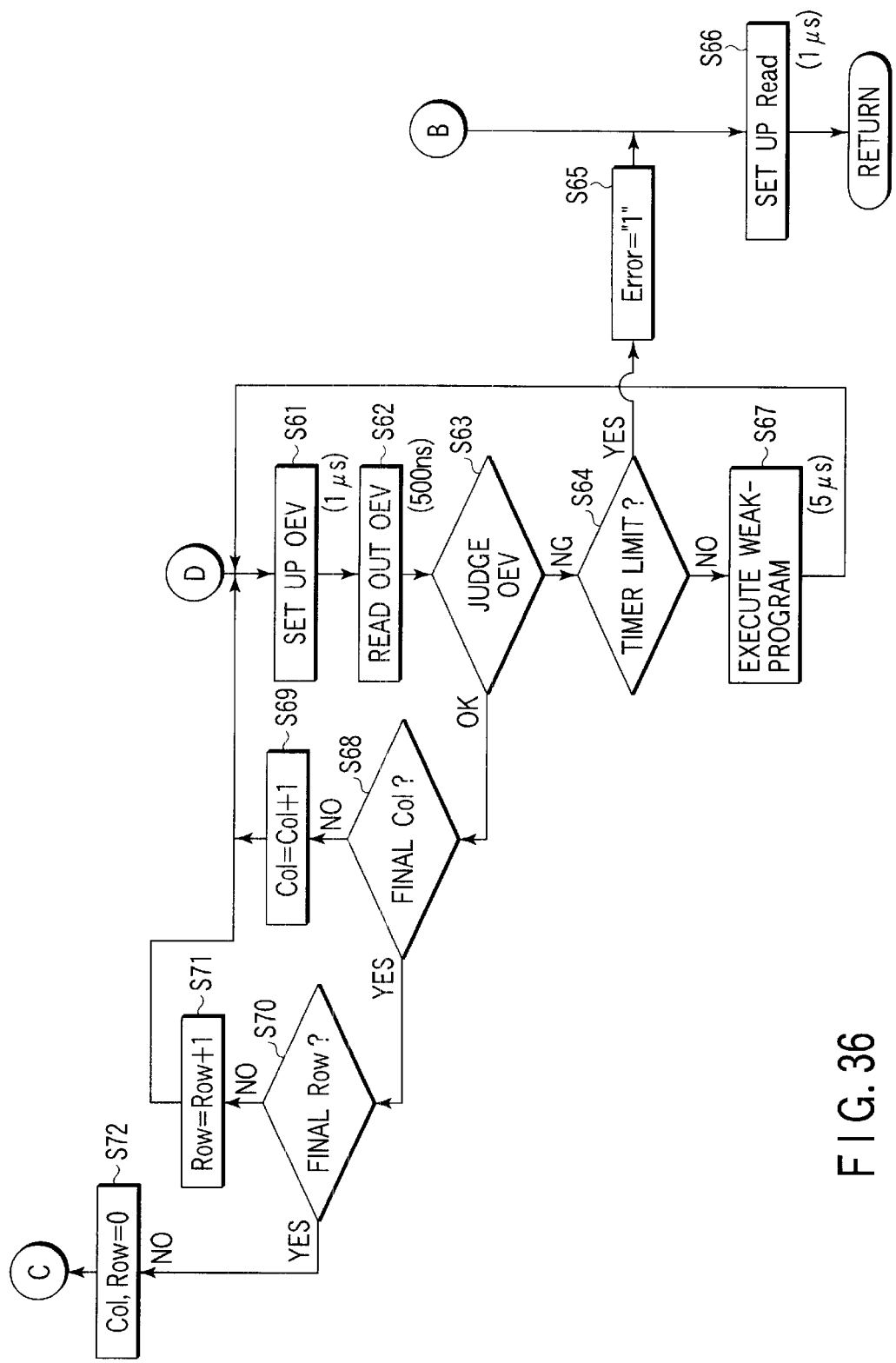
FIG. 36 is a flow chart of the erase step of the auto-erase sequence (continued)

Detailed contents of the auto-erase sequence will be described below in detail. FIG. 33 is a detailed flow chart of the pre-write step S3 in FIG. 32. FIGS. 34 to 36 are detailed flow charts of the erase step S4. FIGS. 37A to 37E show the threshold value distributions in the selected block in the respective sequences. FIGS. 38 to 43 show the bias relationship in the memory cell array in the respective operation modes.

As shown in FIG. 33, in the pre-write step, the address counter 116 is reset, and the initial address in the selected block to be erased is designated (S11). The internal power supply is set up in the write verify state (S12), the write verify read is executed (S13), and the read result is judged (S14). In the 16-bit parallel read structure shown in FIG. 31, data of 16 memory cells are simultaneously read out and determined.

Figure 39:
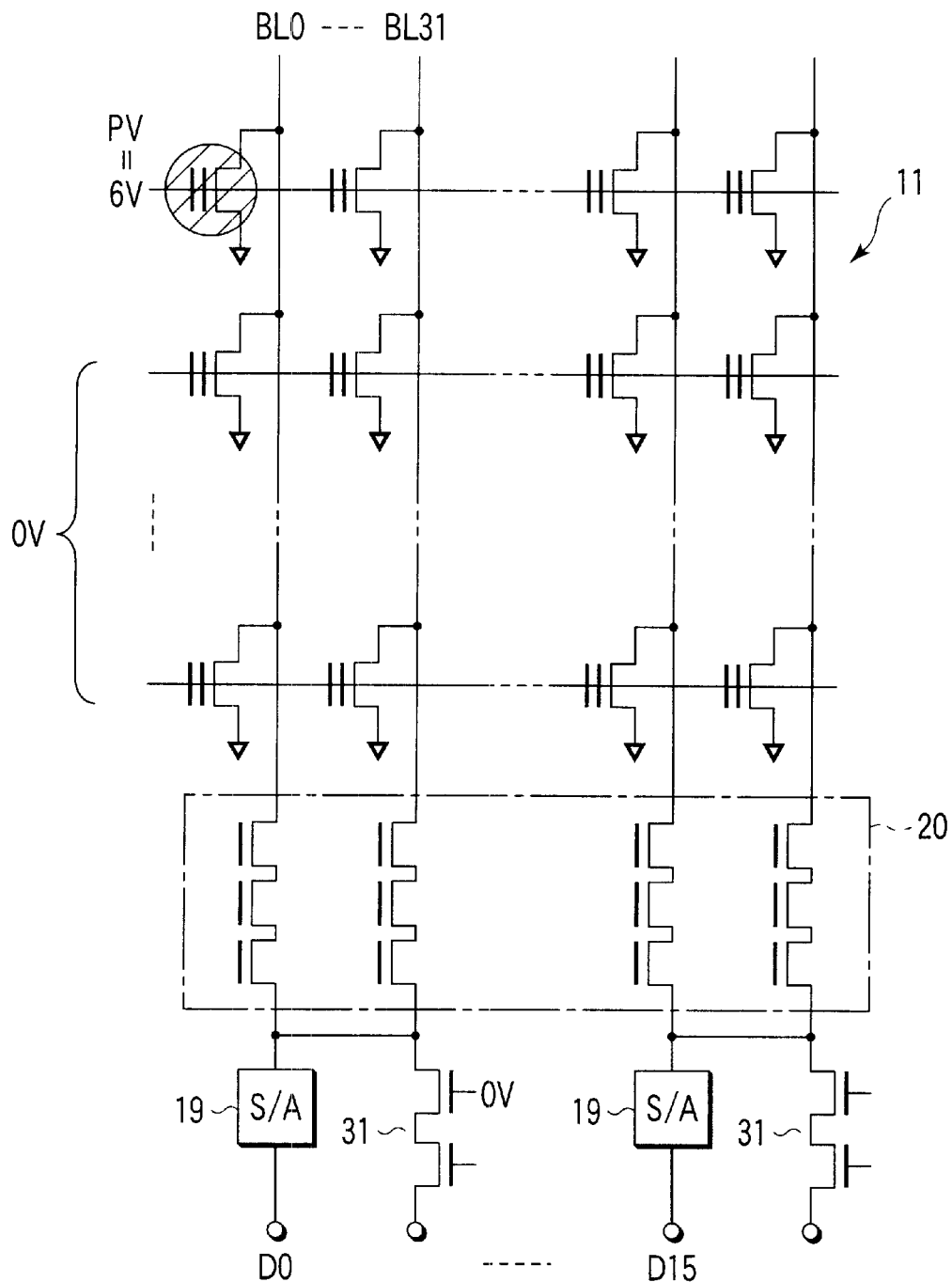
FIG. 39 is a view showing the bias relationship in the write verify of the auto-erase sequence.

FIG. 39 shows the voltage relationship in this write verify operation. A PV level=6 V is applied to the selected word line in the selected block, and a voltage of 0 V is applied to the remaining unselected word lines. A write load 131 is turned off.

In write verify determination (S14), when even one memory cell has a read result "1", the determination result is NO. The write data is rewritten to write it in only such a memory cell (S16), and the write is executed (S17). As the bias relationship in the write, a boosted write voltage of 10 V is applied to the selected word line in the selected block, a voltage of 0 V is applied to the remaining unselected word lines, and a voltage of 6 V is applied to the bit lines through the write load 131. Thus, hot electrons are injected to the floating gate of the selected memory cell. This operation is repeated until all the 16 memory cell data become "0", and the write verify determination becomes YES. During this time, the set limit time of the timer 125 is checked (S15), and if the limit time has elapsed, an error occurs (S18).

When the write verify determination is YES, the final address is checked (S19). If NO in step S19, the address is incremented (S20), and the above operation is repeated. When all the memory cells in the selected block are "0", and the determination of the final address is YES, a flag for write verify OK, i.e., a flag PVOK=1 is set (S21), the read state is set up (S22), and the pre-write operation is ended.

Figure 37F:
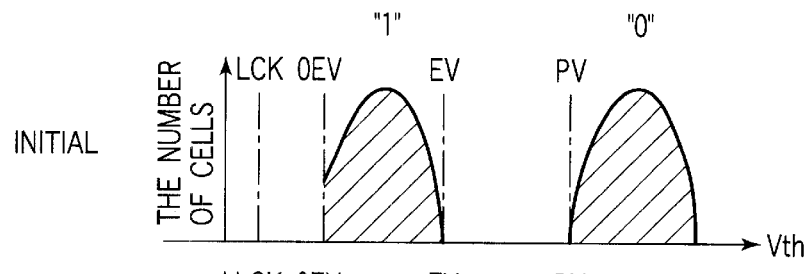
Figure 37F:
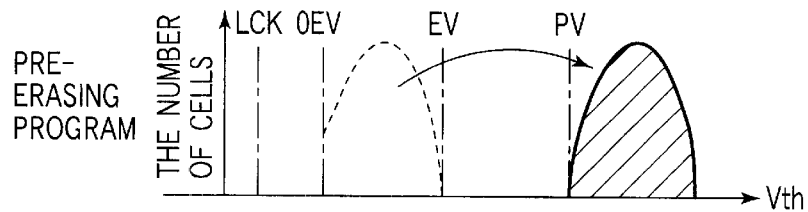
Figure 37F:
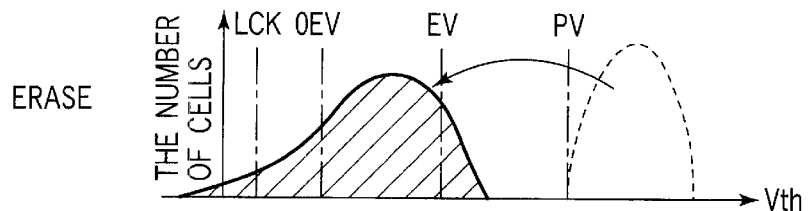
Figure 37F:
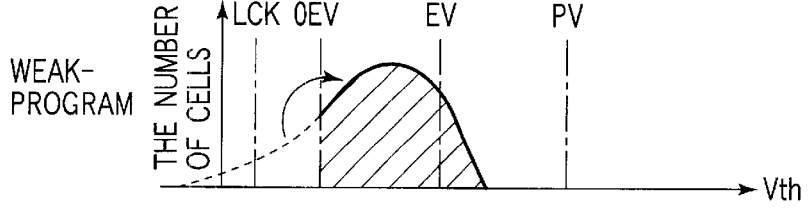
Figure 37F:
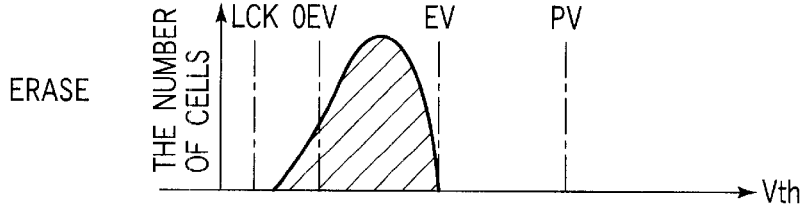
Figure 37F:
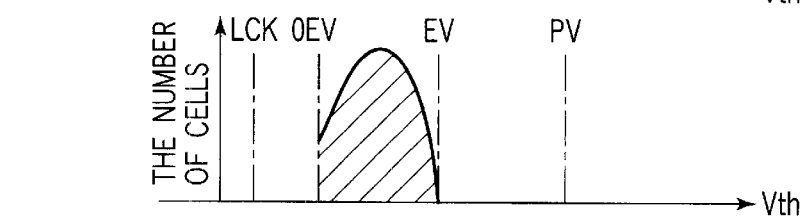
Figure 38:
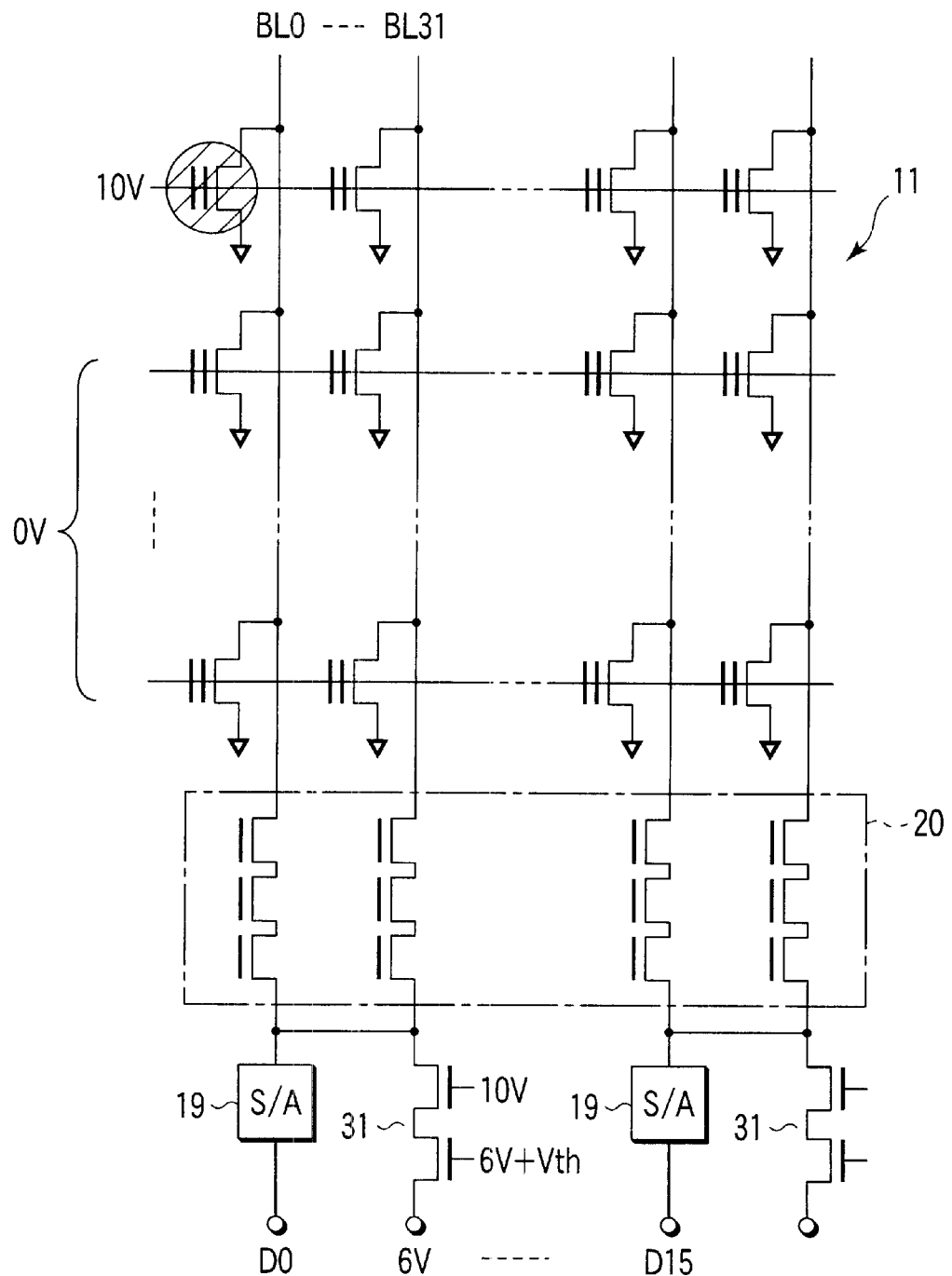
FIG. 38 is a view showing the bias relationship in the pre-write of the auto-erase sequence.

With the above pre-write operation, the initial threshold value distribution in which "0" and "1" data are mixed, as shown in FIG. 37A, changes to the "0" state wherein all the memory cells in the selected block have a threshold value equal to or more than the PV level.

Next, for the selected block that has undergone the pre-write, the erase step (S4) is executed. The detailed control flow of the erase step S4 is shown in FIGS. 34 to 36. As shown in FIG. 34, the address counter 116 is reset first, and the initial address in the selected block is designated (S31). Next, the internal power supply is set in the erase verify state (S32), the erase verify read of the memory cell data is executed (S33), and the read result is judged (S34).

The bias relationship in the erase verify read is basically the same as in the write verify read shown in FIG. 39 except that not the PV level but EV level=4 V is applied to the selected word line.

In determination of the erase verify (S34), if all the parallelly read 16 bit data are "1", the determination result is OK. At this time, the final column address is determined (S35). If NO in step S35, the column address is incremented (S36), and the same operation as described above is repeated. When all columns are processed, the final row address is determined (S37). If NO in step S37, the row address is incremented (S38), and the same operation as described above is repeated.

In the erase verify determination (S34), when even one data "0" is present, the determination result is NG. At this time, the limit of the timer is determined (S39). If NO in step S39, the erase is executed for all memory cells in the selected block (S41). As the bias relationship at this time, an erase voltage of −7.5 V is applied to all word lines in the selected block, and a voltage of 6.5 V is applied to the source lines, as shown in FIG. 40. The bit lines are floating. Thus, electrons in the floating gates of all memory cells are removed to the source side.

As the threshold value distribution in the selected block at this time, unless the determination of the erase verify is OK, a memory cell having a value more than the EV level is present, as shown in FIG. 37C.

Figure 41:
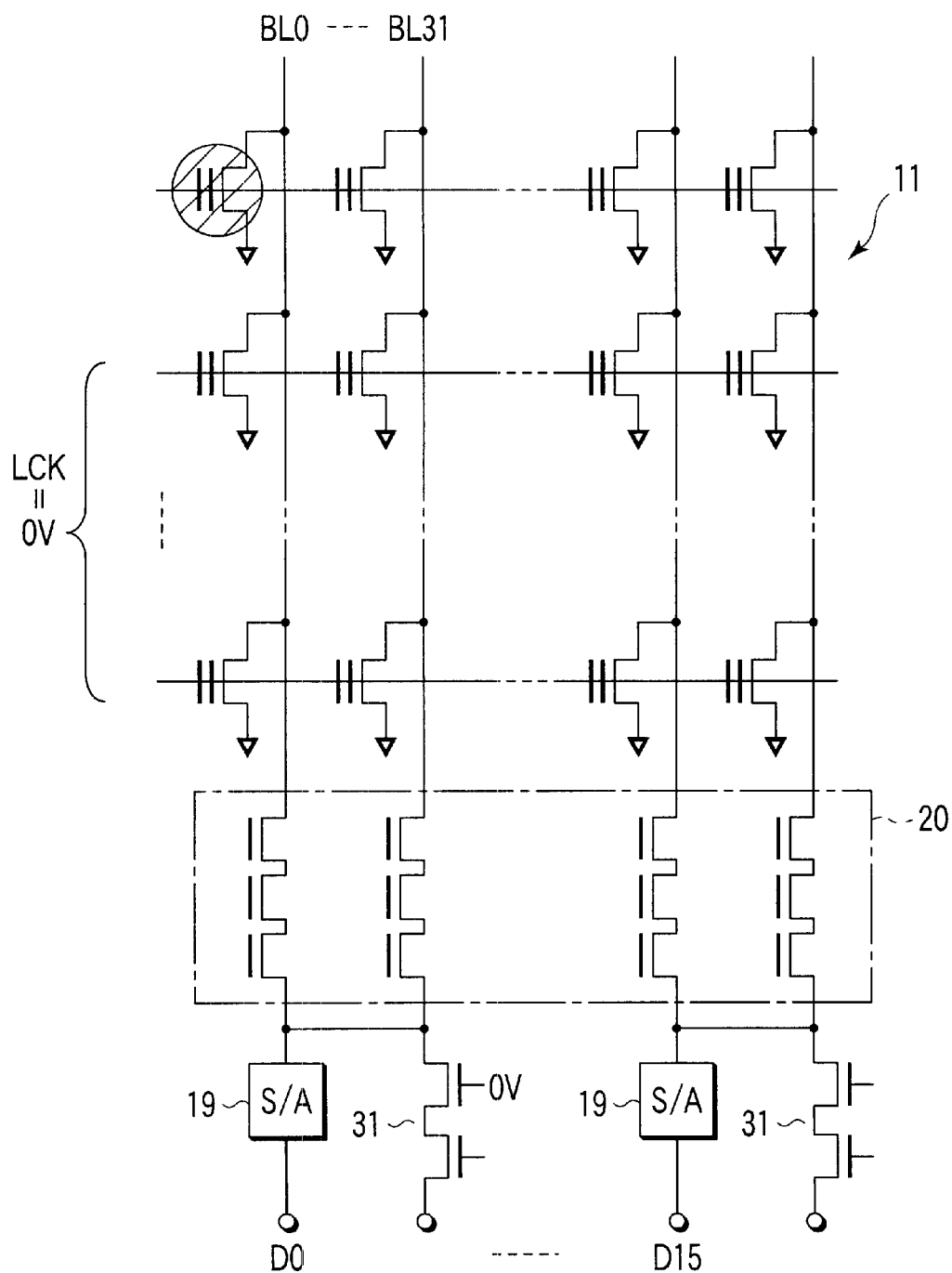
FIG. 41 is a view showing the bias relationship in the leakage check of the auto-erase sequence.

In the erase verify determination step (S34), if even one data "0" is present, and the erase operation is performed (S42), after a predetermined erase operation time, the subsequent erase operation is temporarily stopped, only the column address is reset (S42), and the flow advances to leakage current amount check operation shown in FIG. 35. More specifically, the internal power supply is set in the leakage check state (a threshold value determination level for this state will be referred to as an LCK level hereinafter) (S51). With this operation, all word lines in the selected block are set in the unselected state and, more specifically, LCK=0 V is set, as shown in FIG. 41, the sum of leakage currents of the 1,024 memory cells is detected in units of bit lines (S52), and it is judged whether the sum is equal to or less than a predetermined level (S53).

In the leakage check judging step (S53), for example, if the sum of the leakage current amounts of the 1,024 memory cells connected to one bit line is 1 to 2 µA or less, the determination result is OK. This leakage current amount level is set as the leakage current level of an unselected memory cell, which disables the normal read of a selected memory cell in the write verify read, erase verify read, and overerase verify read operations. More specifically, when "1" is detected by the sense amplifier, it is determined that the 1,024 memory cells along the bit line of a corresponding column include an overerased cell.

When the determination result in the leakage check determination step (S53) is OK, final column determination is performed (S54). If the column is not the final column, the column address is incremented (S55), and the above leakage check is repeated. When determination for all columns is ended, the column address is reset (S56), and the flow returns to the erase verify operation in step S32.

If the determination result in the leakage check determination step (S53) is NG, the erase operation is temporarily stopped, and the operation is shifted to the weak-write operation even when the erase verify determination result is not OK. More specifically, the limit of the timer is determined (S57). If the time falls within the time limit, the column and row addresses are initialized (S59), and the weak-write operation shown in FIG. 36 is started. In this weak-write operation, first, the internal power supply is set in the overerase verify state (S61), the overerase verify read is executed (S62), and it is checked that the threshold value of a memory cell in the erased state is equal to or less than the OEV level (S63).

Figure 42:
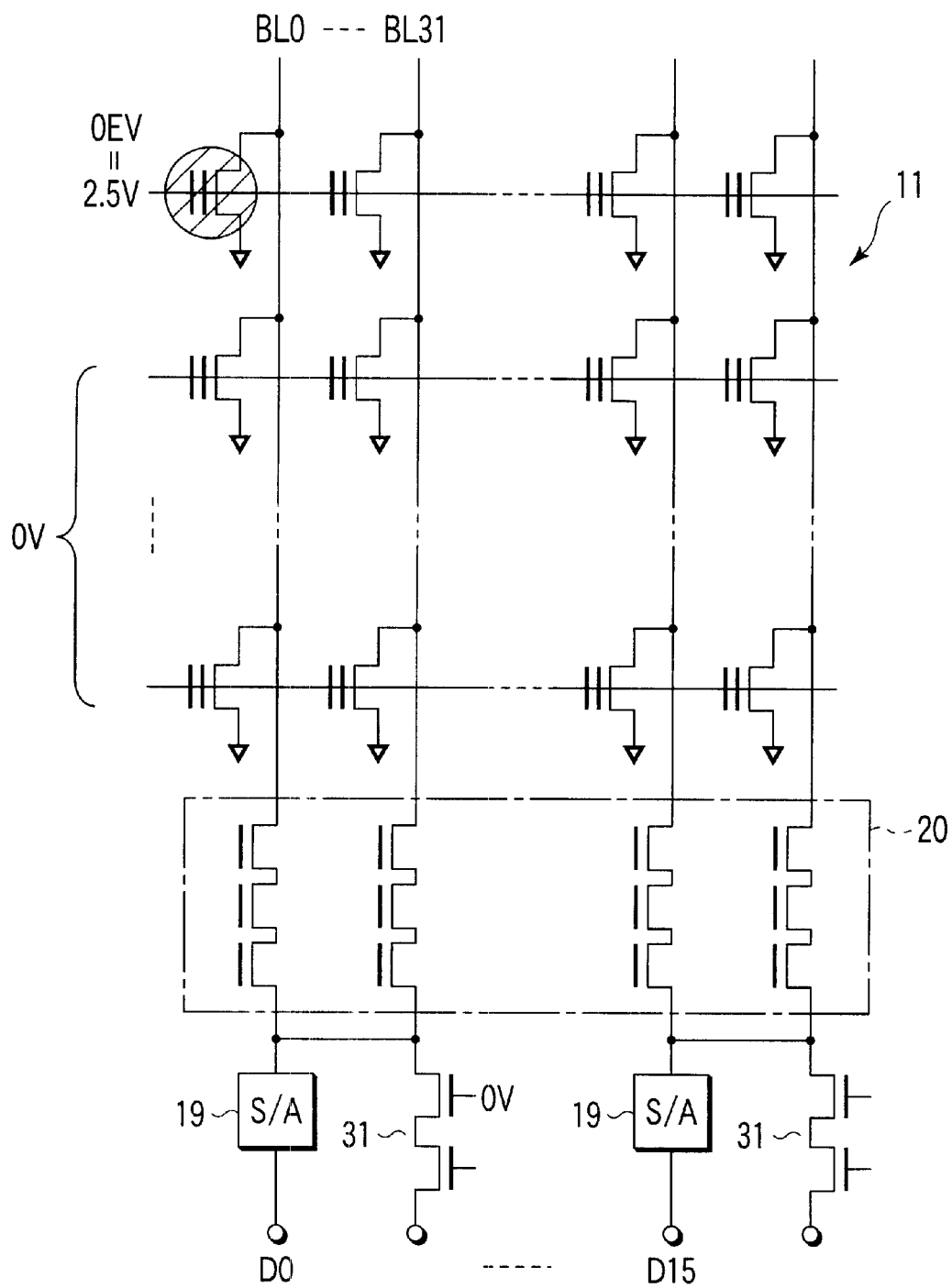
FIG. 42 is a view showing the bias relationship in the overerase verify of the auto-erase sequence.

As the bias conditions for this overerase verify operation, OEV=2.5 V is applied to the selected word line in the selected block, and a voltage of 0 V is applied to the remaining unselected word lines, as shown in FIG. 42. In the conventional scheme, since the erase operation is repeated until the erase verify determination result becomes OK, a negative voltage must be applied to an unselected word line in order to properly keep the OFF state of an overerased memory cell connected to the unselected word line, as described above. To the contrary, in this, embodiment, even when the erase verify determination result is not OK, the leakage check is executed, and the weak write is executed for memory cells in units of bits before the threshold value is set in the negative overerased state. For this reason, as shown in FIG. 42, the overerase verify read can be execute while setting unselected word lines to 0 V.

In the overerase verify determination step (S63), if the determination result is OK, the final column address is determined (S68). If the column address is not the final column address, the column address is incremented (S69), and the above overerase verify operation is repeated. When processing for all columns is ended, final row address determination is performed (S70). The address is incremented up to the final row address (S71), and the above overerase verify is repeated. When the overerase verify determination becomes OK for all memory cells in the selected block, the addresses are initialized (S72), and the flow returns to the erase verify operation.

In the overerase verify determination step (S63), when the determination result is NG, in other words, when the determination result of the leakage current amount check is NG, and the overerase verify determination result is NG, the erase operation is temporarily stopped, the limit of the timer is determined (S64), and if the time falls within the time limit, the weak write is executed (S67). After the weak-write operation is performed for a predetermined time, the flow returns to the overerase verify setup step (S61). The overerase verify and weak write are repeated until the overerase verify determination result becomes OK.

As the bias conditions for this weak write, a voltage of 5 V lower than that in the normal write is applied to the selected word line in the selected block, and a voltage of 0 V is applied to the remaining unselected word lines, as shown in FIG. 43. Unlike the prior art in which the erase operation is continued until all memory cells in the selected block are set in the erased state, in this embodiment, the weak write is executed every time the leakage current is checked. For this reason, since the weak write is executed before an overerased memory cell having a negative threshold value, the OFF state of unselected memory cells can be kept without applying a negative voltage to the unselected word lines, as in the overerase verify operation.

As described above, until the overerase verify determination result becomes OK, the weak write is repeated for memory cells equal to or less than the OEV level, as shown in FIG. 37D. During this time, memory cells equal to or more than the EV level may be present, as shown in FIG. 37D. When the determination result in the overerase verify step (S63) becomes OK, the flow returns to the erase operation again. Finally, when OK is determined in the leakage check determination step (S53), and OK is determined in the erase verify determination step (S34), the read state is set up (S66), and the erase operation is ended.

In this sequence, the overerase check is frequently executed during erase operation, thereby preventing generation of an overerased cell with a very large degree. In this method, a largely overerased cell may still be generated when the upper limit of the threshold voltage $V_{TH}$ of the cell in the erase approaches the erase verify level. Especially, since the operation speed as an erase characteristic of a memory cell sometimes suddenly increases, an overerased cell that may cause a detection error in the weak-write may be suddenly generated even when the weak-write is frequently executed during the erase. Hence, when such a sequence is employed, the two-step shift method of the present invention can be employed for the weak-write process of this sequence. Instead of using this two-step shift method for all weak-write operations, the two-step method may be started when the erase progresses to some extent, and the threshold voltage $V_{TH}$ distribution of cells is becoming relatively low.

When the erase operation is ended within the time limit, the memory cells in the selected block are set in a desired erased state in which the threshold value falls between the EV level and the OEV level.

The above-described all invention is especially effective to the erase sequence, though the present invention may be applied to the write sequence. For example, if the threshold voltage $V_{TH}$ after the write must be shifted into a predetermined range, as in a multi-level memory, the threshold voltage can be controlled to a narrow range using operation similar to that of the present invention.

The present invention can also be applied to a flash memory of another type for executing similar operation, as needed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array having a plurality of word lines, a plurality of bit lines, and a plurality of memory cells each receiving a potential of the bit line by a drain and a potential of the word line by a gate and having a variably settable threshold voltage; and
   a control circuit for performing first to third control operations,
   the first control operation shifting at once the threshold voltages of the plurality of memory cells to a range for which one of upper and lower limits is set to a first level,
   the second control operation shifting at once, for the plurality of memory cells including a memory cell deviating from a second level close to the first level, the other of the upper and lower limits of the threshold voltages shifted at once to the range to the second level under a first bias condition, and
   the third control operation shifting the other of the upper and lower limits of the threshold voltages shifted to the second level to a third level closer to the first level than the second level under a second bias condition different from the first bias condition.

2. A device according to claim 1, wherein third control operation is selectively performed for a memory cell which is detected as a memory cell having a threshold voltage between the second level and the third level.

3. A device according to claim 1, wherein a voltage applied to the word line of a selected cell under the second bias condition used for the third control operation is higher than that applied to the word line under the first bias condition used for the second control operation.

4. A device according to claim 1, wherein the third control operation applies a voltage with a bias weaker than in a normal program to the word line and bit line connected to a selected memory cell.

5. A device according to claim 4, wherein the voltage with the bias weaker than in the normal program is selectively applied to the word line and bit line connected to a memory cell which is detected as a memory cell having a threshold voltage at least between the second level and the third level.

6. A device according to claim 4, wherein in applying the voltage with the bias weaker than in the normal program, an unselected word line is set to a voltage not more than the second level.

7. A device according to claim 4, wherein in applying the voltage with the bias weaker than in the normal program, a voltage of a selected word line is stepped up in accordance with the number of times of application of a weak-program voltage to the selected memory cell until the threshold voltage of the memory cell reaches the third level.

8. A device according to claim 4, wherein the second control operation applies a self-convergence voltage to the to the plurality of bit lines.

9. A device according to claim 8, wherein the self-convergence voltage is selectively applied to a bit line detected as a bit line to which a leakage current larger than a predetermined value flows.

10. A device according to claim 8, wherein the self-convergence voltage is sequentially applied to all of the plurality of bit lines.

11. A device according to claim 8, wherein the self-convergence voltage is applied to a selected bit line connected to a memory cell which is detected as a memory cell having a threshold voltage at least between the second level and the third level.

12. A device according to claim 11, wherein the self-convergence voltage is applied at the time of first threshold voltage detection for each bit line, and the weak-program voltage is applied except at the time of the first threshold voltage detection.

13. A device according to claim 8, wherein in applying the self-convergence voltage, voltages of the plurality of word lines are set to be equal to that upon detecting the threshold voltage.

14. A device according to claim 13, wherein the voltages of the plurality of word lines are sequentially further boosted in units of word lines.

15. A device according to claim 1, wherein the second control operation applies a self-convergence voltage to the plurality of bit lines.

16. A device according to claim 15, wherein the self-convergence voltage is selectively applied to a bit line detected as a bit line to which a current larger than a predetermined value flows.

17. A device according to claim 15, wherein the self-convergence voltage is sequentially applied to all of the plurality of bit lines.

18. A device according to claim 17, wherein voltages of the plurality of word lines are sequentially further boosted in units of word lines.

19. A device according to claim 1, wherein the second control operation applies to the word lines a voltage which applies an electric field in a direction opposite to that in the first control operation to the memory cells and shifts the threshold voltage by a tunnel current.

20. A device according to claim 1, wherein the third level is a lower limit of a threshold voltage distribution after the data erase is completely ended.

21. A threshold voltage control method for a nonvolatile semiconductor memory having a plurality of memory cells each having a variably settable threshold voltage, comprising the steps of:

shifting at once the threshold voltages of the plurality of memory cells to a range for which one of upper and lower limits is set to a first level;

shifting at once, for the plurality of cells including a cell deviating from a second level close to the first level, the other of the upper and lower limits of the threshold voltages shifted at once to the range to the second level under a first bias condition; and shifting the other of the upper and lower limits of the threshold voltages shifted to the second level to a third level closer to the first level than the second level under a second bias condition different from the first bias condition.

* * * * *